(12) United States Patent
Hatakeyama et al.

(10) Patent No.: US 10,126,649 B2
(45) Date of Patent: Nov. 13, 2018

(54) RESIST COMPOSITION AND PATTERNING PROCESS USING THE SAME

(71) Applicant: SHIN-ETSU CHEMICAL CO., LTD., Tokyo (JP)

(72) Inventors: Jun Hatakeyama, Jyoetsu (JP); Koji Hasegawa, Jyoetsu (JP); Masayoshi Sagehashi, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/634,469

(22) Filed: Jun. 27, 2017

(65) Prior Publication Data
US 2018/0024435 A1 Jan. 25, 2018

(30) Foreign Application Priority Data

Jul. 22, 2016 (JP) ................. 2016-144210

(51) Int. Cl.

| | | |
|---|---|---|
| *G03F 7/004* | (2006.01) | |
| *G03F 7/30* | (2006.01) | |
| *C08F 220/22* | (2006.01) | |
| *C08F 220/24* | (2006.01) | |
| *C08F 220/28* | (2006.01) | |
| *C08F 220/30* | (2006.01) | |
| *C08F 220/38* | (2006.01) | |
| *C08F 220/56* | (2006.01) | |

(Continued)

(52) U.S. Cl.
CPC ............ *G03F 7/0392* (2013.01); *C08F 28/02* (2013.01); *C08F 220/18* (2013.01); *C08F 220/22* (2013.01); *C08F 220/24* (2013.01); *C08F 220/28* (2013.01); *C08F 220/30* (2013.01); *C08F 220/56* (2013.01); *C08F 224/00* (2013.01); *G03F 7/0045* (2013.01); *G03F 7/0046* (2013.01); *G03F 7/0048* (2013.01); *G03F 7/0397* (2013.01); *G03F 7/162* (2013.01); *G03F 7/168* (2013.01); *G03F 7/2004* (2013.01); *G03F 7/2006* (2013.01); *G03F 7/2037* (2013.01); *G03F 7/2039* (2013.01); *G03F 7/30* (2013.01); *G03F 7/322* (2013.01); *G03F 7/38* (2013.01); *C08F 2220/1866* (2013.01); *C08F 2220/282* (2013.01); *C08F 2220/283* (2013.01); *C08F 2220/301* (2013.01); *C08F 2220/302* (2013.01); *C08F 2220/303* (2013.01); *C08F 2220/382* (2013.01)

(58) Field of Classification Search
CPC .... G03F 7/0392; G03F 7/0397; G03F 7/2004; G03F 7/2006; G03F 7/2037; G03F 7/2039; G03F 7/30; G03F 7/38; C08F 220/22; C08F 220/24; C08F 220/38; C08F 220/56; C08F 2220/283; C08F 2220/302; C08F 2220/303; C08F 2220/382; C08F 224/00; C08F 228/02

USPC .... 430/270.1, 326, 330, 905, 906, 907, 910, 430/942; 526/280, 284, 287, 303.1, 304, 526/305, 307.7, 313, 326

See application file for complete search history.

(56) References Cited

U.S. PATENT DOCUMENTS

| | | |
|---|---|---|
| 5,879,851 A | 3/1999 | Takahashi et al. |
| 6,448,420 B1 | 9/2002 | Kinsho et al. |

(Continued)

FOREIGN PATENT DOCUMENTS

| | | |
|---|---|---|
| JP | 2000-327633 A | 11/2000 |
| JP | 3429592 B2 | 7/2003 |

(Continued)

OTHER PUBLICATIONS

Kishikawa, Yasuhiro et al., "Assessment of trade-off between resist resolution and sensitivity for optimization of hyper-NA immersion lithography", Optical Microlithography XX, Proc. of SPIE, 2007, vol. 6520, pp. 65203L-1-65203L-9.

(Continued)

*Primary Examiner* — John S Chu
(74) *Attorney, Agent, or Firm* — Oliff PLC

(57) ABSTRACT

The present invention provides a resist composition containing a base resin composed of a polymer compound that contains a repeating unit "a" shown by formula (1) and a repeating unit "b" having either or both of a carboxyl group in which a hydrogen atom is substituted with an acid-labile group and a phenolic hydroxyl group in which a hydrogen atom is substituted with an acid-labile group, with a weight average molecular weight of 1,000 to 500,000. There can be provided a resist composition that has high sensitivity and high resolution, and can give a pattern with low dimensional variation and good pattern profile after exposure.

(1)

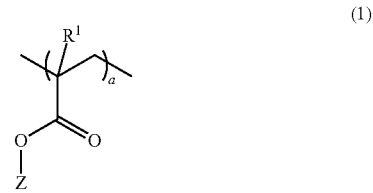

wherein $R^1$ represents a hydrogen atom or a methyl group; Z represents a hydroxybenzoquinone group, or a hydroxynaphthoquinone group optionally containing a substituent; and a fraction "a" of the repeating unit "a" satisfies 0<a<1.0, and a fraction "b" of the repeating unit "b" satisfies 0<b<1.0.

20 Claims, No Drawings

(51) Int. Cl.
*C08F 224/00* (2006.01)
*C08F 228/02* (2006.01)
*G03F 7/039* (2006.01)
*G03F 7/20* (2006.01)
*C08F 28/02* (2006.01)
*C08F 220/18* (2006.01)
*G03F 7/16* (2006.01)
*G03F 7/32* (2006.01)
*G03F 7/38* (2006.01)

(56) References Cited

U.S. PATENT DOCUMENTS

| | | | |
|---|---|---|---|
| 2002/0106577 A1* | 8/2002 | Kubota | G03F 7/0047 430/252 |
| 2007/0231708 A1 | 10/2007 | Matsumaru et al. | |
| 2008/0090172 A1 | 4/2008 | Hatakeyama et al. | |
| 2008/0118860 A1 | 5/2008 | Harada et al. | |
| 2008/0241736 A1 | 10/2008 | Kobayashi et al. | |

FOREIGN PATENT DOCUMENTS

| | | |
|---|---|---|
| JP | 2006-045311 A | 2/2006 |
| JP | 2006-178317 A | 7/2006 |
| JP | 2008-111103 A | 5/2008 |
| JP | 2008-122932 A | 5/2008 |
| JP | 2008-239918 A | 10/2008 |

OTHER PUBLICATIONS

Hutchinson, John M., "The Shot Noise Impact on Resist Roughness in EUV Lithography", SPIE, 1998, vol. 3331, pp. 531-536.

Brainard, Robert L. et al., "Shot Noise, LER and Quantum Efficiency of EUV Photoresists", Emerging Lighographic Technologies VIII, Proceedings of SPIE, 2004, vol. 5374, pp. 74-85.

Kozawa, Takahiro et al., "Basic aspects of acid generation processes in chemically amplified resists for electron beam lithography", Advances in Resist Technology and Processing XXII, 2005, vol. 5753, pp. 361-367.

Nakano, Atsuro et al., "Deprotonation mechanism of poly(4-hydroxystyrene) and its derivative", Advances in Resist Technology and Processing, Proceedings of SPIE, 2005, vol. 5753, pp. 1034-1039.

Wang, Mingxing et al., "Novel Anionic Photoacid Generator (PAGs) and Photoresist for sub-50 nm Patterning by EUVL and EBL", Advances in Resist Materials and Processing Technology XXIV, Proc. of SPIE, 2007, vol. 6519, pp. 65191F-1-65191F-6.

* cited by examiner

RESIST COMPOSITION AND PATTERNING PROCESS USING THE SAME

BACKGROUND OF THE INVENTION

Field of the Invention

The present invention relates to a resist composition, particularly a resist composition using a polymer compound that is suitable as a base resin of a chemically amplified positive resist composition, and to a patterning process using the same.

Description of the Related Art

As Large-Scale Integrated circuits (LSIs) advance toward higher integration and higher processing speed, miniaturization of pattern rule is progressing rapidly. Especially, the expansion of flash memory market and the increase in memory capacity lead this miniaturization. As a cutting-edge technology for miniaturization, 65-nm node devices have been mass-produced by an ArF lithography; and mass-production of 45-nm node by next generation technology, an ArF immersion lithography, is under preparation. Candidates for next generation 32-nm node that are under investigation include: an immersion lithography by a super high NA lens combining a liquid having a higher refractive index than water, a lens having a high refractive index, and a resist film having a high refractive index; a lithography by a vacuum ultraviolet light (EUV) with a wavelength of 13.5 nm; and a double exposure of an ArF lithography (double patterning lithography).

A high energy beam having extremely short wavelength, such as an electron beam (EB) and an X-ray, is hardly absorbed by light elements such as a hydrocarbon used in a resist composition, so that a resist composition based on polyhydroxystyrene is under investigation.

An exposure apparatus for mask production is sifted from an apparatus using a laser beam to one using an electron beam (EB) in order to improve the line-width accuracy. Moreover, further miniaturization can be achieved by increasing the acceleration voltage of an electron beam gun. Thus, the acceleration voltage has been increased from 10 kV to 30 kV, and 50 kV with a recent main stream, and further study of 100 kV is underway.

Unfortunately, increasing the acceleration voltage leads to a reduction in sensitivity of a resist film. A higher acceleration voltage reduces a forward scattering effect within the resist film, and thus improves a contrast of the electron beam drawing energy and improves the resolution and the size controllability, but reduces the sensitivity of the resist film since electrons pass through the resist film with a free draining condition. In the mask exposure apparatus, direct drawing is done by way of a one-stroke sketch, so that the reduction in sensitivity of the resist film causes an undesirable reduction in productivity. Accordingly, a resist film with higher sensitivity is required, and a chemically amplified resist composition is investigated.

With the progress of miniaturization, there also arise a problem of blur of images due to acid diffusion. To ensure the resolution of a fine pattern with a dimensional size of 45 nm or less, the control of acid diffusion is important besides the improvement of dissolution contrast, as proposed (Non-Patent Document 1). However, in the chemically amplified resist composition, the sensitivity and the contrast are increased by the acid diffusion, so that if the acid diffusion is extremely controlled by reducing the temperature and the time in post exposure bake (PEB), the sensitivity and the contrast are significantly decreased.

There is a triangle trade-off relationship among the sensitivity, the resolution, and the edge roughness. According to the relationship, improving the resolution requires controlling the acid diffusion, but when the acid diffusion distance is shortened, the resolution is decreased.

The addition of an acid generator capable of generating bulky acid is effective for controlling the acid diffusion. Thus, it has been suggested to copolymerize a polymer with an acid generator of an onium salt having a polymerizable olefin. Patent Document 1 proposes a sulfonium salt and an iodonium salt having a polymerizable olefin, capable of generating a specific sulfonic acid. Patent Document 2 proposes a sulfonium salt in which a sulfonic acid is directly bonded to a main chain.

A trade-off relationship between the sensitivity and the edge roughness is reported. For example, Non-Patent Document 2 describes that the sensitivity and the edge roughness are inversely proportional, and speculates that the edge roughness of the resist film can be reduced by increasing exposure dose and thereby reducing shot noise. Non-Patent Document 3 describes that a resist film containing an increased quencher is effective for reducing the edge roughness, but also degrades the sensitivity, which causes a trade-off relationship between the EUV sensitivity and the edge roughness, and thus the acid generating quantum efficiency should be increased to overcome the relationship.

Non-Patent Document 4 proposes an acid generating mechanism for electron beam exposure in which electrons are transferred to a photo acid generator (PAG) by polymer excitation thorough exposure, whereby an acid is released. Both of EB and EUV have a higher irradiation energy than 10 eV threshold of ionization potential energy of a base polymer. It is thus supported that the base polymer is easily ionized. As a material to enhance the electron transfer, hydroxystyrenes are disclosed.

Non-Patent Document 5 describes that poly-4-hydroxystyrene can more effectively generate an acid by EB exposure than poly-4-methoxystyrene does, and poly-4-hydroxystyrene can effectively transfer electrons to PAG by irradiation with EB.

In regard this, Non-Patent Document 6 proposes a material obtained by copolymerizing a hydroxystyrene for improving the acid generating efficiency by electron transfer, a methacrylate of PAG in which a sulfonic acid is directly bonded to a polymer main chain for controlling the acid diffusion, and a methacrylate having an acid-labile group.

The hydroxystyrene, which has a phenolic hydroxyl group with weak acidity, can reduce swelling with an alkali developer, but increase the acid diffusion. On the other hand, a methacrylate containing lactone as an adhesion group, which is widely used for ArF resist, is highly hydrophilic and alkali-insoluble, and thus cannot reduce swelling, but can control the acid diffusion. The combination of the hydroxystyrene and the methacrylate containing lactone as an adhesion group enables the improvement in sensitivity, the reduction in swelling, and the control of acid diffusion with good balance. However, further improvement is required.

A copolymerization of a hydroxyphenylmethacrylate, a methacrylate having a lactone ring, and a methacrylate of PAG in which a sulfonic acid is directly bonded to a polymer main chain enables a resist to be formed with high sensitivity and high resolution while controlling the acid diffusion. In this case, increasing the proportion of the hydroxyphenylmethacrylate is effective for further improving the sensitivity. However, increasing the proportion of the hydroxyphenylmethacrylate causes film loss of the pattern and pattern collapse due to the increase in alkali-solubility. Accordingly, it is desired to develop a resist with higher sensitivity and higher resolution.

PRIOR ART DOCUMENTS

Patent Documents

Patent Document 1: Japanese Unexamined Patent Application Publication No. 2006-045311
Patent Document 2: Japanese Unexamined Patent Application Publication No. 2006-178317

Non-Patent Documents

Non-Patent Document 1: SPIE Vol. 6520 65203L-1 (2007)
Non-Patent Document 2: SPIE Vol. 3331 p 531 (1998)
Non-Patent Document 3: SPIE Vol. 5374 p 74 (2004)
Non-Patent Document 4: SPIE Vol. 5753 p 361 (2005)
Non-Patent Document 5: SPIE Vol. 5753 p 1034 (2005)
Non-Patent Document 6: SPIE Vol. 6519 p 65191F-1 (2007)

SUMMARY OF THE INVENTION

The present invention has been accomplished in view of the above circumstances, and an object thereof is to provide a resist composition that has high sensitivity and high resolution, and can give a pattern with low dimensional variation and good pattern profile after exposure, and also provide a patterning process using the same.

To achieve this object, the present invention provides a resist composition comprising a polymer compound as a base resin,
the polymer compound comprising a repeating unit "a" shown by the following general formula (1) and a repeating unit "b" having either or both of a carboxyl group in which a hydrogen atom is substituted with an acid-labile group and a phenolic hydroxyl group in which a hydrogen atom is substituted with an acid-labile group, the polymer compound having a weight average molecular weight of 1,000 to 500,000,

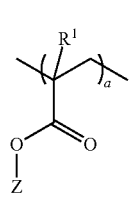

(1)

wherein $R^1$ represents a hydrogen atom or a methyl group; Z represents a hydroxybenzoquinone group, or a hydroxynaphthoquinone group optionally containing a substituent; and a fraction "a" of the repeating unit "a" satisfies 0<a<1.0, and a fraction "b" of the repeating unit "b" satisfies 0<b<1.0.

This resist composition has high sensitivity and high resolution, and can give a pattern with low dimensional variation and good pattern profile after exposure.

The repeating unit "a" preferably comprises a repeating unit a1 shown by the following general formula (1-1) having a hydroxybenzoquinone group,

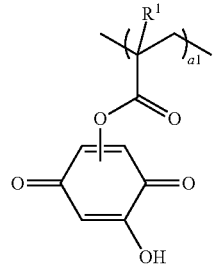

(1-1)

wherein $R^1$ is as defined above; and a1 represents a number satisfying 0<a1<1.0.

The resist composition that contains a base resin composed of the polymer compound having such a repeating unit has higher sensitivity.

Alternatively, the repeating unit "a" preferably comprises a repeating unit a2 shown by the following general formula (1-2) having a hydroxynaphthoquinone group,

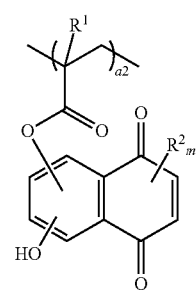

(1-2)

wherein $R^1$ is as defined above; $R^2$ represents a hydrogen atom, a halogen atom, or a linear or branched alkyl group having 1 to 4 carbon atoms; "m" represents 1 or 2; and a2 represents a number satisfying 0<a2<1.0.

The resist composition that contains a base resin composed of the polymer compound having such a repeating unit has higher sensitivity.

Additionally, the repeating unit "b" preferably comprises one or more repeating units selected from a repeating unit b1 shown by the following general formula (2-1) and a repeating unit b2 shown by the following general formula (2-2),

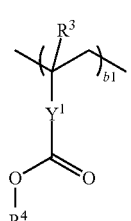

(2-1)

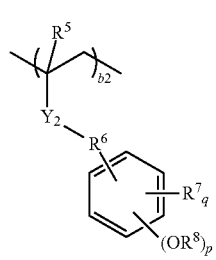

(2-2)

wherein $R^3$ and $R^5$ represent a hydrogen atom or a methyl group; $R^4$ and $R^8$ represent an acid-labile group; $R^6$ represents a single bond or a linear or branched alkylene group having 1 to 6 carbon atoms and optionally containing an ether group or an ester group; $R^7$ represents a hydrogen atom, a fluorine atom, a trifluoromethyl group, a cyano group, or a linear, branched, or cyclic alkyl group having 1 to 6 carbon atoms; "p" represents 1 or 2; "q" represents an integer of 0 to 4; p+q≤5; $Y_1$ represents a linking group having 1 to 12 carbon atoms and containing an ester group, an ether group, or a lactone ring, or represents a single bond, a phenylene group, or a naphthylene group; $Y_2$ represents a single bond, an ester bond, or —C(=O)—NH—; b1 and b2 represent a number satisfying 0≤b1<1.0, 0≤b2<1.0, 0<b1+b2<1.0, and 0.1≤a+b1+b2≤1.0.

The resist composition that contains a base resin composed of the polymer compound having such repeating units allows a resist film formed from this composition to have higher dissolution contrast with higher resolution.

Additionally, the polymer compound preferably further comprises a repeating unit "c" having an adhesion group selected from a hydroxyl group, a carboxyl group, a lactone ring, a carbonate group, a thiocarbonate group, a carbonyl group, a cyclic acetal group, an ether group, an ester group, a sulfonate ester group, a cyano group, an amide group, and —O—C(=O)-G-, where G represents a sulfur atom or —NH—, and a intramolecular fraction c1 of the repeating unit "c" satisfies 0<c1≤0.9.

The resist composition that contains a base resin composed of the polymer compound having such a repeating unit can improve adhesion to a substrate.

Additionally, the polymer compound preferably further comprises one or more repeating units "d" selected from repeating units d1 to d3 shown by the following general formulae (3-1) to (3-3) having a sulfonium salt,

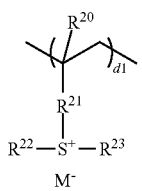

(3-1)

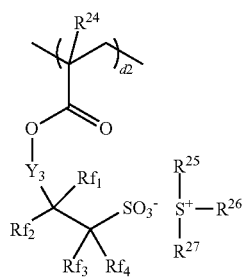

(3-2)

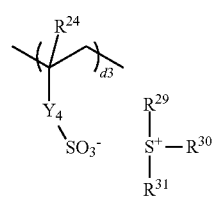

(3-3)

wherein $R^{20}$, $R^{24}$, and $R^{28}$ represent a hydrogen atom or a methyl group; $R^{21}$ represents a single bond, a phenylene group, —O—R—, or —C(=O)—V—R—, where V represents an oxygen atom or —NH—, and R represents a phenylene group or a linear, branched, or cyclic alkylene group or alkenylene group having 1 to 6 carbon atoms and optionally containing a carbonyl group, an ester group, an ether group, or a hydroxyl group; $Rf_1$ to $Rf_4$ represent a fluorine atom, a hydrogen atom, or a trifluoromethyl group, provided that one or more of $Rf_1$ to $Rf_4$ are a fluorine atom or a trifluoromethyl group; $R^{22}$, $R^{23}$, $R^{25}$, $R^{26}$, $R^{27}$, $R^{29}$, $R^{30}$, and $R^{31}$ are the same or different and represent a linear, branched, or cyclic alkyl group having 1 to 12 carbon atoms, an aryl group having 6 to 12 carbon atoms, an aralkyl group having 7 to 20 carbon atoms, or a thiophenyl group optionally containing a carbonyl group, an ester group, or an ether group, in which two or more of $R^{25}$, $R^{26}$, and $R^{27}$ may be bonded to each other to form a ring together with the sulfur atom in the formula, and when the ring is formed, an oxygen atom may be contained therein; $Y_3$ represents a single bond or a linking group having 1 to 12 carbon atoms and optionally containing an ester group, an ether group, or a lactone ring; $Y_4$ represents a single bond, a methylene group, an ethylene group, a phenylene group, a fluorinated phenylene group, —O—$R^{32}$—, or —C(=O)—W—$R^{32}$—, where W represents an oxygen atom or —NH—, and $R^{32}$ represents a phenylene group or a linear, branched, or cyclic alkylene group or alkenylene group having 1 to 6 carbon atoms and optionally containing a carbonyl group, an ester group, an ether group, or a hydroxyl group; $M^-$ represents a non-nucleophilic counter ion; and d1, d2, and d3 represent a number satisfying 0≤d1≤0.5, 0≤d2≤0.5, 0≤d3≤0.5, and 0<d1+d2+d3≤0.5.

The resist composition that contains a base resin composed of the polymer compound having such repeating units, in which an acid generator is bonded to the main chain of the base polymer, can control the acid diffusion and thus prevent the reduction in resolution due to blur of images attributable to the acid diffusion. In addition, since the acid generator is uniformly dispersed, the edge roughness (LER, LWR) of a pattern to be obtained can be reduced.

Additionally, the resist composition is preferably a chemically amplified resist composition further containing one or more materials selected from an organic solvent, an acid generator, a basic compound, and a surfactant.

Such a resist composition can serve as a positive resist composition having extremely high sensitivity, and can give a resist film having high dissolution contrast and high resolution, exposure margin, excellent process applicability, good pattern profile after exposure, and more excellent etching resistance. In particular, since the acid diffusion can be controlled, the coarse-dense size difference can be reduced. Thus, this composition is highly practical and very effective as a resist composition for VLSI.

Furthermore, the present invention provides a patterning process comprising:

applying the above resist composition on a substrate; performing exposure with a high energy beam after a heat treatment; and performing development with a developer.

This patterning process of the present invention facilitates forming a pattern with high resolution, small edge roughness, and good pattern profile.

The high energy beam is preferably an i-line beam, a KrF excimer laser beam, an ArF excimer laser beam, an electron beam, or a soft X-ray having a wavelength of 3 to 15 nm.

Such high energy beams enable a finer pattern to be formed.

As mentioned above, the inventive resist composition can improve, particularly, the decomposition efficiency of an acid generator, and thus can achieve high sensitivity, high effect of controlling the acid diffusion, high resolution, low dimensional variation (CDU and edge roughness such as LER and LWR) of a pattern to be obtained, excellent process adaptability, and good pattern profile after exposure. Thus, the composition having these excellent characteristics is extremely practical, and can be used as a resist composition, particularly a chemically amplified positive resist composition, especially useful for a fine patterning material for manufacturing VLSI or for photomask by EB drawing, or a patterning material for EB or EUV exposure, etc. In addition, the inventive resist composition, particularly a chemically amplified positive resist composition, can be used, for example, not only for lithography in semiconductor circuit formation but also in formation of a mask circuit pattern, a micromachine, or a thin-film magnetic head circuit.

DETAILED DESCRIPTION OF THE PREFERRED EMBODIMENTS

As mentioned above, there is a demand of a resist composition that has high sensitivity and high resolution, and can give a pattern with low dimensional variation and good pattern profile after exposure.

The present inventors have earnestly investigated to achieve a resist composition that has high sensitivity and high resolution, and can give a pattern with low dimensional variation as recently required, and found that it is extremely effective to use a polymer compound containing a repeating unit having a hydroxybenzoquinone group or a hydroxynaphthoquinone group as a base resin of a resist composition, particularly a chemically amplified positive resist composition.

Furthermore, the present inventors found that when a polymer compound obtained by copolymerizing a (meth)acrylate having a hydroxybenzoquinone group or a hydroxynaphthoquinone group as shown by the following general formula (1) with a monomer for providing a repeating unit having either or both of a carboxyl group in which a hydrogen atom is substituted with an acid-labile group and a phenolic hydroxyl group in which a hydrogen atom is substituted with an acid-labile group, is used as a base resin of a resist composition, particularly a chemically amplified positive resist composition to improve the dissolution contrast, the resist composition, particularly the chemically amplified positive resist composition, can have high sensitivity and significantly improved alkali dissolution rate contrast before and after exposure, can effectively control the acid diffusion, can achieve high resolution, good dimensional variation and good pattern profile after exposure, and can be suitably used for a fine patterning material especially for manufacturing VLSI or photomask.

That is, the present invention is a resist composition comprising a polymer compound as a base resin, the polymer compound comprising a repeating unit "a" shown by the following general formula (1) and a repeating unit "b" having either or both of a carboxyl group in which a hydrogen atom is substituted with an acid-labile group and a phenolic hydroxyl group in which a hydrogen atom is substituted with an acid-labile group, the polymer compound having a weight average molecular weight of 1,000 to 500,000,

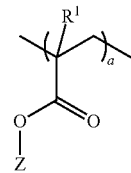

(1)

wherein $R^1$ represents a hydrogen atom or a methyl group; Z represents a hydroxyberzoauinone group, or a hydroxynaphthoquinone group optionally containing a substituent; and a fraction "a" of the repeating unit "a" satisfies $0<a<1.0$, and a fraction "b" of the repeating unit "b" satisfies $0<b<1.0$.

Hereinafter, the present invention will be described in detail.

The polymer compound used as the base resin of the inventive resist composition contains a repeating unit "a" of a (meth)acrylate having a hydroxybenzoquinone group or a hydroxynaphthoquinone group, as shown by the general formula (1).

A phenol group has sensitizing effect with respect to EB and EUV, and can prevent swelling in an alkali aqueous developer. The polymer compound used as the base resin of the inventive resist composition has a hydroxyl group and a quinone group in one molecule. The quinone group negatively charged by EB or EUV exposure transfers energy to an acid generator along with electrons. This increases the decomposition efficiency of the acid generator, providing higher sensitizing effect than the phenol group.

The repeating unit "a" is preferably a repeating unit a1 shown by the following general formula (1-1) having a hydroxybenzoquinone group, or a repeating unit a2 shown by the following general formula (1-2) having a hydroxynaphthoquinone group,

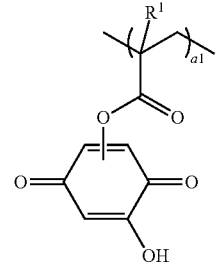

(1-1)

wherein $R^1$ is as defined above; and a1 represents a number satisfying $0<a1<1.0$,

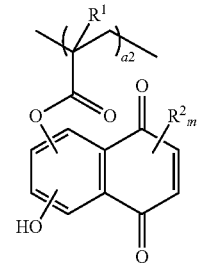

(1-2)

wherein R¹ is as defined above; R² represents a hydrogen atom, a halogen atom, or a linear or branched alkyl group having 1 to 4 carbon atoms; "m" represents 1 or 2; and a2 represents a number satisfying 0<a2<1.0.

Examples of monomers Ma1 and Ma2 that can give the repeating units a1 and a2 shown by the general formulae (1-1) and (1-2) are shown below,

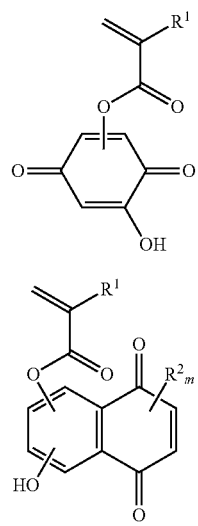

wherein R¹, R², and "m" are as defined above.

The monomer Ma1 and the monomer Ma2 can be synthesized by changing dihydroxybenzoquinone and dihydroxynaphthoquinone into mono(meth)acrylate, respectively. Illustrative examples of the monomers Ma1 and Ma2 that can give the repeating units a1 and a2 include the following compounds.

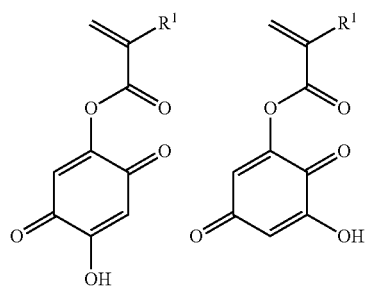

wherein R¹ is as defined above.

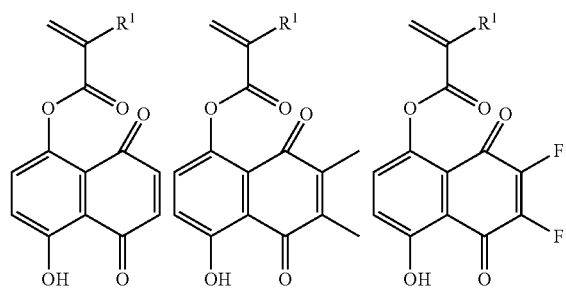

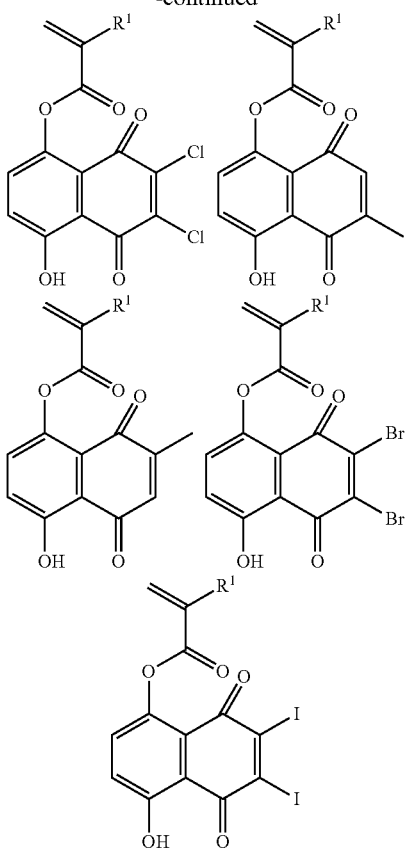

wherein R¹ is as defined above.

The repeating unit "a" in the polymer compound used as the base resin of the inventive resist composition is a hydroxybenzoquinone (meth)acrylate or a hydroxynaphthoquinone (meth) acrylate. A benzoquinone group and a naphthoquinone group having no hydroxyl group have no sensitizing effect, and fail to prevent swelling in a developer. A hydroxyphenyl methacrylate has a sensitizing effect, but a sensitizer with higher sensitizing effect is required for higher sensitization. The hydroxybenzoquinone group and the hydroxynaphthoquinone group generate electrons from two carbonyl groups by EB or EUV exposure. The electrons energetically transfer to an acid generator, thereby generating an acid. Thus, the inventive resist composition enables a resist with high sensitivity to be formed by high sensitizing effect of the hydroxybenzoquinone group or the hydroxynaphthoquinone group.

The polymer compound used as the base resin of the inventive resist composition contains a repeating unit "b" having either or both of a carboxyl group in which a hydrogen atom is substituted with an acid-labile group and a phenolic hydroxyl group in which a hydrogen atom is substituted with an acid-labile group.

The repeating unit "b" is preferably one or more repeating units selected from a repeating unit b1 shown by the following general formula (2-1) and a repeating unit b2 shown by the following general formula (2-2). In particular, the polymer compound preferably contains the repeating unit a1 or a2 as the repeating unit "a" and the repeating unit b1 and/or b2 as the repeating unit "b",

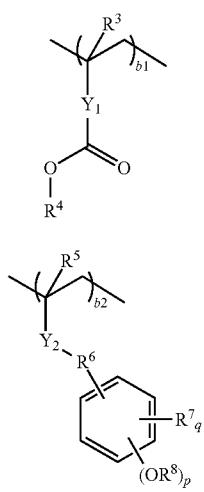

wherein $R^3$ and $R^5$ represent a hydrogen atom or a methyl group; $R^4$ and $R^8$ represent an acid-labile group; FP represents a single bond or a linear or branched alkylene group having 1 to 6 carbon atoms and optionally containing an ether group or an ester group; $R^7$ represents a hydrogen atom, a fluorine atom, a trifluoromethyl group, a cyano group, or a linear, branched, or cyclic alkyl group having 1 to 6 carbon atoms; "p" represents 1 or 2; "q" represents an integer of 0 to 4; $p+q \leq 5$; $Y_1$ represents a linking group having 1 to 12 carbon atoms and containing an ester group, an ether group, or a lactone ring, or represents a single bond, a phenylene group, or a naphthylene group; $Y_2$ represents a single bond, an ester bond, or —C(=O)—NH—; b1 and b2 represent a number satisfying $0 \leq b1 < 1.0$, $0 \leq b2 < 1.0$, $0 < b1+b2 < 1.0$, and $0.1 \leq a+b1+b2 \leq 1.0$.

Examples of monomers Mb1 and Mb2 that can give the repeating units b1 and b2 shown by the general formulae (2-1) and (2-2) having an acid-labile group are shown

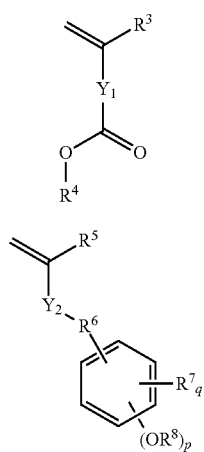

wherein $R^3$ to $R^8$ $Y_1$, $Y_2$, "p", and "q" are as defined above.

In this case, examples of $Y_1$, the linking group having 1 to 12 carbon atoms and containing a lactone ring, include the following group

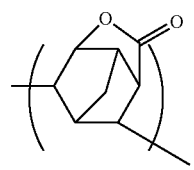

Illustrative examples of the monomer Mb1 that can give the repeating unit b1 include the following compounds,

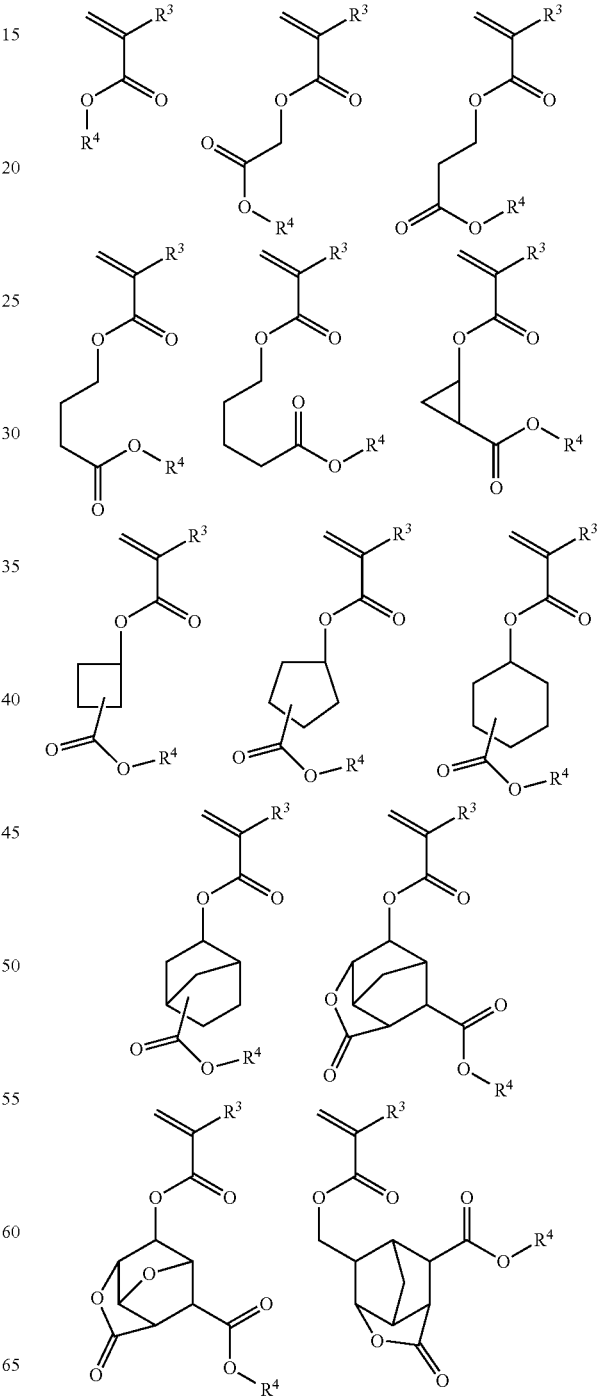

-continued
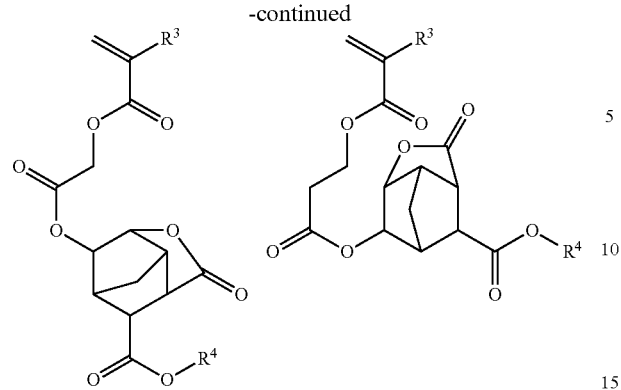
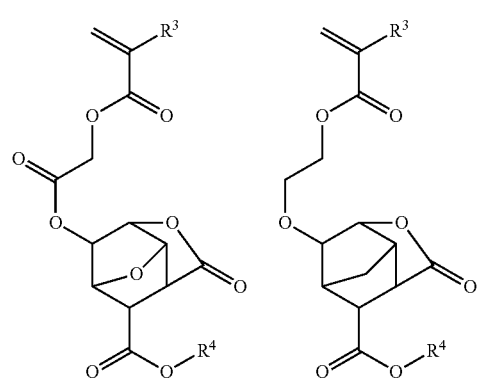
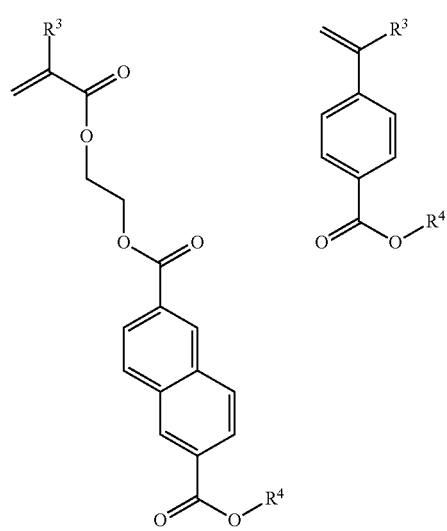
-continued
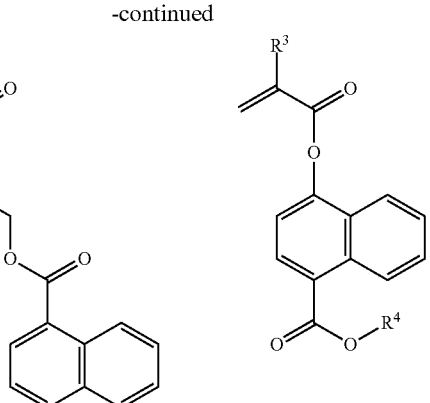
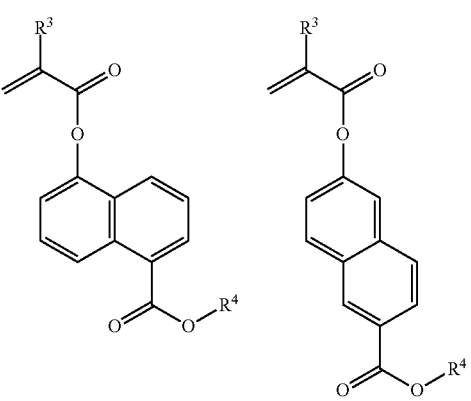
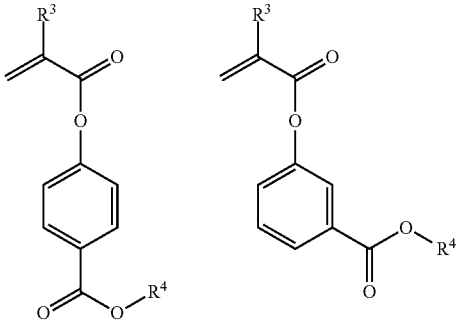
wherein $R^3$ and $R^4$ are as defined above.
Illustrative examples of the monomer Mb2 that can give the repeating unit b2 include the following compounds,
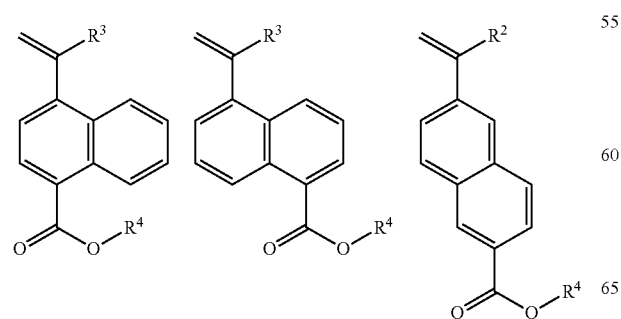
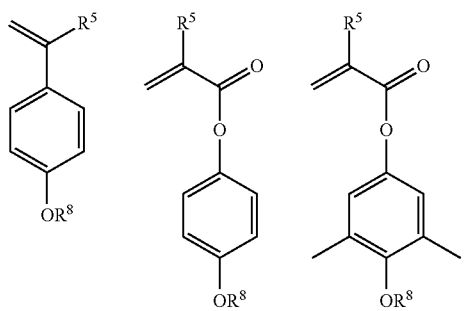

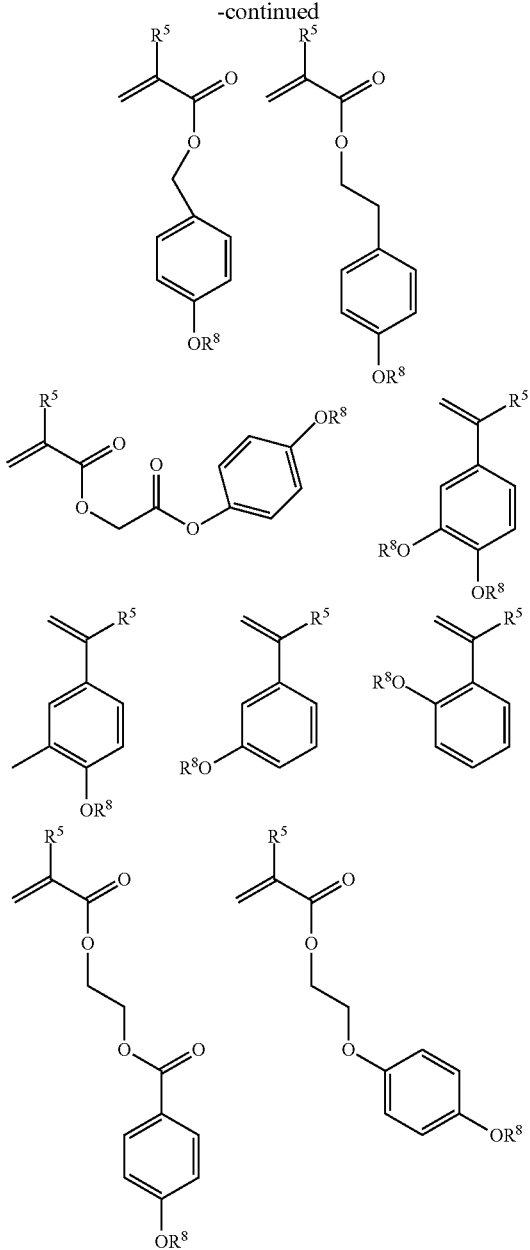

wherein R⁵ and R⁸ are as defined above.

The acid-labile groups (the acid-labile groups represented by $R^4$ and $R^8$ in the general formulae (2-1) and (2-2)) are appropriately selected, and may be the same or different from each other. In particular, there may be mentioned groups shown by the following formulae (A-1) to (A-3).

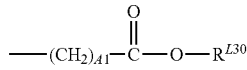 (A-1)

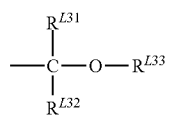 (A-2)

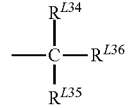 (A-3)

In the formula (A-1), $R^{L30}$ represents a tertiary alkyl group having 4 to 20, preferably 4 to 15 carbon atoms, a trialkylsilyl group containing alkyl groups having 1 to 6 carbon atoms, an oxoalkyl group having 4 to 20 carbon atoms, or a group shown by the formula (A-3). Illustrative examples of the tertiary alkyl group include a tert-butyl group, a tert-amyl group, a 1,1-diethylpropyl group, a 1-ethylcyclopentyl group, a 1-butylcyclopentyl group, a 1-ethylcyclohexyl group, a 1-butylcyclohexyl group, a 1-ethyl-2-cyclopentenyl group, a 1-ethyl-2-cyclohexenyl group, and a 2-methyl-2-adamantyl group; illustrative examples of the trialkylsilyl group include a trimethylsilyl group, a triethylsilyl group, and a dimethyl-tert-butylsilyl group; and illustrative examples of the oxoalkyl group include a 3-oxocyclohexyl group, a 4-methyl-2-oxooxan-4-yl group, and a 5-methyl-2-oxooxolan-5-yl group. A1 is an integer of 0 to 6.

Illustrative examples of the acid-labile group shown by the formula (A-1) include a tert-butoxycarbonyl group, a tert-butoxycarbonylmethyl group, a tert-amyloxycarbonyl group, a tert-amyloxycarbonylmethyl group, a 1,1-diethylpropyloycarbonyl group, a 1,1-diethylpropyloxycarbonylmethyl group, a 1-ethylcyclopentyloxycarbonyl group, a 1-ethylcyclopentyloxycarbonylmethyl group, a 1-ethyl-2-cyclopentenyloxycarbonyl group, a 1-ethyl-2-cyclopentenyloxycarbonylmethyl group, a 1-ethoxyethoxycarbonylmethyl group, a 2-tetrahydropyranyloxycarbonylmethyl group, and a 2-tetrahydrofuranyloxycarbonylmethyl group.

Other examples include substituents shown by the following formulae (A-1)-1 to (A-1)-10.

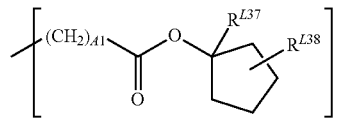 (A-1)-1

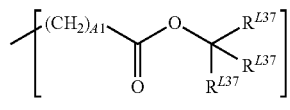 (A-1)-2

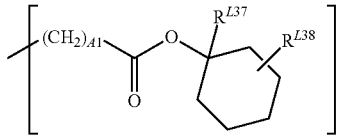 (A-1)-3

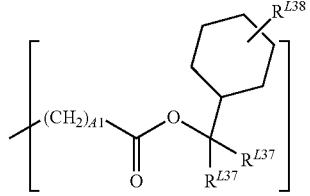 (A-1)-4

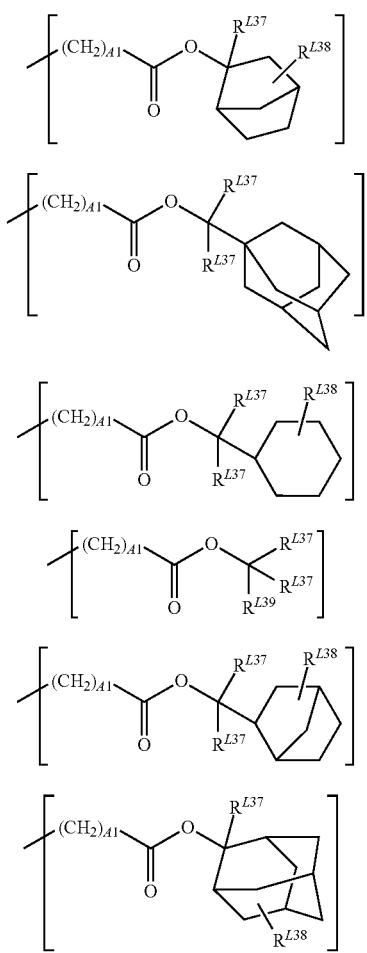

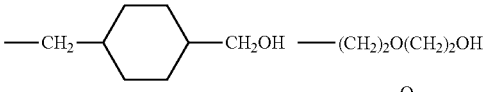
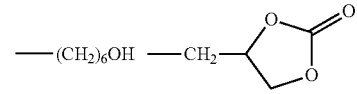

$R^{L31}$ and $R^{L32}$, $R^{L31}$ and $R^{L33}$, and $R^{L32}$ and $R^{L33}$ may be bonded to form a ring together with the carbon atoms bonded thereto; and when the ring is formed, $R^{L31}$, $R^{L32}$, and $R^{L33}$ that participate in the ring formation each represent a linear or branched alkylene group having 1 to 18, preferably 1 to 10 carbon atoms. The carbon number in the ring is preferably 3 to 10, particularly preferably 4 to 10.

Among the acid-labile groups shown by the formula (A-2), illustrative examples of the linear or branched one include groups of the following formulae (A-2)-1 to (A-2)-69.

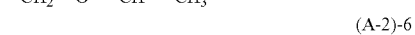

In the above formulae, each $R^{L37}$ is the same or different, and represents a linear, branched, or cyclic alkyl group having 1 to 10 carbon atoms or an aryl group having 6 to 20 carbon atoms, and $R^{L38}$ represents a hydrogen atom or a linear, branched, or cyclic alkyl group having 1 to 10 carbon atoms.

Each $R^{L39}$ is the same or different, and represents a linear, branched, or cyclic alkyl group having 2 to 10 carbon atoms or an aryl group having 6 to 20 carbon atoms.

A1 is as defined above.

In the formula (A-2), $R^{L31}$ and $R^{L32}$ represent a hydrogen atom or a linear, branched, or cyclic alkyl group having 1 to 18, preferably 1 to 10 carbon atoms. Illustrative examples thereof include a methyl group, an ethyl group, a propyl group, an isopropyl group, a n-butyl group, a sec-butyl group, a tert-butyl group, a cyclopentyl group, a cyclohexyl group, a 2-ethylhexyl group, and a n-octyl group. $R^{L33}$ represents a monovalent hydrocarbon group having 1 to 18, preferably 1 to 10 carbon atoms, and optionally containing a heteroatom such as an oxygen atom. For example, there may be mentioned a linear, branched, or cyclic alkyl group and a group in which a part of hydrogen atoms in these groups is substituted with a hydroxyl group, an alkoxy group, an oxo group, an amino group, an alkylamino group, or the like. Illustrative examples thereof include the following substituted alkyl groups.

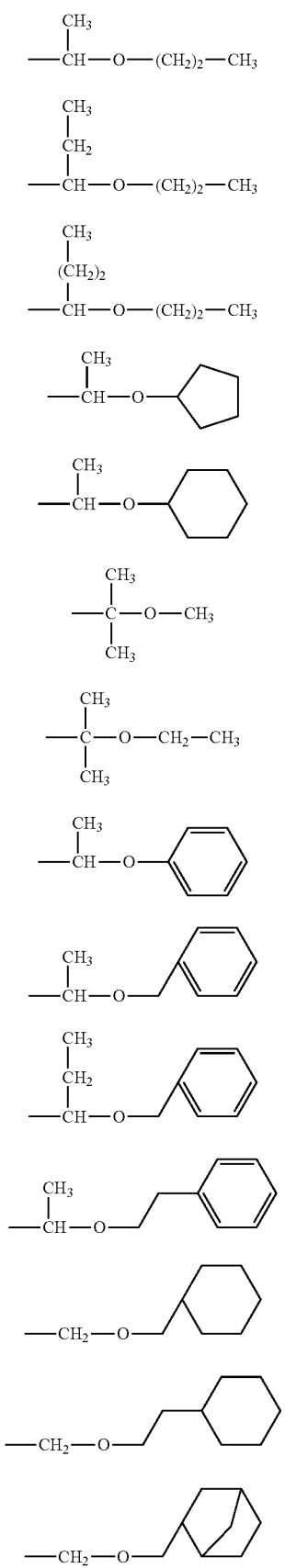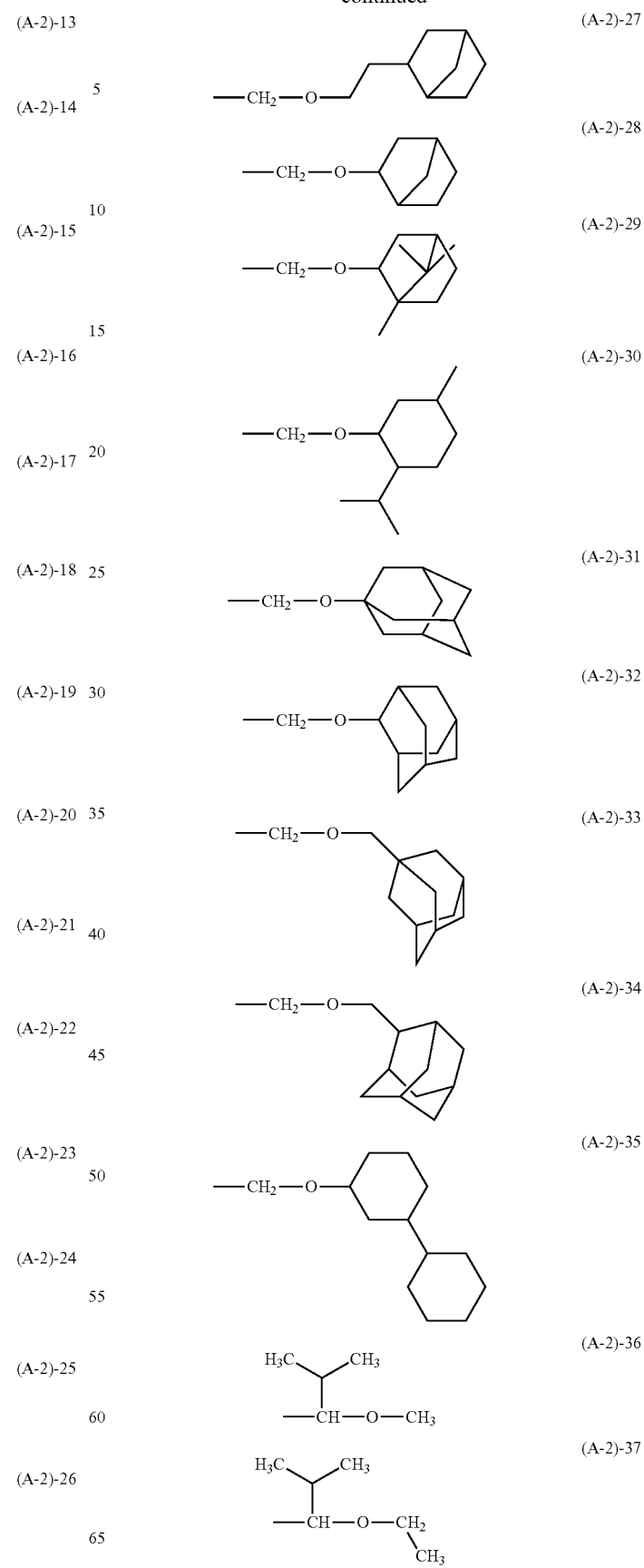

(A-2)-38 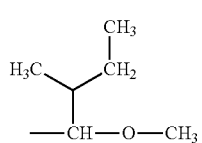
(A-2)-39 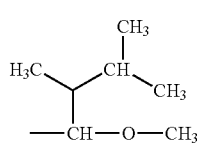
(A-2)-40 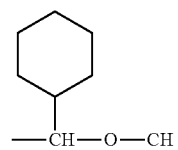
(A-2)-41 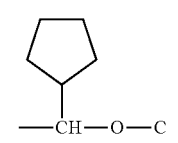
(A-2)-42 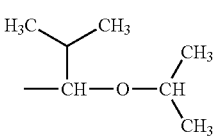
(A-2)-43 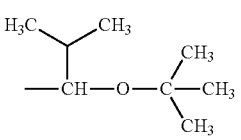
(A-2)-44 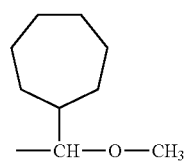
(A-2)-45 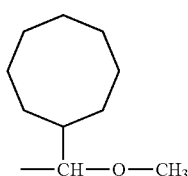
(A-2)-46 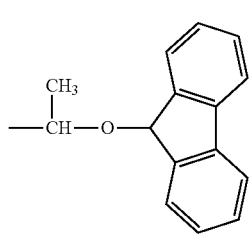
(A-2)-47 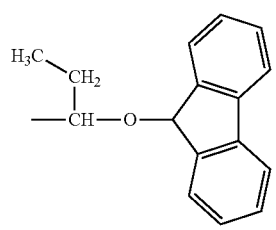
(A-2)-48 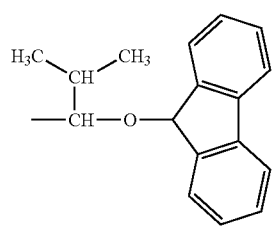
(A-2)-49 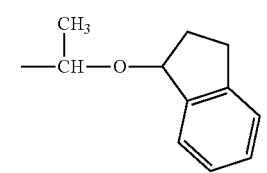
(A-2)-50 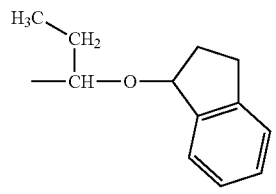
(A-2)-51 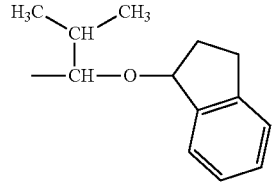
(A-2)-52 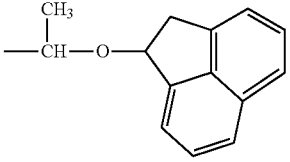
(A-2)-53 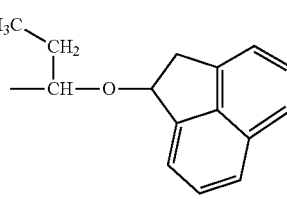
(A-2)-54 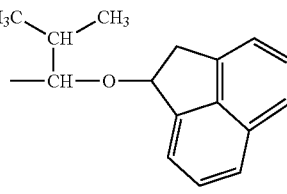

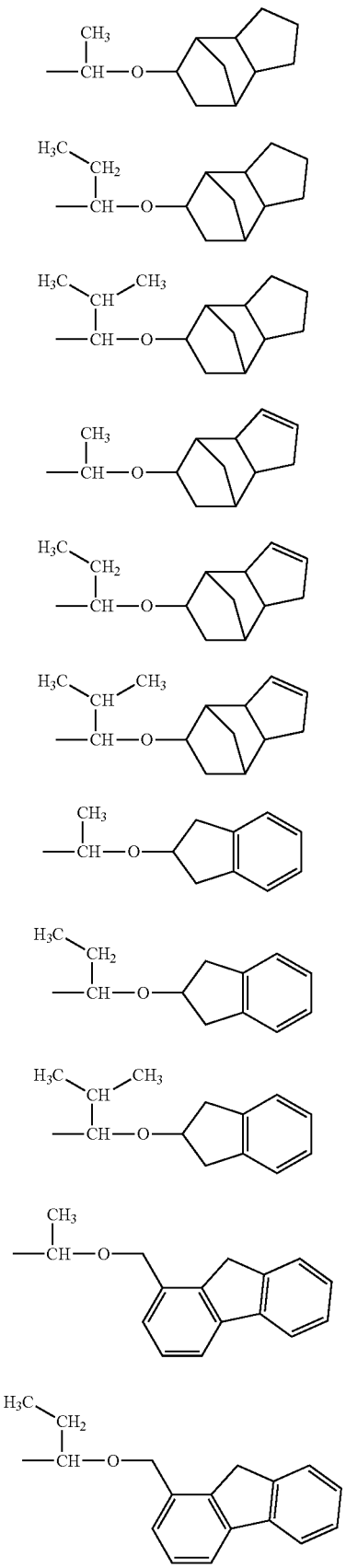

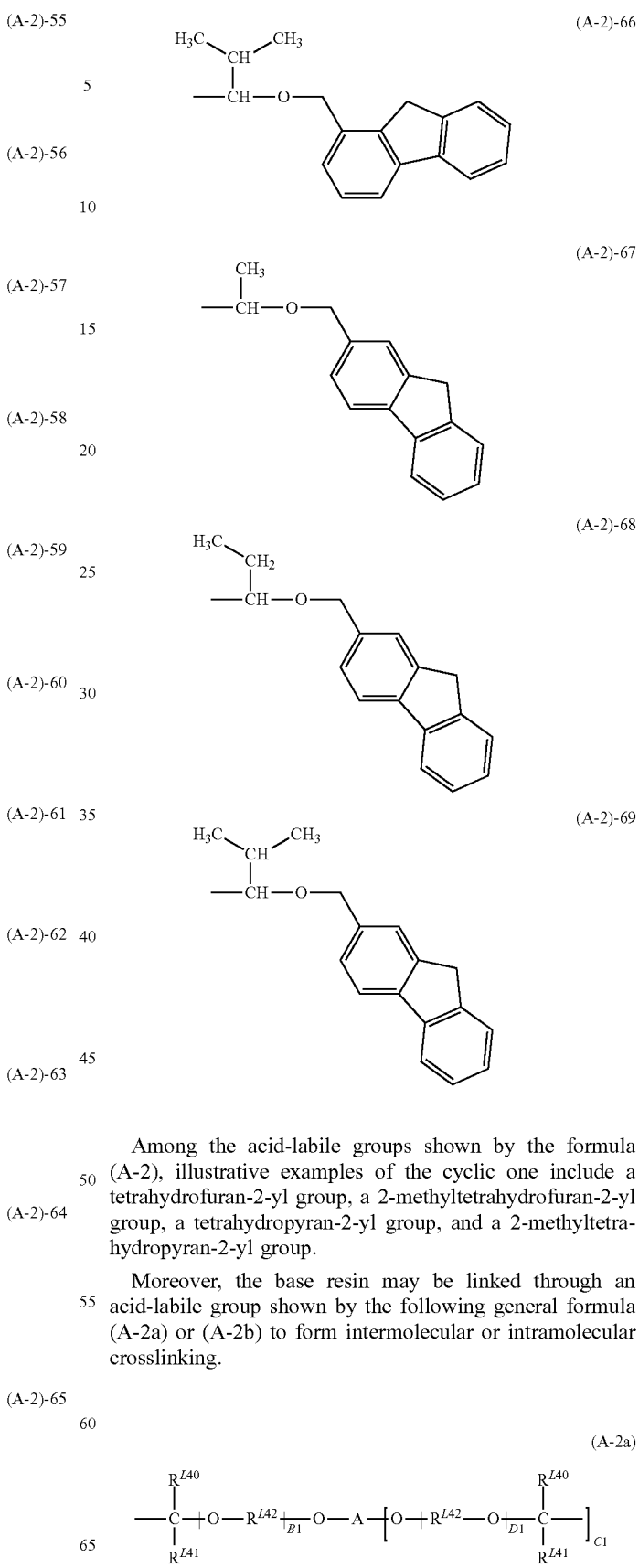

Among the acid-labile groups shown by the formula (A-2), illustrative examples of the cyclic one include a tetrahydrofuran-2-yl group, a 2-methyltetrahydrofuran-2-yl group, a tetrahydropyran-2-yl group, and a 2-methyltetrahydropyran-2-yl group.

Moreover, the base resin may be linked through an acid-labile group shown by the following general formula (A-2a) or (A-2b) to form intermolecular or intramolecular crosslinking.

-continued (A-2b)

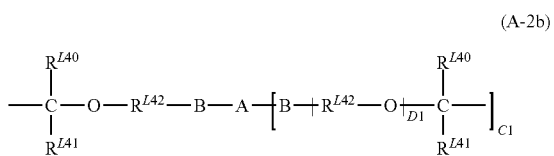

In the above formulae, $R^{L40}$ and $R^{L41}$ represent a hydrogen atom or a linear, branched, or cyclic alkyl group having 1 to 8 carbon atoms. Alternatively, $R^{L40}$ and $R^{L41}$ may be bonded to form a ring together with the carbon atoms bonded thereto; and when the ring is formed, $R^{L40}$ and $R^{L41}$ represent a linear or branched alkylene group having 1 to 8 carbon atoms. $R^{L42}$ represents a linear, branched, or cyclic alkylene group having 1 to 10 carbon atoms; B1 and D1 represent an integer of 0 or 1 to 10, preferably 0 or 1 to 5; and C1 represents an integer of 1 to 7. A represents an aliphatic or alicyclic saturated hydrocarbon group, an aromatic hydrocarbon group, or a heterocyclic group having 1 to 50 carbon atoms with a valency of (C1+1), in which these groups may contain a heteroatom, or a part of hydrogen atoms bonded to the carbon atom may be substituted with a hydroxyl group, a carboxyl group, a carbonyl group, or a fluorine atom. B represents an ester group, —NHCO—O—, or —NHCONH—.

In this case, A is preferably a linear, branched, or cyclic alkylene group, alkyltriyl group, alkyltetrayl group having 1 to 20 carbon atoms, or an arylene group having 6 to 30 carbon atoms with a valency of 2 to 4, in which these groups may contain a heteroatom, and a part of hydrogen atoms bonded to the carbon atom may be substituted with a hydroxyl group, a carboxyl group, an acyl group, or a halogen atom. C1 is preferably an integer of 1 to 3.

Illustrative examples of the crosslinking acetal group shown by the general formulae (A-2a) and (A-2b) include groups of the following formulae (A-2)-70 to (A-2)-77.

(A-2)-70
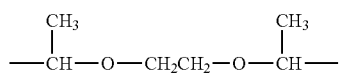

(A-2)-71
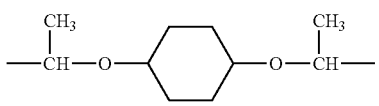

(A-2)-72

(A-2)-73

(A-2)-74
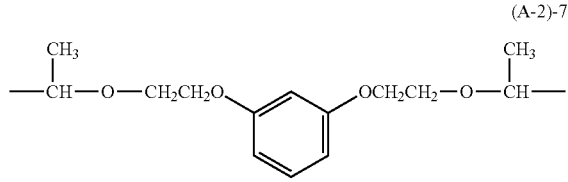

(A-2)-75
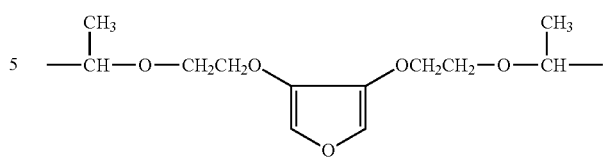

(A-2)-76
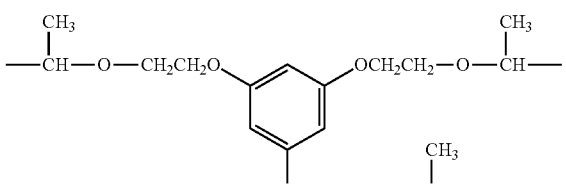

(A-2)-77
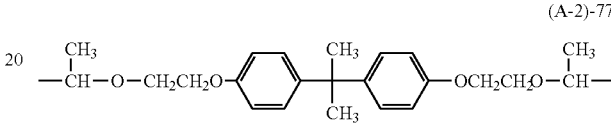

In the formula (A-3), $R^{L34}$, $R^{L35}$, and $R^{L36}$ represent a monovalent hydrocarbon group such as a linear, branched, or cyclic alkyl group having 1 to 20 carbon atoms or a linear, branched, or cyclic alkenyl group having 2 to 20 carbon atoms, optionally containing a heteroatom such as oxygen, sulfur, nitrogen, and fluorine. $R^{L34}$ and $R^{L35}$, $R^{L34}$ and $R^{L36}$, and $R^{L35}$ and $R^{L36}$ may be bonded to form an alicyclic ring having 3 to 20 carbon atoms together with the carbon atoms bonded thereto.

Illustrative examples of the acid-labile group (tertiary alkyl group) shown by the formula (A-3) include a tert-butyl group, a triethylcarbyl group, a 1-ethylnorbornyl group, a 1-methylcyclohexyl group, a 1-ethylcyclopentyl group, a 2-(2-methyl)adamantyl group, a 2-(2-ethyl)adamantyl group, and a tert-amyl group.

Other examples of the tertiary alkyl group shown by the formula (A-3) include groups of the formulae (A-3)-1 to (A-3)-18.

(A-3)-1
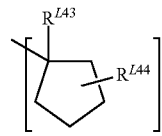

(A-3)-2
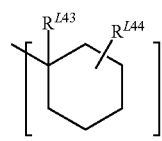

(A-3)-3
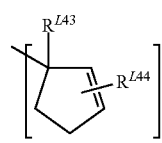

(A-3)-4
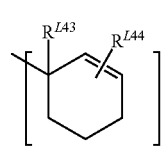

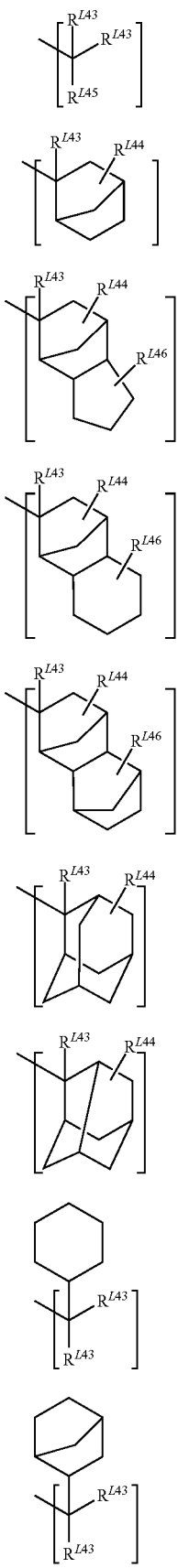
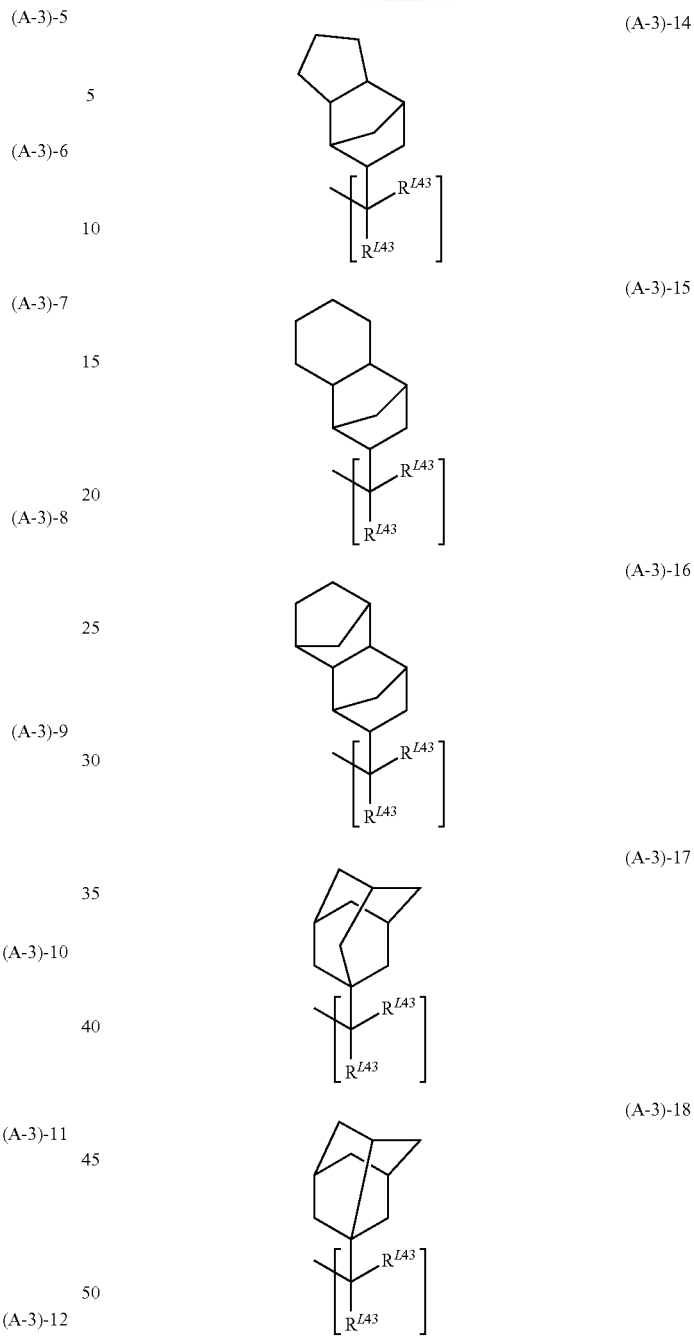

In the formulae (A-3)-1 to (A-3)-18, each $R^{L43}$ is the same or different, and represents a linear, branched, or cyclic alkyl group having 1 to 8 carbon atoms, or an aryl group having 6 to 20 carbon atoms, such as a phenyl group. $R^{L44}$ and $R^{L46}$ represent a hydrogen atom or a linear, branched, or cyclic alkyl group having 1 to 20 carbon atoms. $R^{L45}$ represents an aryl group having 6 to 20 carbon atoms, such as a phenyl group.

Furthermore, as shown in the following formulae (A-3)-19 and (A-3)-20, the polymer may contain $R^{L47}$ which represents a group with a valency of two or more such as an alkylene group and an arylene group to form intermolecular or intramolecular crosslinking.

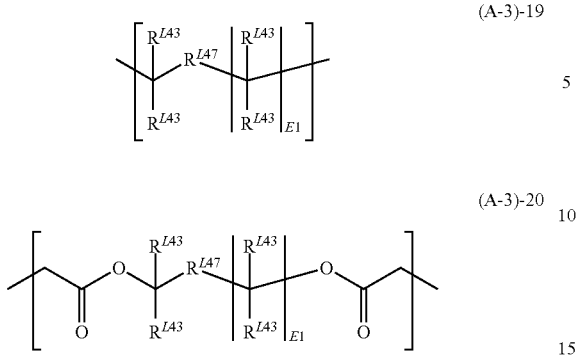

(A-3)-19

(A-3)-20

In the formulae (A-3)-19 and (A-3)-20, $R^{L43}$ is as defined above; $R^4$ represents a linear, branched, or cyclic alkylene group having 1 to 20 carbon atoms, or an arylene group such as a phenylene group, in which these groups may contain a heteroatom such as an oxygen atom, a sulfur atom, and a nitrogen atom; and E1 represents an integer of 1 to 3.

In particular, the acid-labile group shown by the formula (A-3) is preferably an acid-labile group in a repeating unit of (meth)acrylate having the exo structure, shown by the following formula (A-3)-21.

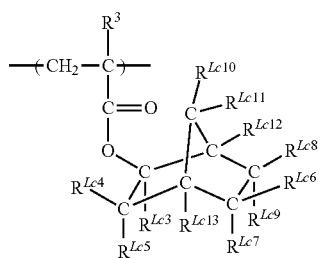

(A-3)-21 wherein $R^3$ is as defined above; $R^{Lc3}$ represents a linear, branched, or cyclic alkyl group having 1 to 8 carbon atoms, or an optionally substituted aryl group having 6 to 20 carbon atoms; $R^{Lc4}$ to $R^{Lc9}$, $R^{Lc12}$, and $R^{Lc13}$ independently represent a hydrogen atom or a monovalent hydrocarbon group having 1 to 15 carbon atoms and optionally containing a heteroatom; $R^{Lc10}$ and $R^{Lc11}$ represent a hydrogen atom or a monovalent hydrocarbon group having 1 to 15 carbon atoms and optionally containing a heteroatom; $R^{Lc4}$ and $R^{Lc5}$, $R^{Lc6}$ and $R^{LC8}$, $R^{Lc6}$ and $R^{Lc9}$, $R^{Lc7}$ and $R^{Lc9}$, $R^{Lc7}$ and $R^{Lc13}$, $R^{Lc8}$ and $R^{Lc12}$, $R^{Lc10}$ and $R^{Lc11}$, or $R^{Lc11}$ and $R^{Lc12}$ may be bonded to form a ring, and when the ring is formed, these groups represent a divalent hydrocarbon group having 1 to 15 carbon atoms and optionally containing a heteroatom; and $R^{Lc4}$ and $R^{Lc13}$, $R^{Lc10}$ and $R^{Lc13}$, or $R^{Lc6}$ and $R^{Lc8}$ may be directly bonded to form a double bond between the groups bonding to adjacent carbon. Note that this formula also represents enantiomer.

Examples of an ester monomer that can give the repeating unit having the exo structure shown by the formula (A-3)-21 are described in Japanese Unexamined Patent Application Publication No. 2000-327633. Illustrative examples thereof are shown below, although it is not limited thereto.

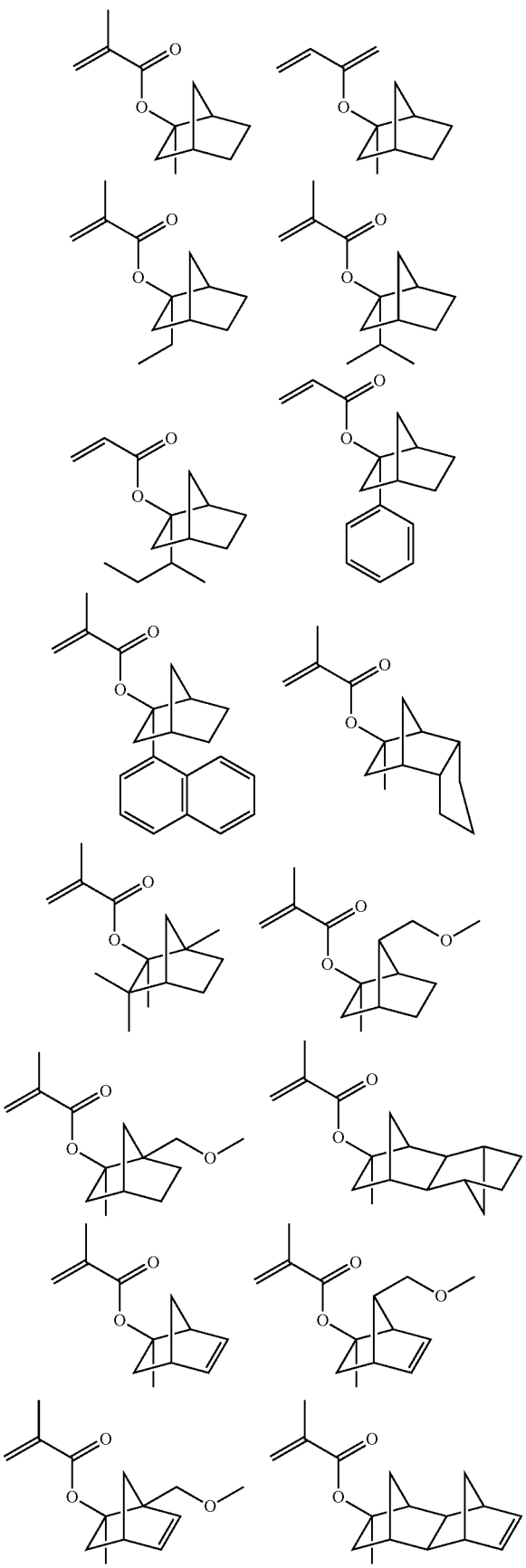

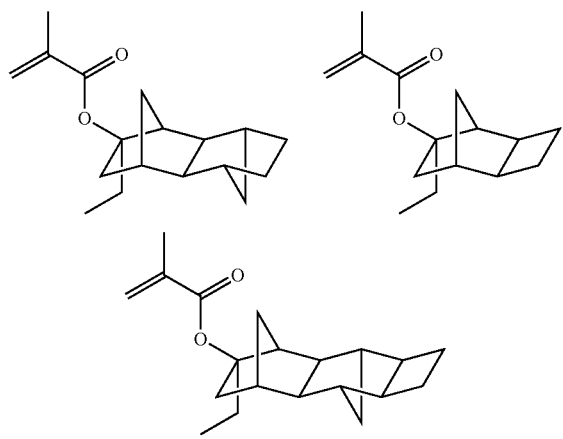

Other examples of the acid-labile group shown by the formula (A-3) include an acid-labile group in a repeating unit of (meth)acrylate having furandiyl, tetrahydrofurandiyl, or oxanorbornanediyl, shown by the following formula (A-3)-22.

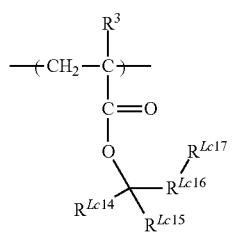

(A-3)-22 wherein $R^3$ is as defined above; $R^{Lc14}$ and $R^{Lc15}$ independently represent a linear, branched, or cyclic monovalent hydrocarbon group having 1 to 10 carbon atoms; $R^{LC14}$ and $R^{Lc15}$ may be bonded to form an alicyclic hydrocarbon ring together with the carbon atoms bonded thereto; $R^{Lc16}$ represents a divalent group selected from furandiyl, tetrahydrofurandiyl, or oxanorbornanediyl; and $R^{Lc17}$ represents a hydrogen atom or a linear, branched, or cyclic monovalent hydrocarbon group having 1 to 10 carbon atoms and optionally containing a heteroatom.

Illustrative examples of a monomer that can give the repeating unit substituted with the acid-labile group having furandiyl, tetrahydrofurandiyl, or oxanorbornanediyl, shown by the formula (A-3)-22 include the following compounds. In the following formulae, Ac and Me denote an acetyl group and a methyl group, respectively.

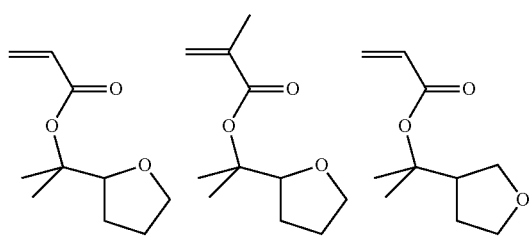

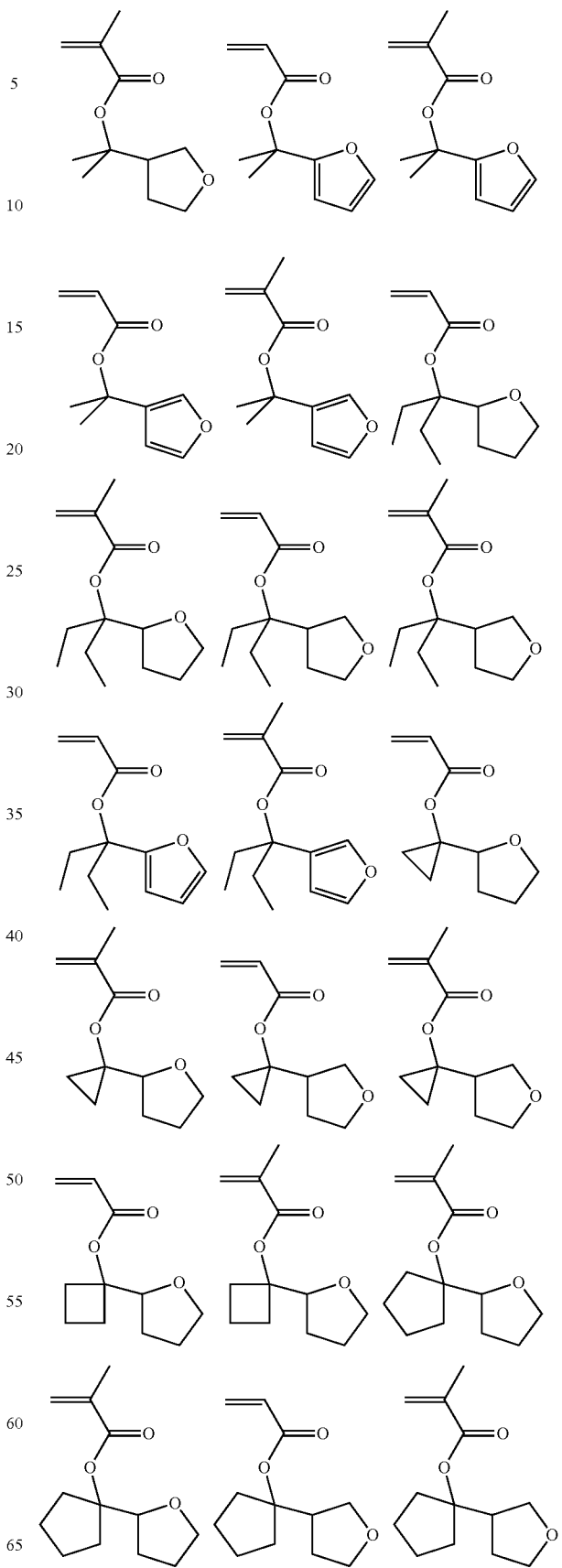

-continued
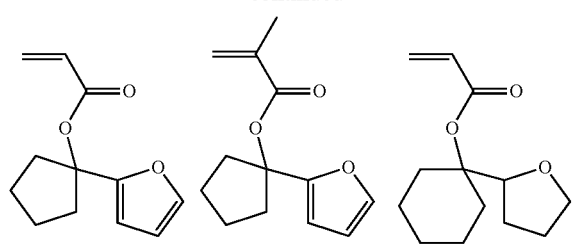
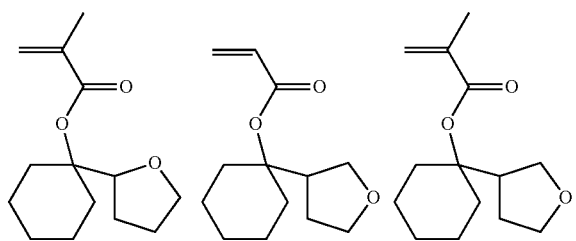
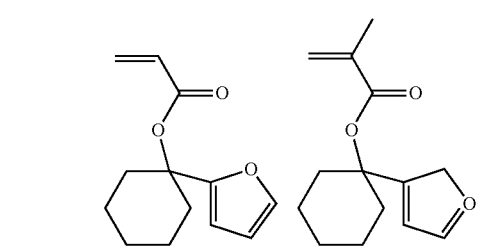
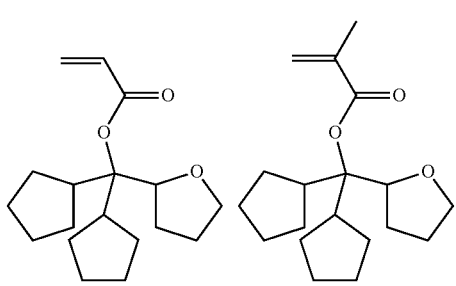
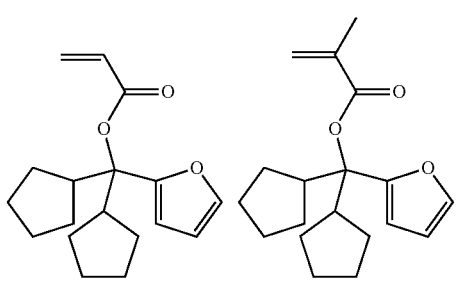
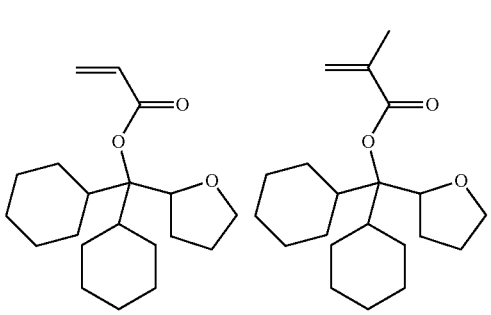
-continued
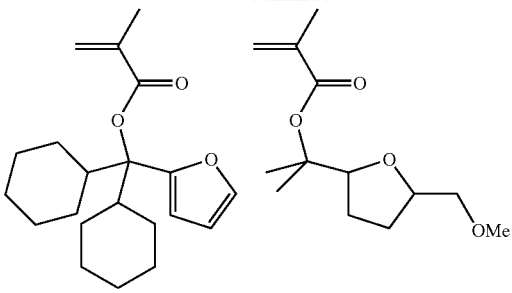
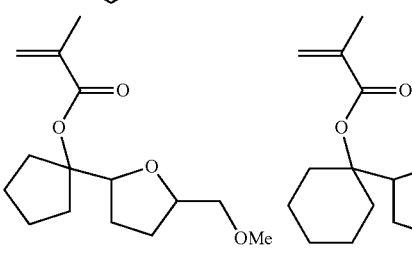
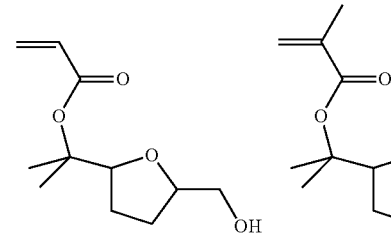
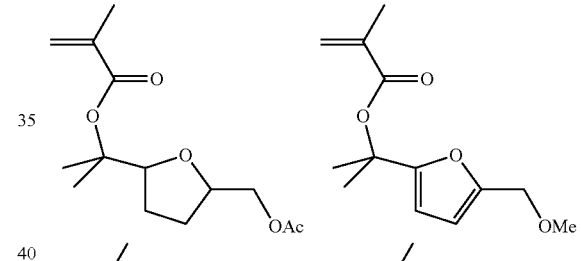
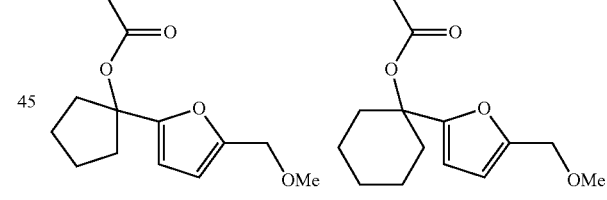
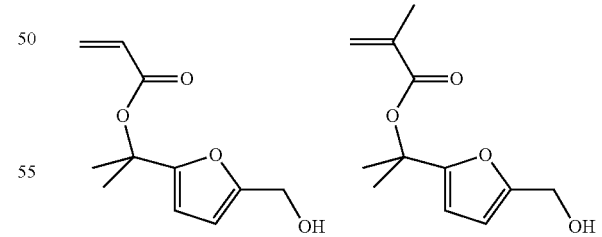
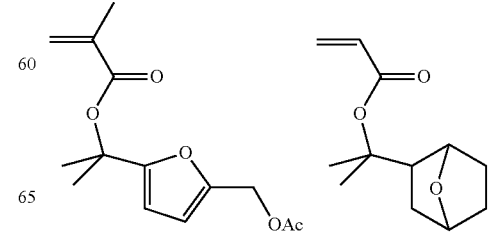

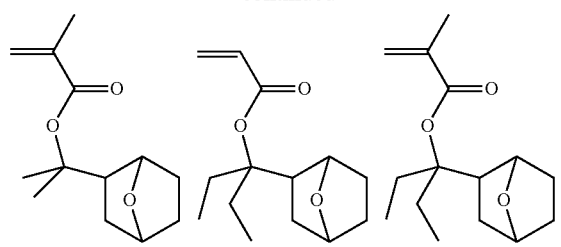
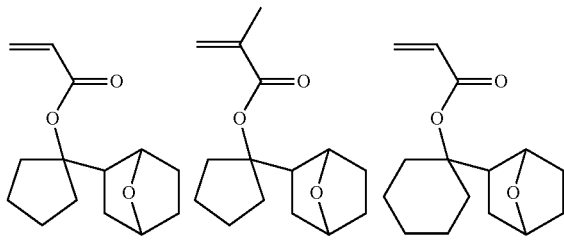
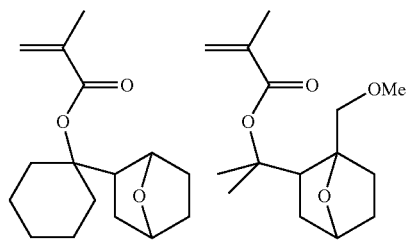
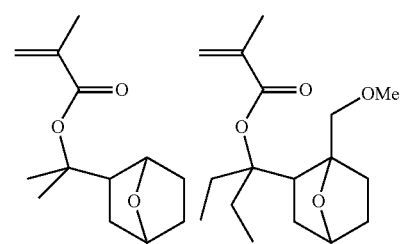
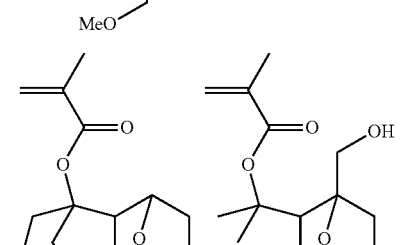
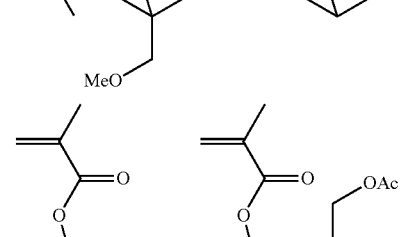

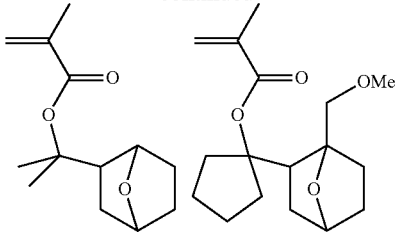
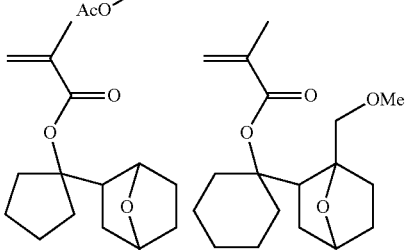
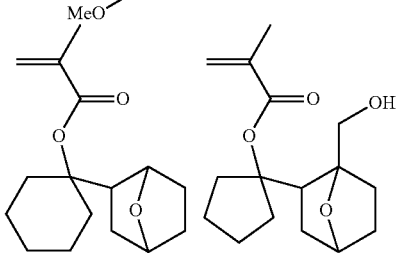
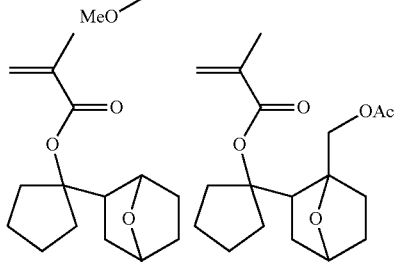
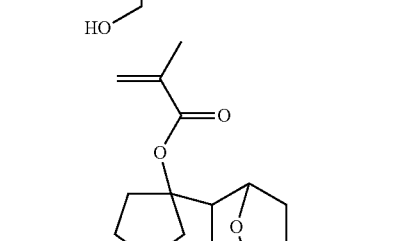
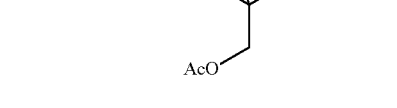

Moreover, the polymer compound used as the base resin of the inventive resist composition preferably contains (i.e., is preferably copolymerized with), in addition to the repeating unit "a" shown by the general formula (1) and the repeating unit "b" having either or both of a carboxyl group in which a hydrogen atom is substituted with an acid-labile group and a phenolic hydroxyl group in which a hydrogen atom is substituted with an acid-labile group (for example, the repeating units b1, b2), a repeating unit "c" having an adhesion group selected from a hydroxyl group, a carboxyl group, a lactone ring, a carbonate group, a thiocarbonate group, a carbonyl group, a cyclic acetal group, an ether group, an ester group, a sulfonate ester group, a cyano group, an amide group, and —O—C(=O)-G-, where G represents a sulfur atom or —NH—. In this case, an intramolecular fraction c1 of the repeating unit "c" satisfies 0<c1<0.9, preferably $0.2 \le a+b1+b2+c \le 1.0$.

Illustrative examples of a monomer that can give the repeating unit "c" having an adhesion group selected from a hydroxyl group, a carboxyl group, a lactone ring, a carbonate group, a thiocarbonate group, a carbonyl group, a cyclic acetal group, an ether group, an ester group, a sulfonate ester group, a cyano group, an amide group, and —O—C(=O)-G-, where G represents a sulfur atom or —NH—, include the following compounds.

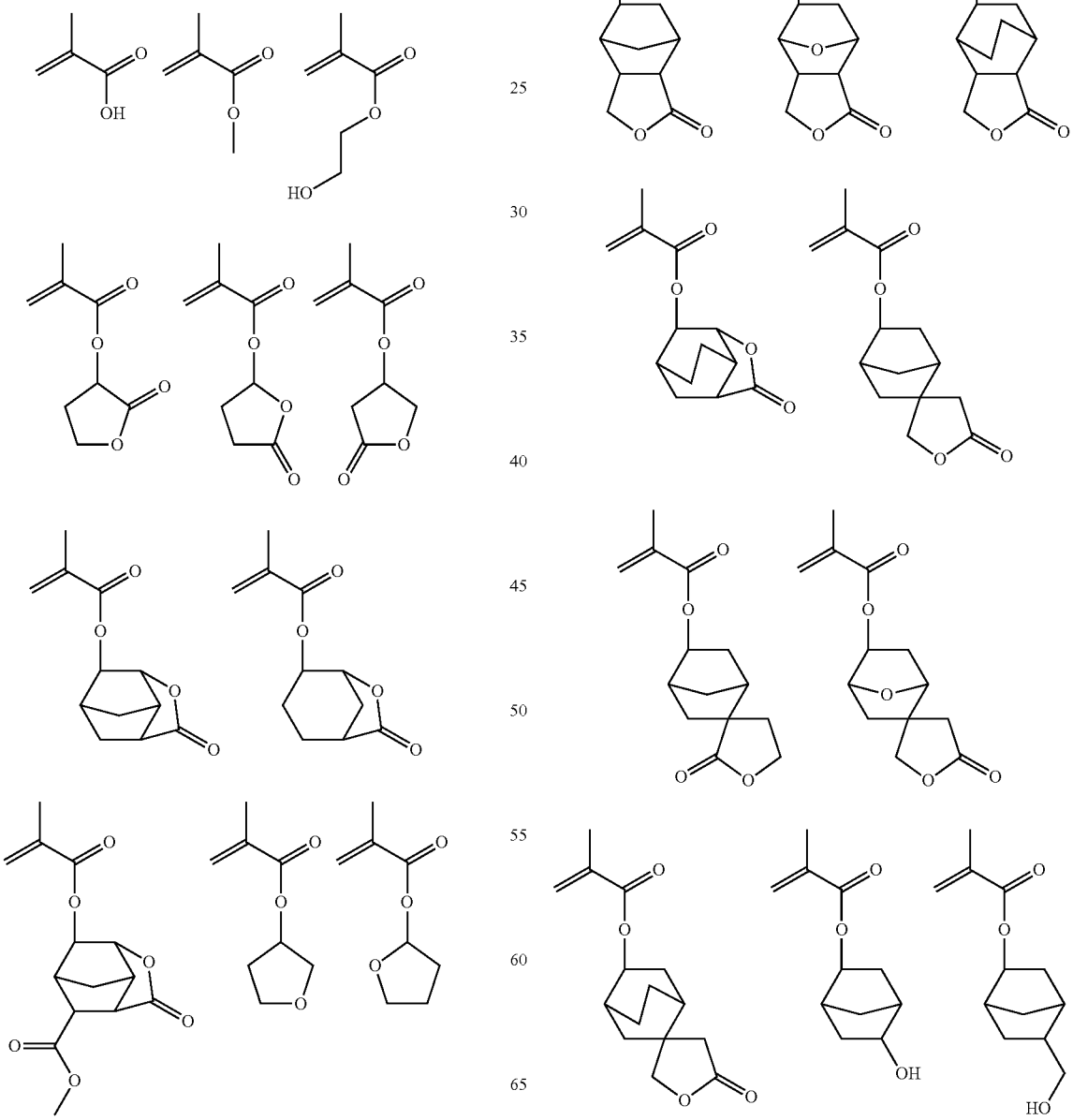

-continued
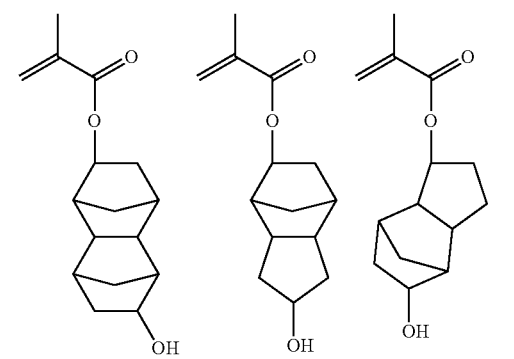
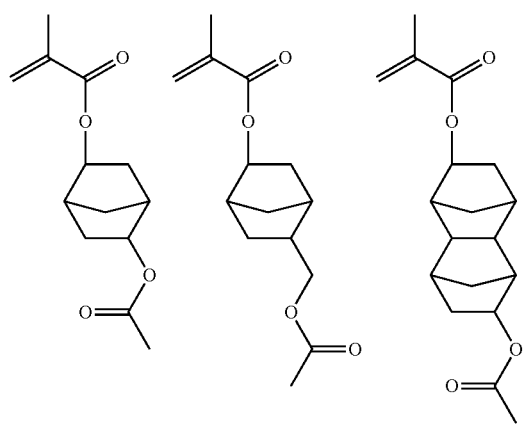
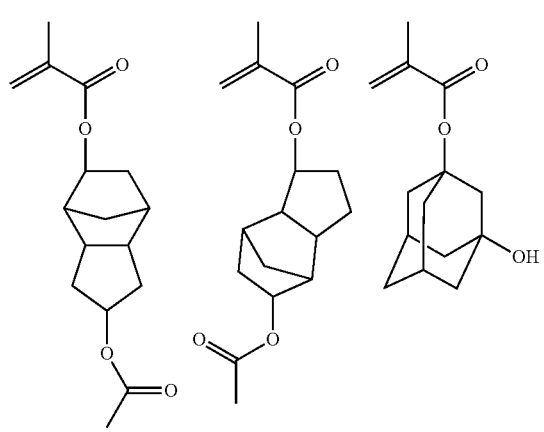
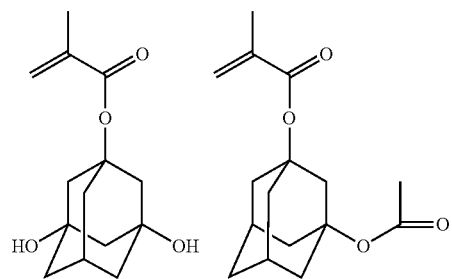
-continued
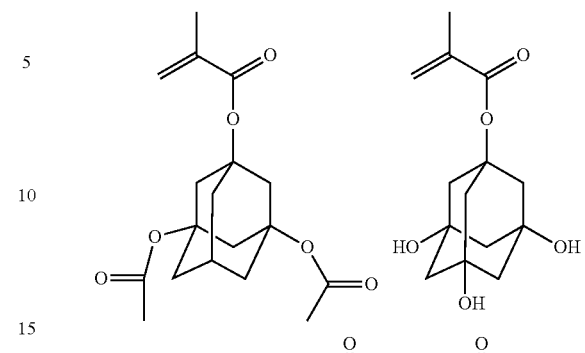
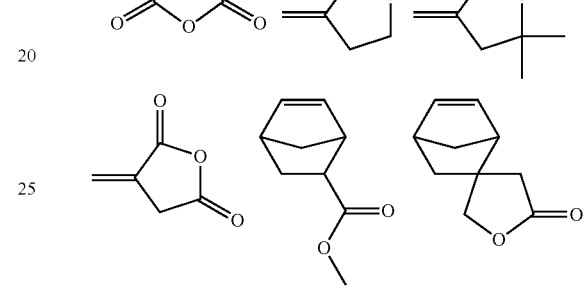
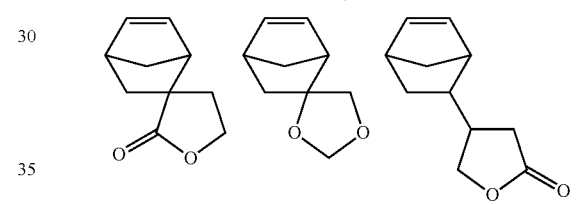
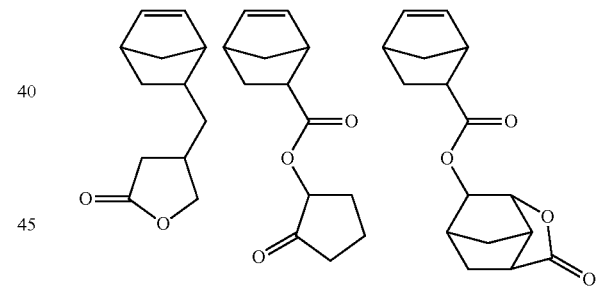
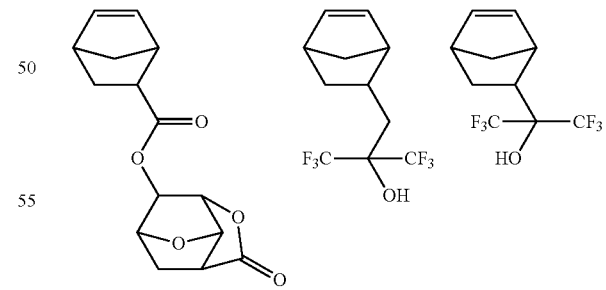
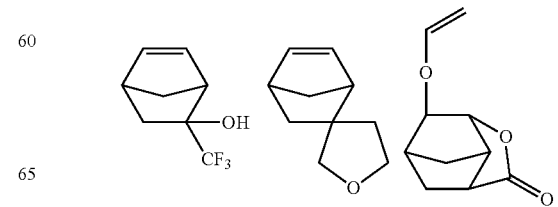

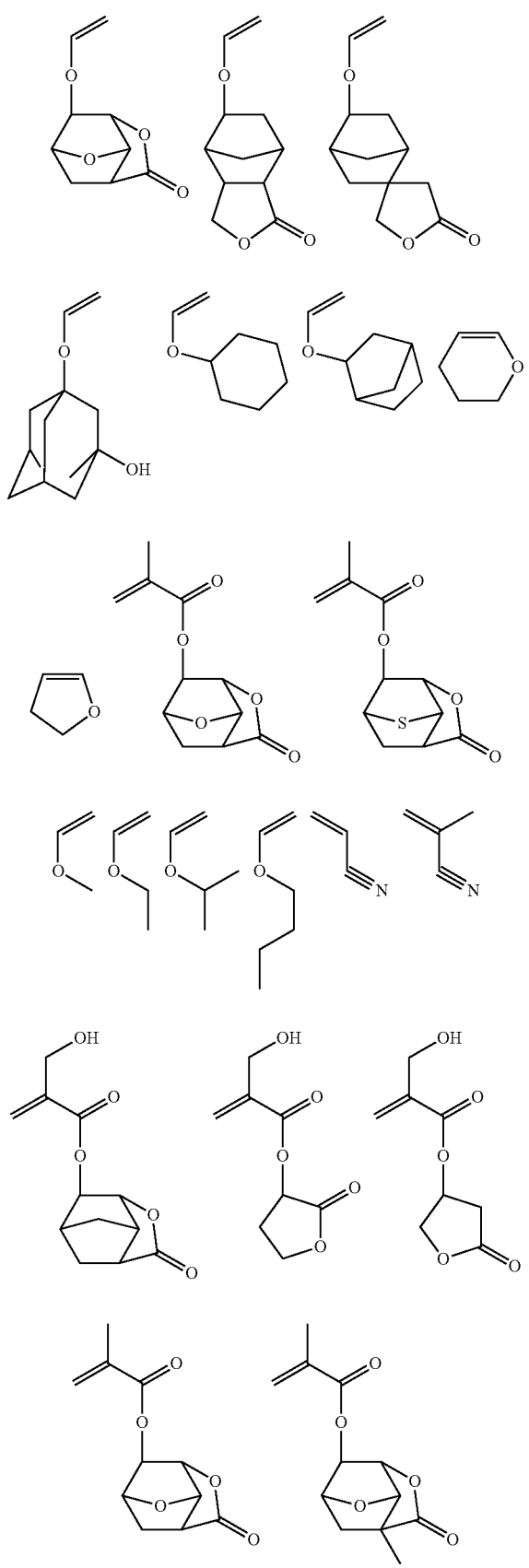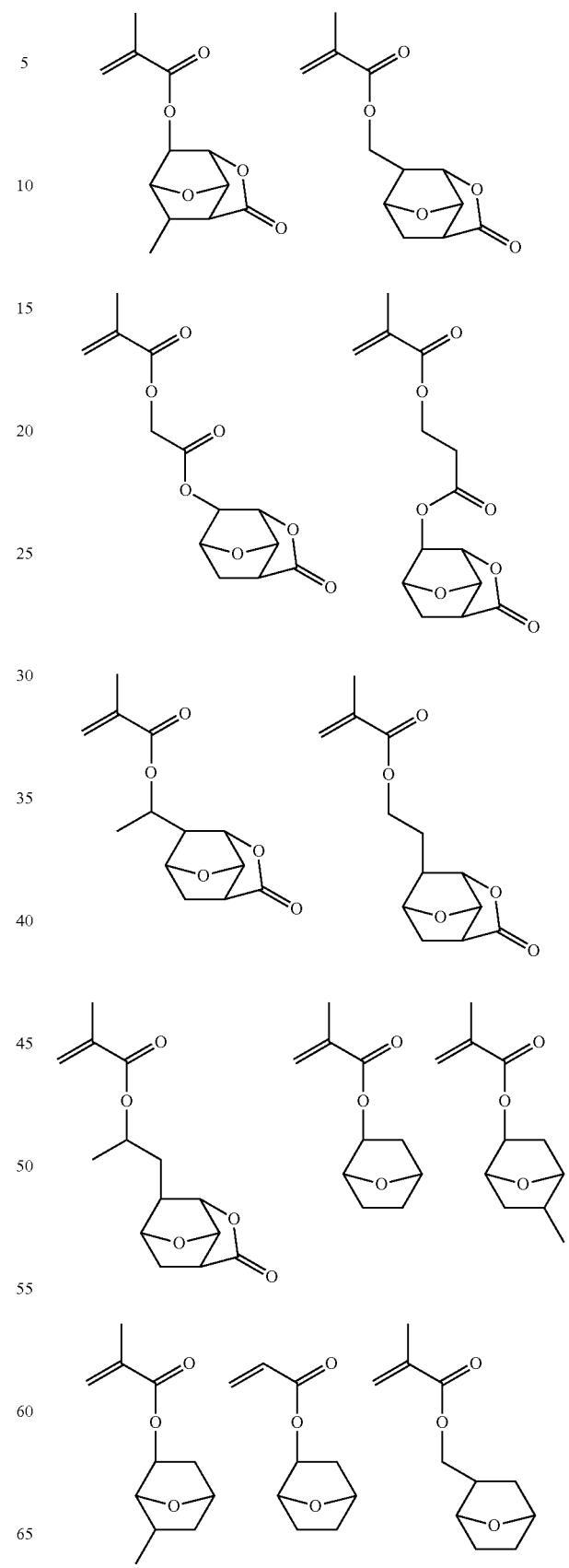

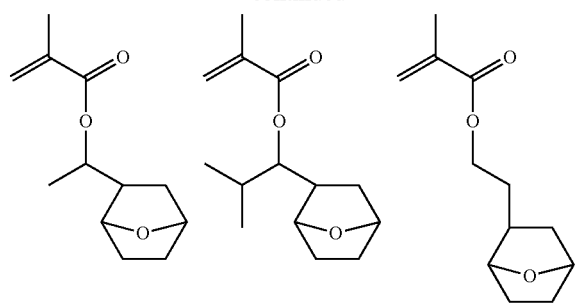
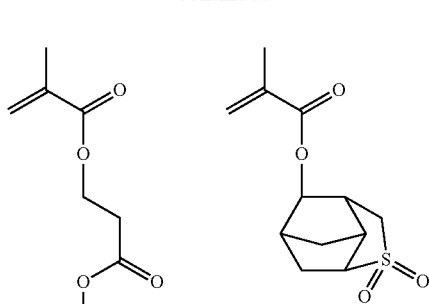
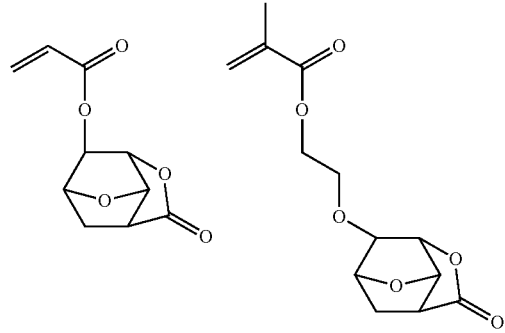
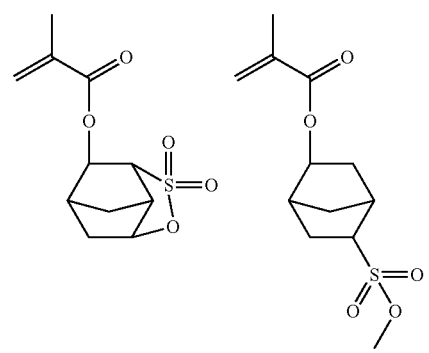
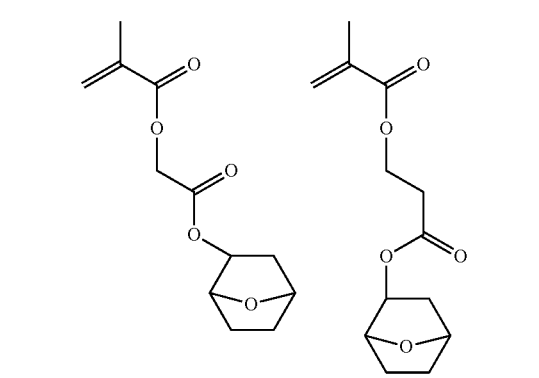
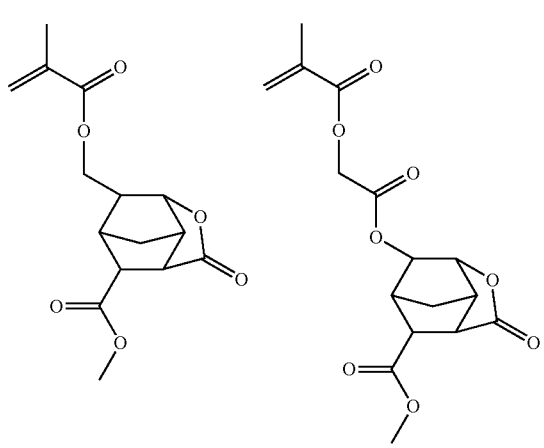
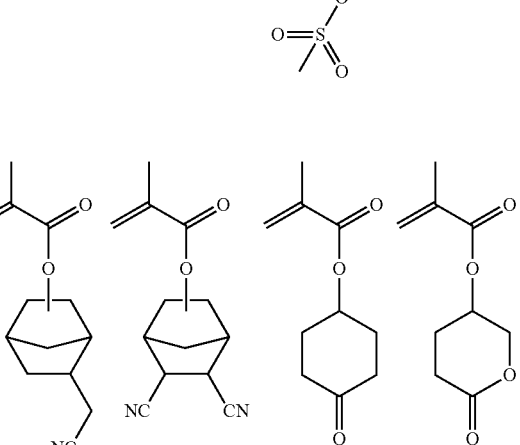

-continued
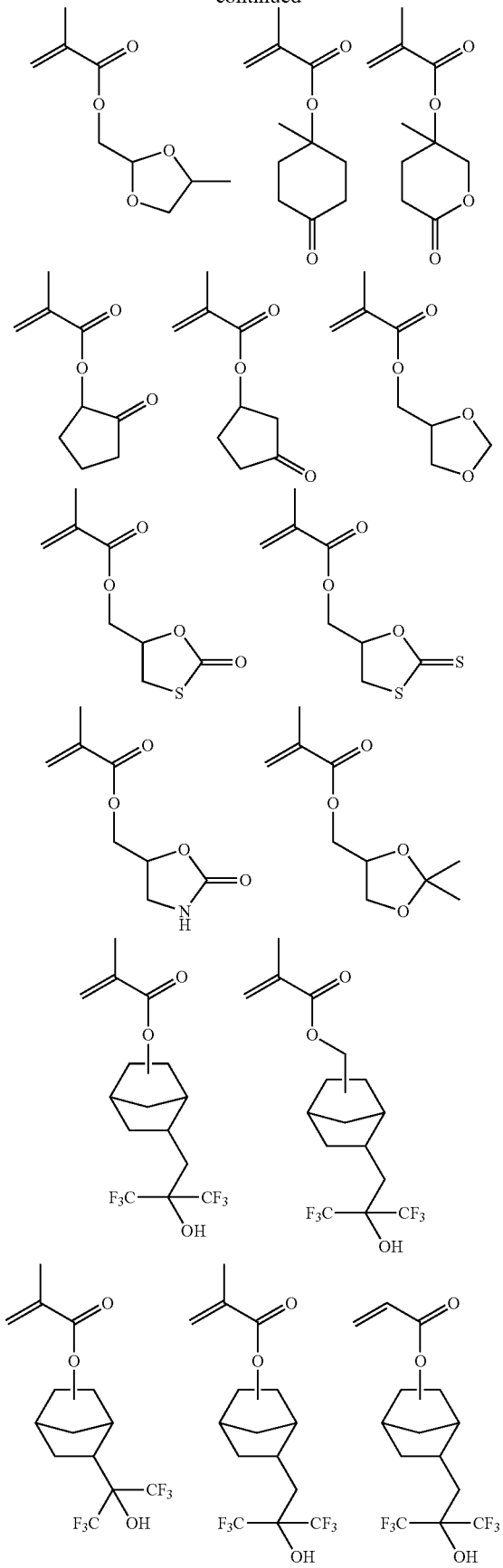
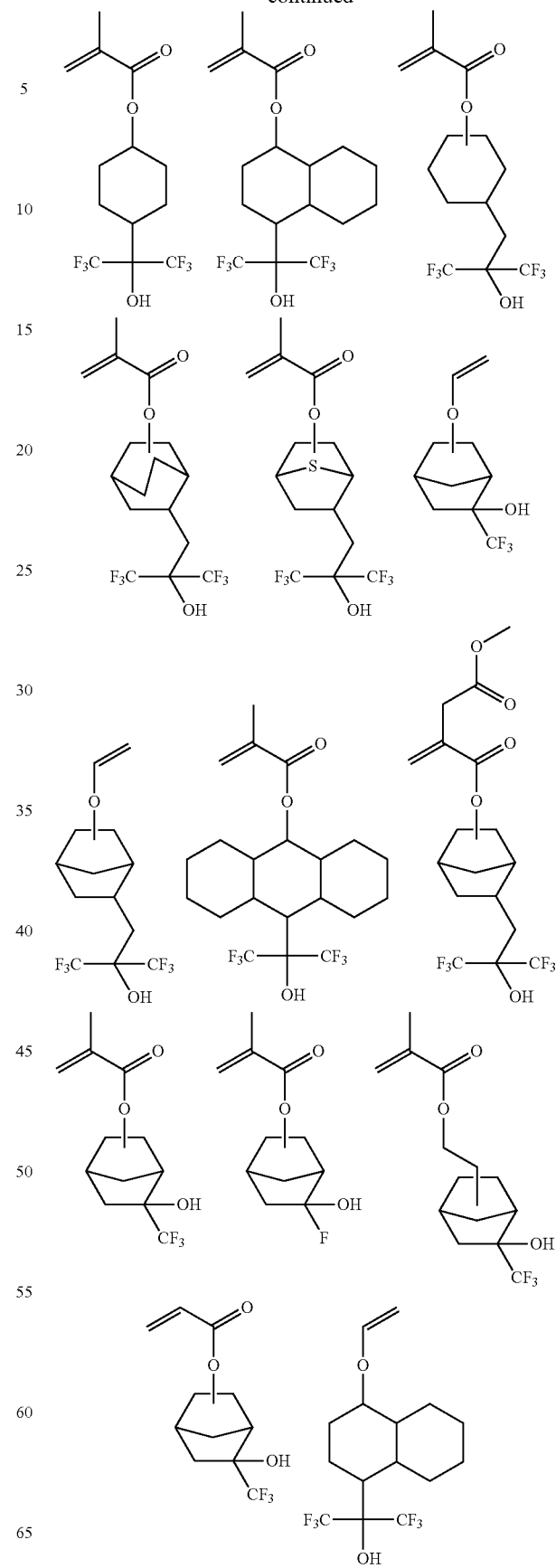

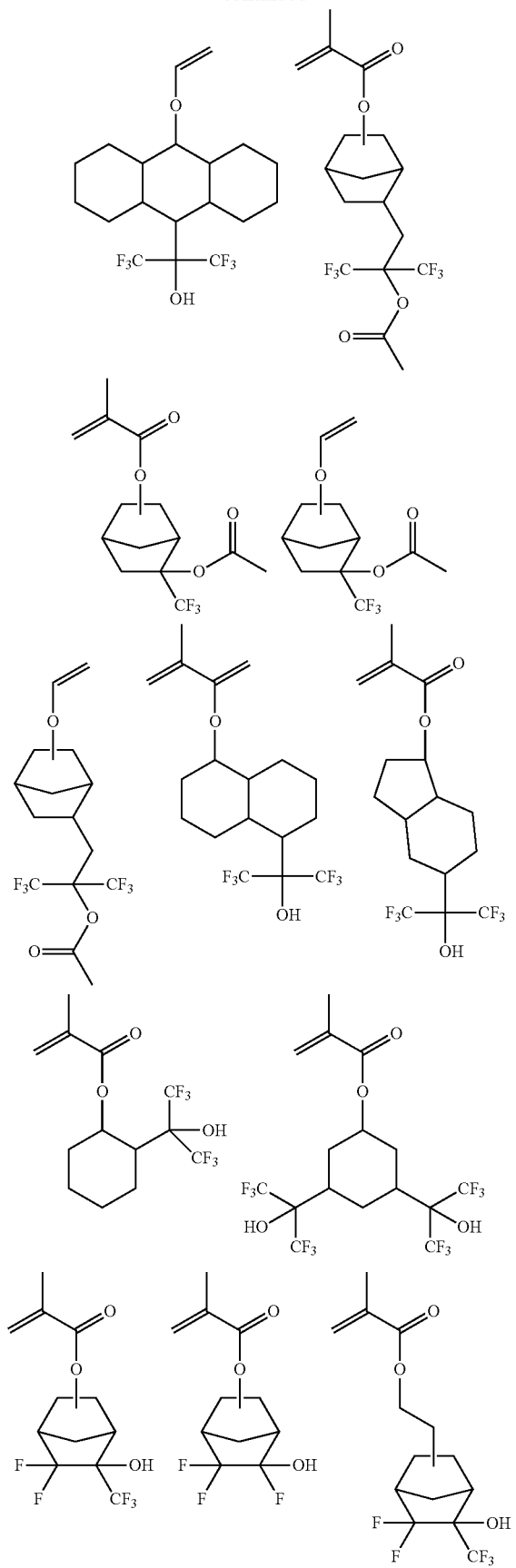
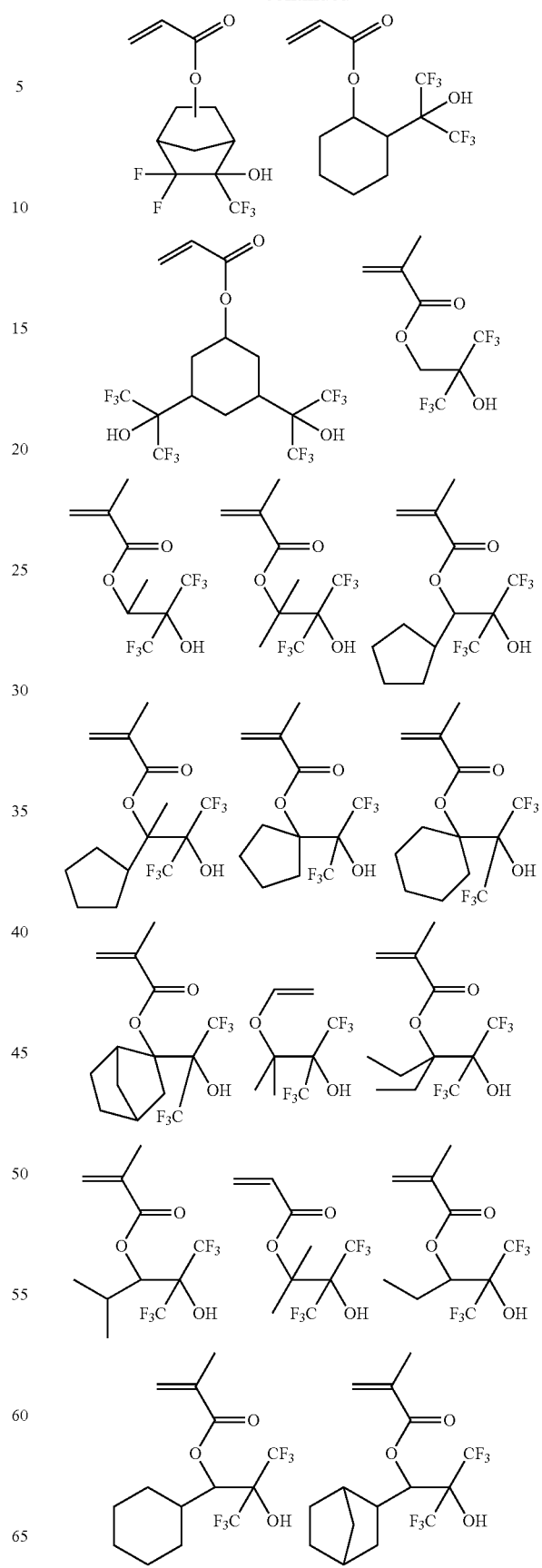

49
-continued
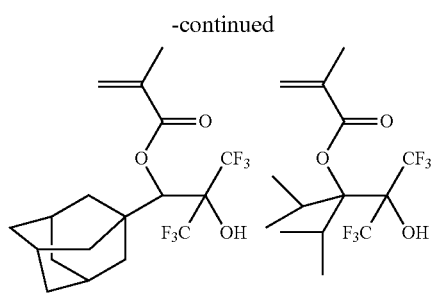
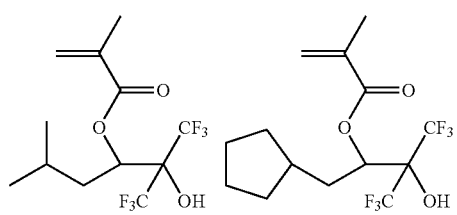
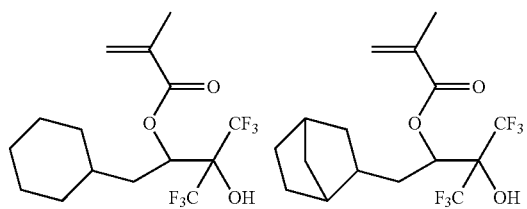
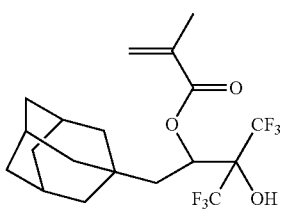
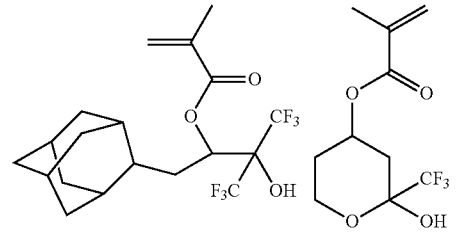
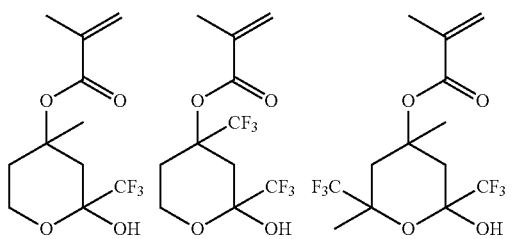
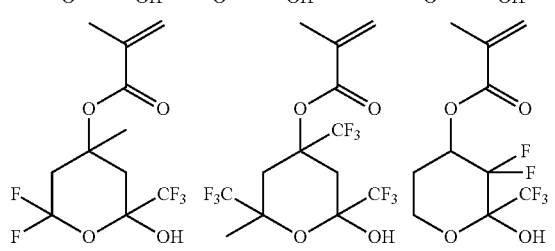
50
-continued
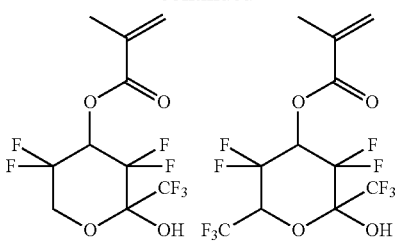
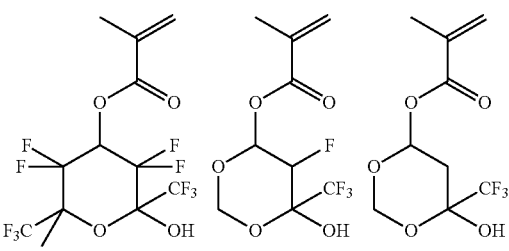
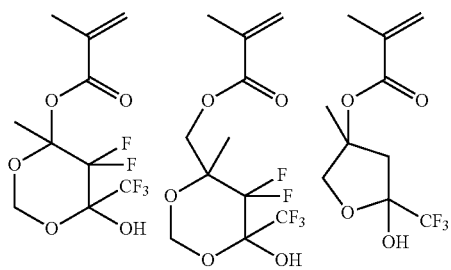
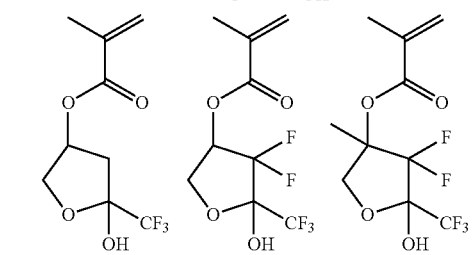
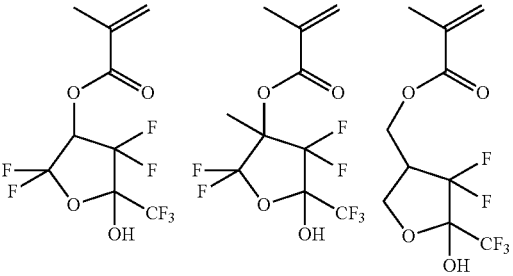
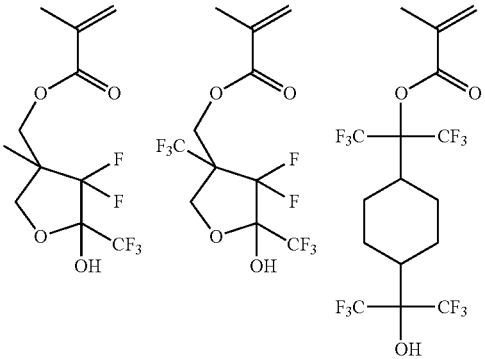

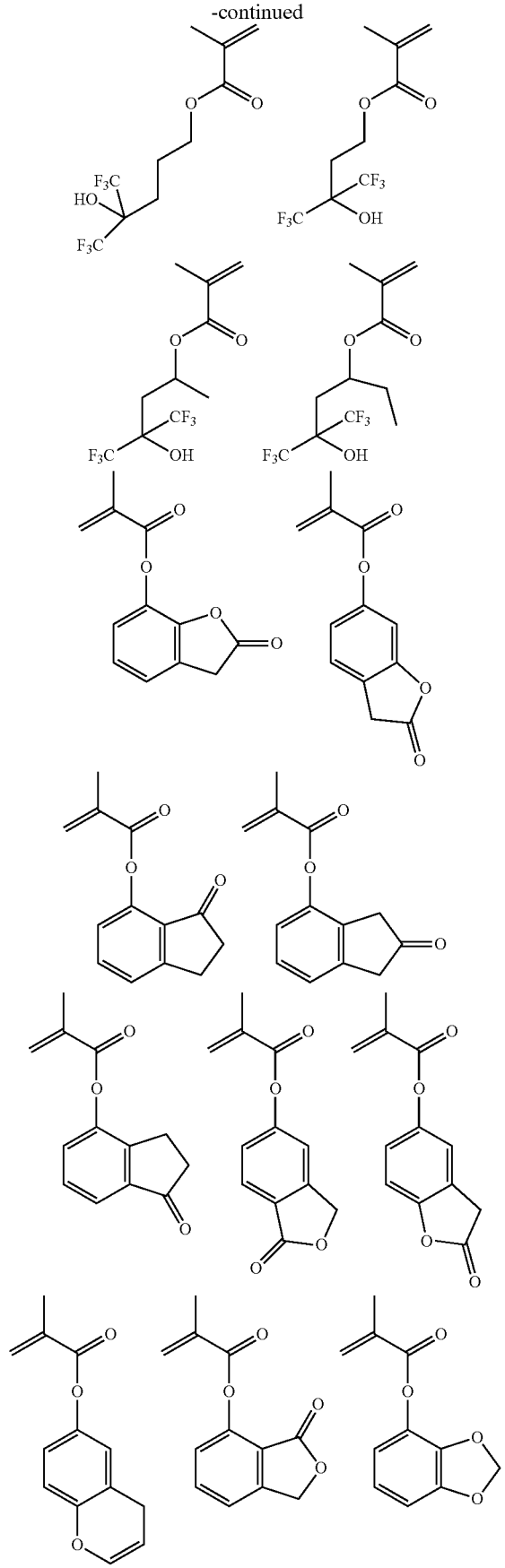
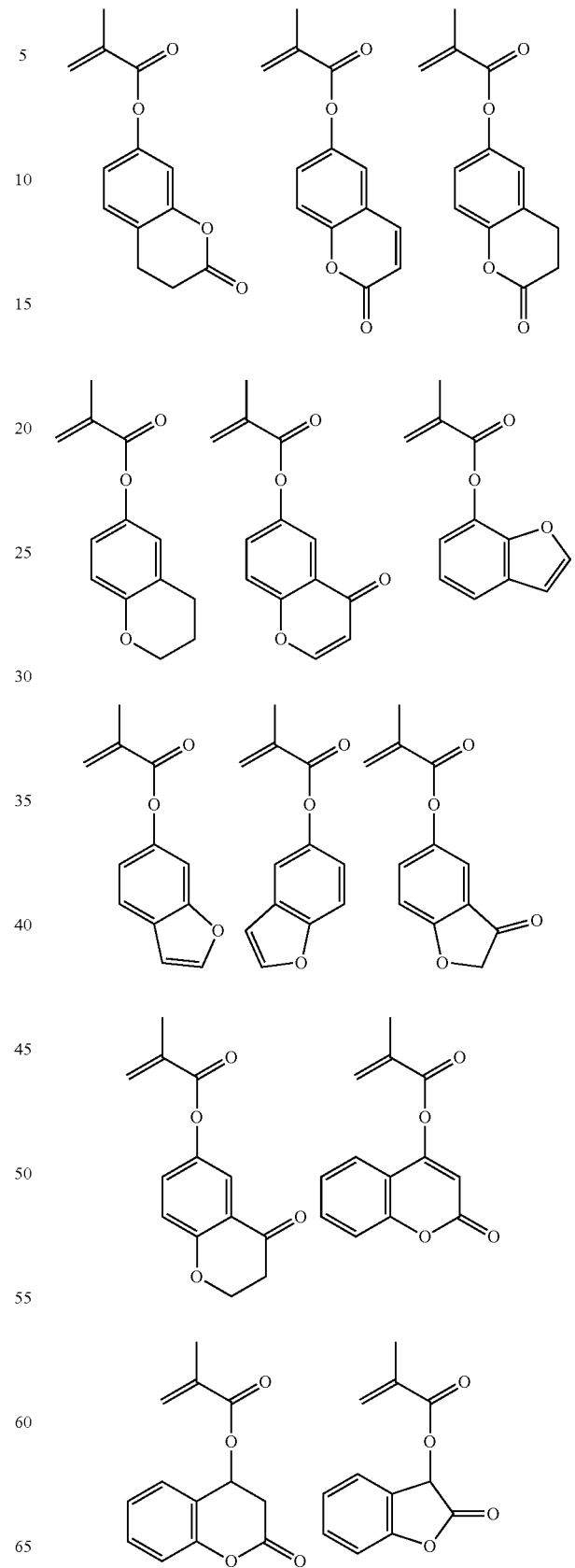

53
-continued
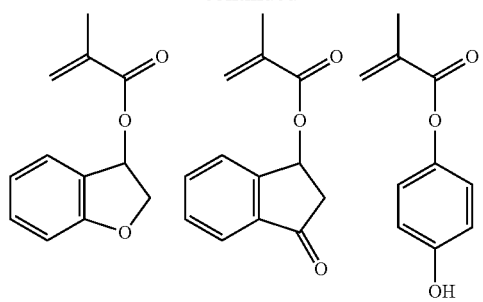
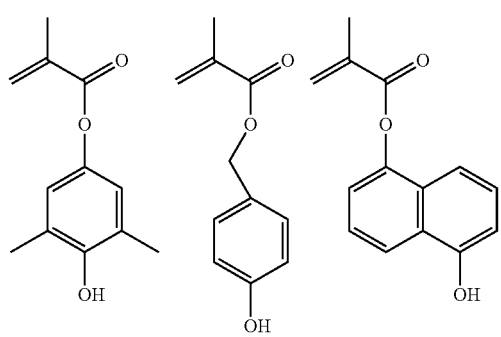
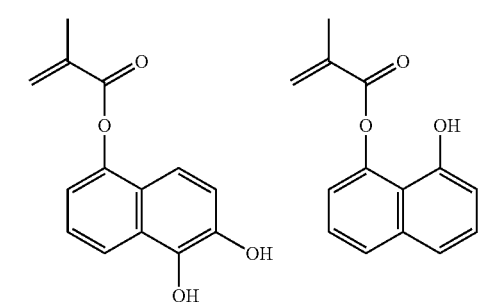
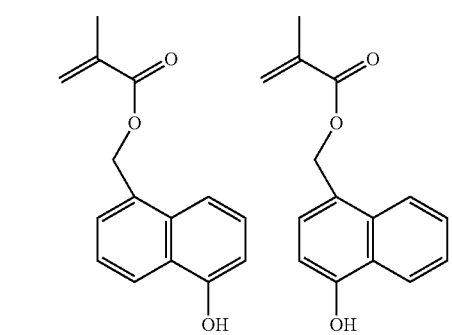
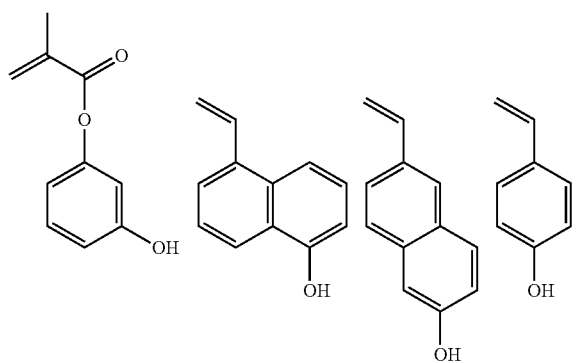
54
-continued
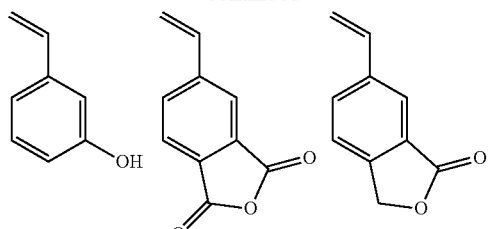
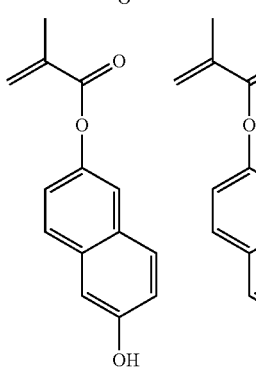
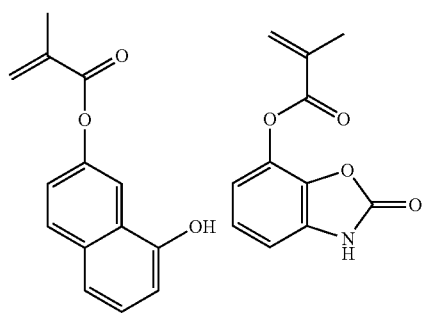
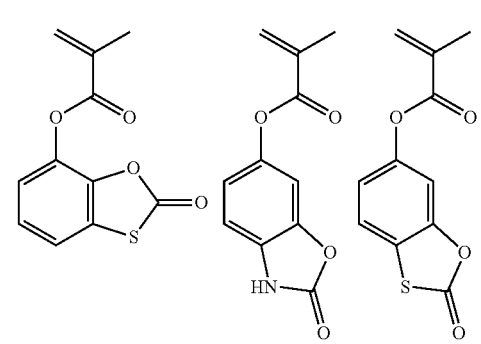
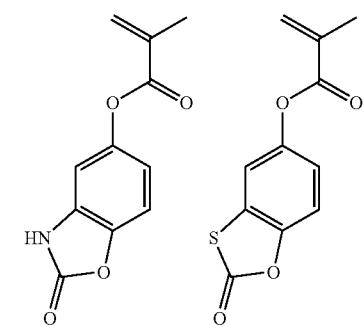

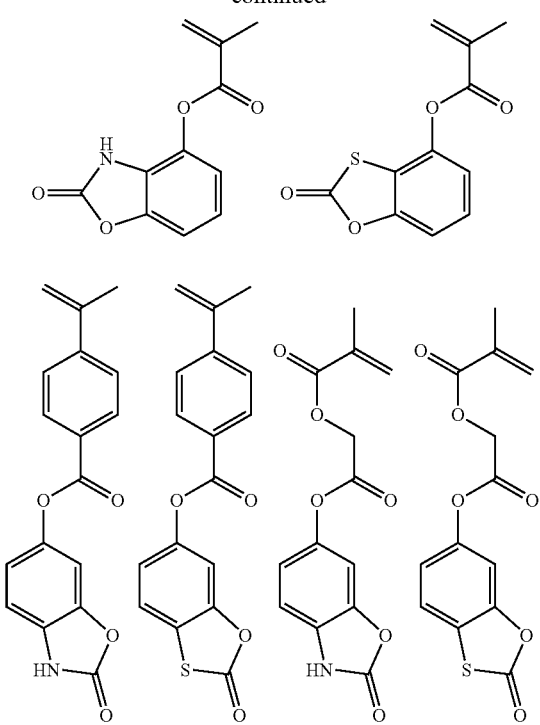
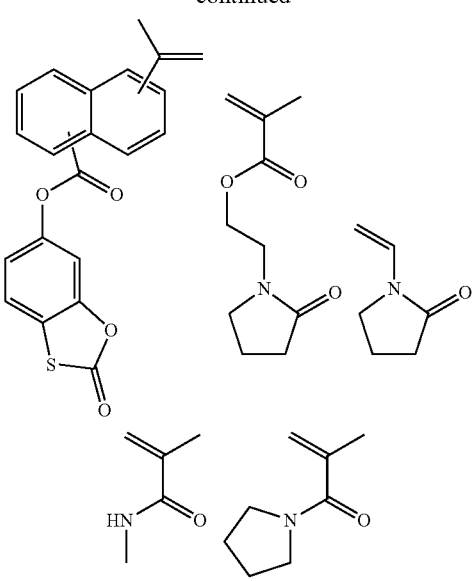

In the case that the monomer contains a hydroxyl group, the hydroxyl group may be substituted with acetal such as an ethoxyethoxy group, which easily deprotects by acid at polymerization, and then deprotected by weak acid and water after polymerization. Alternatively, the hydroxyl group may be substituted with an acetyl group, a formyl group, a pivaloyl group, or the like, and then subjected to alkaline hydrolysis after polymerization.

The polymer compound used as the base resin of the inventive resist composition may further contain (i.e., be copolymerized with), a repeating unit "d" selected from repeating units d1, d2, d3 shown by the following general formulae (3-1) to (3-3) having a sulfonium salt. Japanese Unexamined Patent Application Publication No. 2006-045311 proposes a sulfonium salt and an iodonium salt having a polymerizable olefin, capable of generating a specific sulfonic acid. Japanese Unexamined Patent Application Publication No. 2006-178317 proposes a sulfonium salt in which a sulfonic acid is directly bonded to a main chain.

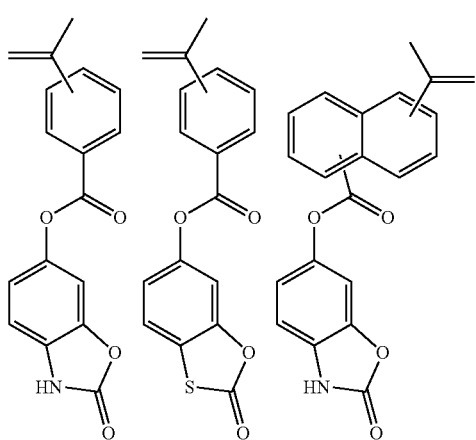

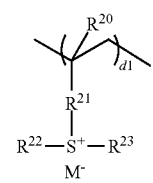

(3-1)

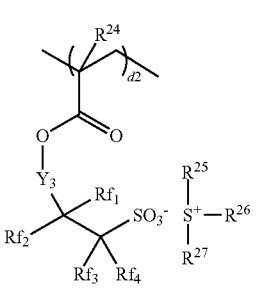

(3-2)

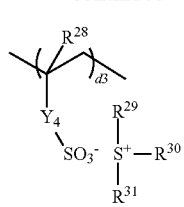

(3-3)

wherein $R^{20}$, $R^{24}$, and $R^{28}$ represent a hydrogen atom or a methyl group; $R^{21}$ represents a single bond, a phenylene group, —O—R—, or —C(=O)—V—R—, where V represents an oxygen atom or —NH—, and R represents a phenylene group or a linear, branched, or cyclic alkylene group or alkenylene group having 1 to 6 carbon atoms and optionally containing a carbonyl group, an ester group, an ether group, or a hydroxyl group; $Rf_1$ to $Rf_4$ represent a fluorine atom, a hydrogen atom, or a trifluoromethyl group, provided that one or more of $Rf_1$ to $Rf_4$ are a fluorine atom or a trifluoromethyl group; $R^{22}$, $R^{23}$, $R^{25}$, $R^{26}$, $R^{27}$, $R^{29}$, $R^{30}$, and $R^{3'}$ are the same or different and represent a linear, branched, or cyclic alkyl group having 1 to 12 carbon atoms, an aryl group having 6 to 12 carbon atoms, an aralkyl group having 7 to 20 carbon atoms, or a thiophenyl group optionally containing a carbonyl group, an ester group, or an ether group, in which two or more of $R^{25}$, $R^{26}$, and $R^{27}$ may be bonded to each other to form a ring together with the sulfur atom in the formula, and when the ring is formed, an oxygen atom may be contained therein; $Y_3$ represents a single bond or a linking group having 1 to 12 carbon atoms and optionally containing an ester group, an ether group, or a lactone ring; $Y_4$ represents a single bond, a methylene group, an ethylene group, a phenylene group, a fluorinated phenylene group, —O—$R^{32}$—, or —C(=O)—W—$R^{32}$—, where W represents an oxygen atom or —NH—, and $R^{32}$ represents a phenylene group or a linear, branched, or cyclic alkylene group or alkenylene group having 1 to 6 carbon atoms and optionally containing a carbonyl group, an ester group, an ether group, or a hydroxyl group; $M^-$ represents a non-nucleophilic counter ion; and d1, d2, and d3 represent a number satisfying $0 \le d1 \le 0.5$, $0 \le d2 \le 0.5$, $0 \le d3 \le 0.5$, and $0 < d1+d2+d3 \le 0.5$.

d1, d2, and d3 preferably satisfy $0 \le d1 \le 0.3$, $0 \le d2 \le 0.3$, and $0 \le d3 \le 0.3$. When the repeating unit "d" is contained, d1, d2, and d3 preferably satisfy $0 < d1+d2+d3 \le 0.3$ and $0.2 \le a+b1+b2+c1+d1+d2+d3 \le 1.0$.

When the polymer compound used as the base resin contains the repeating unit "d", an acid generator is bonded to the polymer main chain. This allows the acid diffusion to be reduced, thus preventing the reduction in resolution due to blur of images attributable to the acid diffusion. In addition, since the acid generator is uniformly dispersed, the edge roughness (LER, LWR) can be improved.

Examples of the non-nucleophilic counter ion $M^-$ include halide ions such as chloride ion and bromide ion; fluoroalkylsulfonates such as triflate, 1,1,1-trifluoroethanesulfonate, and nonafluorobutanesulfonate; arylsulfonates such as tosylate, benzenesulfonate, 4-fluorobenzenesulfonate, and 1,2,3,4,5-pentafluorobenzenesulfonate; alkylsulfonates such as mesylate and butanesulfonate; imide acids such as bis(trifluoromethylsulfonyl)imide, bis(perfluoroethylsulfonyl)imide, and bis(perfluorobutylsulfonyl)imide; and methide acids such as tris(trifluoromethylsulfonyl)methide and tris(perfluoroethylsulfonyl)methide.

As other examples of $M^-$, there may be mentioned sulfonates whose α-position is substituted with fluorine, shown by the following general formula (K-1), and sulfonates whose α-position is substituted with fluorine and β-position is substituted with trifluoromethyl, shown by the following general formula (K-2).

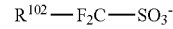

(K-1)

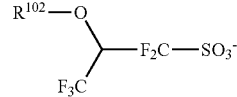

(K-2)

In the general formula (K-1), $R^{102}$ represents a hydrogen atom, or a linear, branched, or cyclic alkyl group having 1 to 20 carbon atoms, an alkenyl group having 2 to 20 carbon atoms, or an aryl group having 6 to 20 carbon atoms, in which these groups may contain an ether group, an ester group, a carbonyl group, a lactone ring, or a fluorine atom.

In the general formula (K-2), $R^{103}$ represents a hydrogen atom, or a linear, branched, or cyclic alkyl group, an acyl group having 1 to 30 carbon atoms, an alkenyl group having 2 to 20 carbon atoms, an aryl group or an aryloxy group having 6 to 20 carbon atoms, in which these groups may contain an ether group, an ester group, a carbonyl group, or a lactone ring.

Moreover, the polymer compound used as the base resin of the inventive resist composition may further contain (i.e., be copolymerized with) a repeating unit "e" such as indene e1, acenaphthylene e2, chromone e3, coumarin e4, and norbornadiene e5, shown by the following general formulae (4).

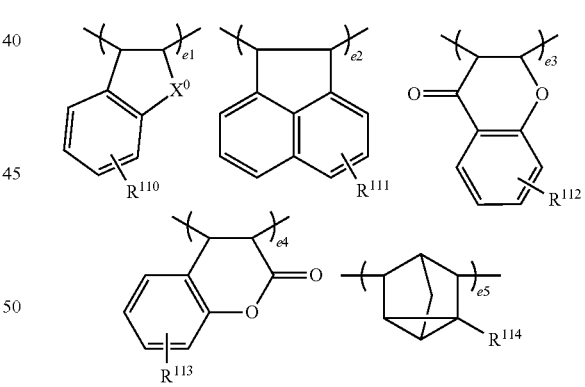

(4)

wherein $R^{110}$ to $R^{114}$ represent a hydrogen atom, an alkyl group having 1 to 30 carbon atoms, an alkyl group in which a part or all of hydrogen atoms is/are substituted with a halogen atom(s), or represent a hydroxyl group, an alkoxy group, an alkanoyl group, an alkoxycarbonyl group, an aryl group having 6 to 10 carbon atoms, a halogen atom, or a 1,1,1,3,3,3-hexafluoro-2-propanol group; $X^0$ represents a methylene group, an oxygen atom, or a sulfur atom; and e1, e2, e3, e4, and e5 represents a number satisfying $0 \le e1 \le 0.5$, $0 \le e2 \le 0.5$, $0 \le e3 \le 0.5$, $0 \le e4 \le 0.5$, $0 \le e5 \le 0.5$, and $0 < e1+e2+e3+e4+e5 \le 0.5$.

In the polymer compound used as the base resin of the inventive resist composition, examples of a repeating unit "f" that can be copolymerized other than the repeating units "a", "b", "c", "d", and "e" include repeating units derived from styrene, vinylnaphthalene, vinylanthracene, vinylpyrene, and methyleneindane. When the repeating unit "f" is contained, an intramolecular fraction f1 of the repeating unit "f" preferably satisfies $0<f1\leq0.5$.

One method for synthesizing the polymer compound that is a copolymer of these units is thermal polymerization of intended monomers corresponding to the repeating units "a" to "f" in the presence of a radical polymerization initiator in an organic solvent.

Examples of the organic solvent used in the polymerization include toluene, benzene, tetrahydrofuran, diethyl ether, dioxane, cyclohexane, cyclopentane, methyl ethyl ketone, and γ-butyrolactone. Examples of the polymerization initiator include 2,2'-azobisisobutyronitrile (AIBN), 2,2'-azobis (2,4-dimethylvaleronitrile), dimethyl 2,2-azobis(2-methylpropionate), benzoyl peroxide, and lauroyl peroxide. These materials can be polymerized by heating preferably at 50 to 80° C. The reaction time is preferably 2 to 100 hours, more preferably 5 to 20 hours.

In the case that a hydroxystyrene or a hydroxyvinylnaphthalene is copolymerized, an acetoxystyrene or an acetoxyvinylnaphthalene may be used in place of the hydroxystyrene or the hydroxyvinylnaphthalene for polymerization, followed by deprotection of the acetoxy group by alkaline hydrolysis to form the polyhydroxystyrene or the hydroxypolyvinylnaphthalene.

As a base for the alkaline hydrolysis, aqueous ammonia and triethylamine may be used. The reaction temperature is preferably −20 to 100° C., more preferably 0 to 60° C. The reaction time is preferably 0.2 to 100 hours, more preferably 0.5 to 20 hours.

The ratio of the repeating units "a" to "f" are as follows: $0\leq a1<1.0$, $0\leq a2<1.0$, $0<a1+a2<1.0$, $0\leq b1<1.0$, $0\leq b2<1.0$, $0.1<b1+b2<1.0$, preferably $0.1\leq b1+b2<1.0$, $0\leq c1\leq0.9$, $0\leq d1\leq0.5$, $0\leq d2\leq0.5$, $0\leq d3\leq0.5$, $0\leq d1+d2+d3\leq0.5$, $0\leq e\leq0.5$, $0\leq f1\leq0.5$, preferably $0\leq a1\leq0.9$, $0\leq a2\leq0.9$, $0.05\leq a1+a2\leq0.9$, $0\leq b1\leq0.7$, $0\leq b2\leq0.7$, $0.1\leq b1+b2\leq0.7$, $0<c1\leq0.8$, $0\leq d1\leq0.4$, $0\leq d2\leq0.4$, $0\leq d3\leq0.4$, $0\leq d1+d2+d3\leq0.4$, $0\leq e\leq0.4$, $0\leq f1\leq0.4$, more preferably $0\leq a1\leq0.8$, $0\leq a2\leq0.8$, $0.1\leq a1+a2\leq0.8$, $0\leq b1\leq0.6$, $0\leq b2\leq0.6$, $0.1\leq b1+b2\leq0.6$, $0<c1\leq0.7$, $0\leq d1\leq0.3$, $0\leq d2\leq0.3$, $0\leq d3\leq0.3$, $0\leq d1+d2+d3\leq0.3$, $0\leq e\leq0.3$, $0\leq f1\leq0.3$; and preferably $e=e1+e2+e3+e4+e5$ and $a1+a2+b1+b2+c1+d1+d2+d3+e1+e2+e3+e4+e5+f1=1$.

The polymer compound used as the base resin of the inventive resist composition has a weight average molecular weight of 1,000 to 500,000, preferably 2,000 to 30,000. When the weight average molecular weight is less than 1,000, the resist composition is inferior in heat resistance. When the weight average molecular weight is more than 500,000, the alkali-solubility is lowered, and a footing phenomenon is easily caused after patterning.

Herein, the weight average molecular weight is determined by gel permeation chromatography (GPC) using tetrahydrofuran (THF) as a solvent in terms of polystyrene.

The influence of the molecular weight and the molecular weight distribution of the polymer compound used as the base resin tends to increase with miniaturization of pattern rule. Thus, to obtain a resist composition useful for a fine pattern, the molecular weight distribution (Mw/Mn) of the multicomponent copolymer to be used is preferably 1.0 to 2.0, particularly in a narrow range of 1.0 to 1.5. When the molecular weight distribution of the multicomponent copolymer is in the above range, few polymers having low molecular weight or high molecular weight are contained, and thus there is no fear that foreign substances are found on the pattern, and the pattern profile degrades after exposure.

Moreover, two or more polymers having different composition ratios, molecular weight distributions, or molecular weights may be blended, or a polymer that is not copolymerized with the repeating unit "a" shown by the general formula (1) may be further blended.

The polymer compound containing the repeating units "a" and "b" is suitable as a base resin of a positive resist composition. The positive resist composition using this polymer compound as the base resin and appropriately combining with an organic solvent, an acid generator, a dissolution control agent, a basic compound, a surfactant, and other additives as needed is highly sensitive because catalytic reaction enhances the dissolution rate of the polymer compound into a developer at an exposed part. This resist composition can give a resist film having high dissolution contrast and high resolution, exposure margin, excellent process applicability, good pattern profile after exposure, and more excellent etching resistance. In particular, this composition can control the acid diffusion and thus reduce coarse-dense size difference. Thus, this composition is highly practical and very effective as a resist composition for VLSI. In particular, the chemically amplified positive resist composition containing an acid generator for utilizing acid catalyst reaction has high sensitivity and is excellent in various properties. Thus, such a composition is extremely useful.

Moreover, the addition of a dissolution control agent into the positive resist composition increases the difference in dissolution rate between an exposed part and an unexposed part, thus further improving the resolution.

Furthermore, the addition of a basic compound allows, for example, acid diffusion rate in the resist film to be reduced, thus improving the resolution. The addition of a surfactant allows coating property of the resist composition to be improved or controlled.

The inventive resist composition may contain an acid generator to utilize the composition as a chemically amplified positive resist composition. For example, a compound capable of generating an acid by responding to an active beam or a radiation beam (photo acid generator) may be contained. The photo acid generator component may be any compound capable of generating an acid by irradiation with a high energy beam. Preferable examples of the photo acid generator include sulfonium salt, iodonium salt, sulfonyldiazomethane, N-sulfonyloxyimide, and oxime-O-sulfonate type acid generators. These compounds may be used solely or in combination of two or more kinds, as described later in detail.

Illustrative examples of the acid generator are described in paragraphs (0122) to (0142) of Japanese Unexamined Patent Application Publication No. 2008-111103.

The inventive resist composition may contain one or more of an organic solvent, a basic compound, a dissolution control agent, a surfactant, and acetylene alcohol, as described above.

Illustrative examples of the organic solvent are described in paragraphs (0144) and (0145) of Japanese Unexamined Patent Application Publication No. 2008-111103; illustrative examples of the basic compound are described in paragraphs (0146) to (0164) of the same publication; illustrative examples of the surfactant are described in paragraphs (0165) and (0166) of the same publication; illustrative examples of the dissolution control agent are described in paragraphs (0155) to (0178) of Japanese Unexamined Patent Application Publication No. 2008-122932; and illustrative examples of the acetylene alcohols are described in paragraphs (0179) to (0182) of the same publication. In addition, a polymer-type quencher described in Japanese Unexamined Patent Application Publication No. 2008-239918 may also be added. By applying this quencher to the resist surface after coating, rectangularity of the resist after patterning can be improved. The polymer-type quencher also has effects to prevent film loss of the pattern and rounding of the pattern head when a top coat is formed thereon.

The formulation amount of the acid generator is preferably 0.01 to 100 parts by mass, particularly 0.1 to 80 parts by mass, based on 100 parts by mass of the base resin. The formulation amount of the organic solvent is preferably 50 to 10,000 parts by mass, particularly 100 to 5,000 parts by mass, based on 100 parts by mass of the base resin. The formulation amount of the dissolution control agent is preferably 0 to 50 parts by mass, particularly 0 to 40 parts by mass, the formulation amount of the basic compound is preferably 0 to 100 parts by mass, particularly 0.001 to 50 parts by mass, and the formulation amount of the surfactant is preferably 0 to 10 parts by mass, particularly 0.0001 to 5 parts by mass, based on 100 parts by mass of the base resin.

Furthermore, the present invention provides a patterning process including: applying the inventive resist composition on a substrate; performing exposure with a high energy beam after a heat treatment; and performing development with a developer.

When the inventive resist composition, for example, a chemically amplified resist composition that contains an organic solvent, a polymer compound having the repeating unit shown by the general formula (1) and the repeating unit shown by the general formula (2-1) and/or (2-2), an acid generator, and a basic compound is used for manufacturing various integrated circuits, known lithography techniques can be used, although it is not particularly limited.

For example, the inventive resist composition may be applied onto a substrate for manufacturing integrated circuit (e.g., Si, $SiO_2$, SiN, SiON, TiN, WSi, BPSG, SOG, and an organic antireflective film) or a substrate for manufacturing mask circuit (e.g., Cr, CrO, CrON, and MoSi) by an appropriate coating method including spin coating, roll coating, flow coating, dip coating, spray coating, and doctor coating, so as to give a film thickness of 0.1 to 2.0 μm. This composition is then pre-baked on a hot plate at 60 to 150° C. for 10 seconds to 30 minutes, preferably at 80 to 120° C. for 30 seconds to 20 minutes. A top coat may be formed on the resist film. The top coat is preferably soluble in an alkali developer, for the top coat of this type can be removed simultaneously with formation of the resist pattern during development. The top coat serves to reduce the amount of outgas from the resist film, acts as a filter for cutting out-of-band (OOB) light with a wavelength of 140 to 300 nm except for a wavelength of 13.5 nm emitted from an EUV laser, and prevents the resist getting enlarged head and film loss due to an environmental factor.

Then, the intended pattern is exposed to light directly or through a prescribed mask with a light source selected from high energy beams such as an ultraviolet ray, a far ultraviolet ray, an electron beam, an X-ray, an excimer laser beam, a γ-beam, a synchrotron radiation beam, and a vacuum ultraviolet ray (soft X-ray). In particular, the high energy beam is preferably an i-line beam, a KrF excimer laser beam, an ArF excimer laser beam, an electron beam, or a soft X-ray having a wavelength of 3 to 15 nm. The exposure is performed with an exposure dose of preferably about 1 to 200 $mJ/cm^2$, particularly preferably about 10 to 100 $mJ/cm^2$, or preferably about 0.1 to 100 $\mu C/cm^2$, particularly preferably about 0.5 to 50 $\mu C/cm^2$. Then, post exposure bake (PEB) is performed on a hot plate at 60 to 150° C. for 10 seconds to 30 minutes, preferably at 80 to 120° C. for 30 seconds to 20 minutes.

Further, the film is developed with an alkali aqueous developer such as tetramethylammonium hydroxide (TMAH), tetraethylammonium hydroxide (TEAH), tetrapropylammonium hydroxide (TPAH), and tetrabutylammonium hydroxide (TBAH) with a concentration of 0.1 to 5 mass %, preferably 2 to 10 mass %, for 3 seconds to 3 minutes, preferably 5 seconds to 2 minutes, by a common method such as a dip method, a puddle method, and a spray method. This development makes an exposed part dissolved and an unexposed part undissolved in the developer, thereby forming an intended positive pattern on the substrate. In addition, the inventive resist composition is suitable for fine patterning by a high energy beam, especially an electron beam, a vacuum ultraviolet ray (soft X-ray), an X-ray, a γ-ray, or a synchrotron radiation beam.

TEAH, TPAH, and TBAH having a longer alkyl chain are more effective than the generally and widely used TMAH aqueous solution to reduce swelling during development and prevent pattern collapse. Japanese Patent No. 3429592 discloses an example using the TBAH aqueous solution for development of a highly water-repellent polymer having no hydrophilic group, obtained by copolymerizing repeating units having an alicyclic structure such as adamantyl methacrylate with repeating units having an acid-labile group such as tert-butyl methacrylate.

As the developer using tetramethylammonium hydroxide (TMAH), a 2.38 mass % TMAH aqueous solution is most widely used. This concentration corresponds to 0.26 N. The TEAH, TPAH, and TBAH aqueous solutions are also preferably used with the same normality. The concentrations of TEAH, TPAH, and TBAH corresponding to 0.26 N are 3.84 mass %, 5.31 mass %, and 6.78 mass %, respectively.

In a 32-nm or less pattern resolved with EB or EUV, phenomena such as line wiggling, connection between lines, and fall of the connected line occur. These phenomena are supposed to be caused by connection between lines swollen during development. The swollen lines contain the developer and thus are so soft like a sponge that they fall down easily by a stress during rinsing. The developer having a longer alkyl chain is difficult to swell lines, thus preventing pattern collapse.

In the inventive patterning process, a negative pattern can also be obtained by organic solvent development. The developer used in this development may be one or more of 2-octanone, 2-nonanone, 2-heptanone, 3-heptanone, 4-heptanone, 2-hexanone, 3-hexanone, diisobutylketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

After completion of development, rinsing is preferably performed. A rinsing solution is preferably a solvent that is miscible with the developer and does not dissolve the resist film. Preferable examples of the solvent include alcohols having 3 to 10 carbon atoms, ether compounds having 8 to 12 carbon atoms, and alkane, alkene, alkyne, or aromatic solvents having 6 to 12 carbon atoms.

Illustrative examples of the alkane having 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Illustrative examples of the alkene having 6 to 12 carbon atoms include hexene, heptene, octene, cyclohexene, methylcyclohexene, dimethylcyclohexene, cycloheptene, and cyclooctene. Illustrative examples of the alkyne having 6 to 12 carbon atoms include hexyne, heptyne, and octyne. Illustrative examples of the alcohol having 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol.

Illustrative examples of the ether compound having 8 to 12 carbon atoms include one or more solvents selected from di-n-butyl ether, diisobutyl ether, di-sec-butyl ether, di-n-pentyl ether, diisopentyl ether, di-sec-pentyl ether, di-tert-amyl ether, and di-n-hexyl ether.

In addition to the foregoing solvents, aromatic solvents including toluene, xylene, ethylbenzene, isopropylbenzene, tert-butylbenzene, and mesitylene may be used.

As mentioned above, the inventive resist composition can improve, particularly, the decomposition efficiency of an acid generator, and thus can achieve high sensitivity, high effect of controlling the acid diffusion, high resolution, low dimensional variation of a pattern to be obtained, excellent process adaptability, and good pattern profile after exposure. Thus, the composition having these excellent characteristics is extremely practical, and can be used as a resist composition, particularly a chemically amplified positive resist composition, especially useful for a fine patterning material for manufacturing VLSI or for photomask by EB drawing, or a patterning material for EB or EUV exposure, etc. In addition, the inventive resist composition, particularly a chemically amplified positive resist composition, can be used, for example, not only for lithography in semiconductor circuit formation but also in formation of a mask circuit pattern, a micromachine, or a thin-film magnetic head circuit.

EXAMPLES

Hereinafter, the present invention will be specifically described with reference to Synthesis examples, Comparative synthesis examples, Examples, and Comparative examples, but the present invention is not limited to the following Examples. The weight average molecular weight (Mw) is determined by gel permeation chromatography (GPC) using tetrahydrofuran (THF) as a solvent in terms of polystyrene.

[Monomer Synthesis Example 1] Synthesis of Monomer 1

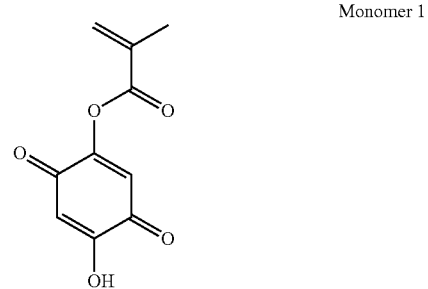

Monomer 1

110 g of 2,5-dihydroxy-1,4-benzoquinone and 3.7 g of 4-(dimethylamino)pyridine were mixed with 500 g of tetrahydrofuran, and 92.4 g of methacrylic anhydride was added dropwise under ice-cooling. After the solution was stirred for 5 hours at room temperature, water was added to terminate the reaction. After a usual aqueous post-treatment, the solution was purified by a silica gel column chromatography to obtain 120 g of Monomer 1 (yield: 73%).

[Monomer Synthesis Example 2] Synthesis of Monomer 2

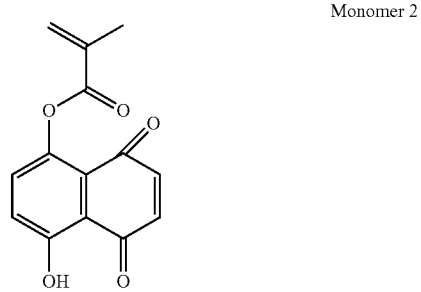 [SMILES: C=C(C)C(=O)Oc1ccc(O)c2c1C(=O)C=CC2=O]

Monomer 2

160 g of 5,8-dihydroxy-1,4-naphthoquinone and 3.7 g of 4-(dimethylamino)pyridine were mixed with 500 g of tetrahydrofuran, and 92.4 g of methacrylic anhydride was added dropwise under ice-cooling. After the solution was stirred for 5 hours at room temperature, water was added to terminate the reaction. After a usual aqueous post-treatment, the solution was purified by a silica gel column chromatography to obtain 135 g of Monomer 2 (yield: 62%).

PAG monomers 1 to 3 used in the following Synthesis examples are as follows.

PAG monomer 1

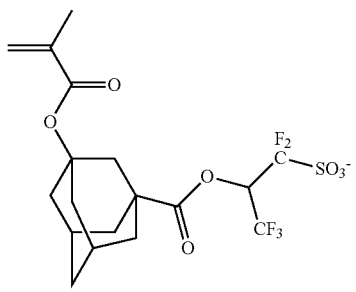

PAG monomer 2

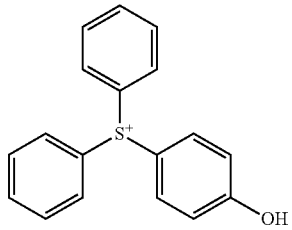

PAG monomer 3

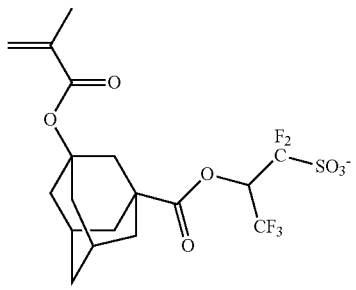

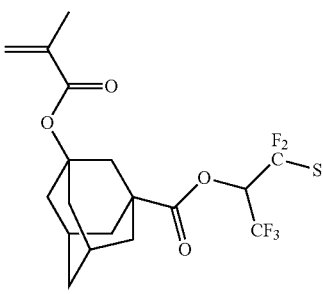

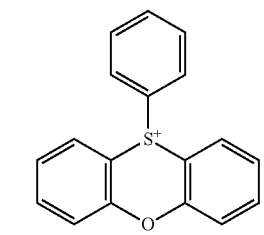

PAG monomer 1: diphenyl-4-hydroxyphenylsulfonium 1,1,3,3,3-pentafluoro-2-(3-methacryloyloxy-adamantane-1-carbonyloxy)-propane-1-sulfonate PAG monomer 2: 5-phenyldibenzothiophenium 1,1,3,3,3-pentafluoro-2-(3-methacryloyloxy-adamantane-1-carbonyloxy)-propane-1-sulfonate PAG monomer 3: 10-phenylphenoxathiinium 1,1,3,3,3-pentafluoro-2-(3-methacryloyloxy-adamantane-1-carbonyloxy)-propane-1-sulfonate

[Synthesis Example 1] Synthesis of Polymer 1

A 2 L flask was charged with 8.2 g of ethylcyclopentyl methacrylate, 6.2 g of Monomer 1, 9.0 g of 3-oxo-2,7-dioxatricyclo[4.2.1.0$^{4,8}$]nonan-9-yl methacrylate, and 40 g of tetrahydrofuran as a solvent. This reaction vessel was cooled to −70° C. in a nitrogen atmosphere, then degassed under reduced pressure and blown with nitrogen three times. After heating to room temperature, 1.2 g of azobisisobutyronitrile (AIBN) was added thereto as a radical polymerization initiator. The temperature was then increased to 60° C., and the reaction was performed for 15 hours. The reaction solution was precipitated in 1 L of isopropyl alcohol. A white solid thus obtained was filtered and dried under reduced pressure at 60° C. to obtain a white polymer.

The obtained polymer was analyzed by $^{13}$C-NMR, $^1$H-NMR, and GPC, and the following results were obtained.
Weight average molecular weight (Mw)=7,200
Molecular weight distribution (Mw/Mn)=1.92
This polymer compound was named Polymer 1.

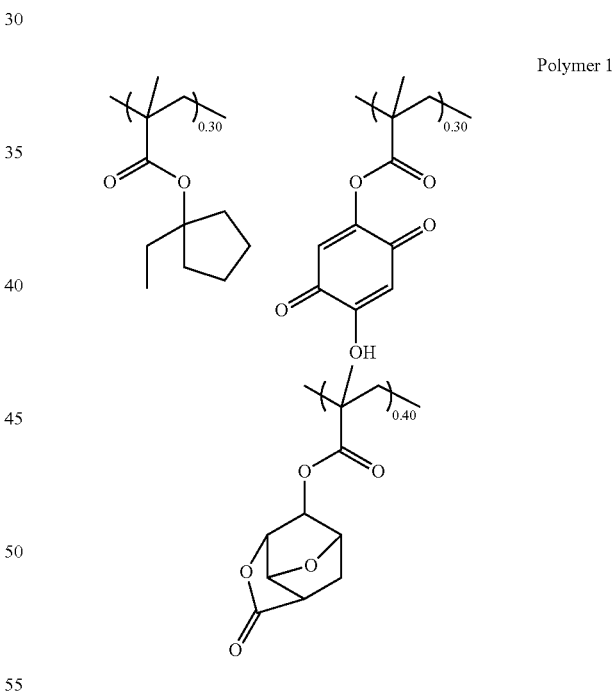

Polymer 1

[Synthesis Example 2] Synthesis of Polymer 2

A 2 L flask was charged with 5.2 g of 1-(adamantan-1-yl)-1-methylehtyl methacrylate, 2.9 g of tert-amyloxystyrene, 6.2 g of Monomer 1, 4.5 g of 3-oxo-2,7-dioxatricyclo [4.2.1.0$^{4,8}$]nonan-9-yl methacrylate, 11.0 g of PAG monomer 2, and 40 g of tetrahydrofuran as a solvent. This reaction vessel was cooled to −70° C. in a nitrogen atmosphere, then degassed under reduced pressure and blown with nitrogen three times. After heating to room temperature, 1.2 g of azobisisobutyronitrile (AIBN) was added thereto as a radical polymerization initiator. The temperature was then increased to 60° C., and the reaction was performed for 15 hours. The reaction solution was precipitated in 1 L of isopropyl alcohol. A white solid thus obtained was filtered and dried under reduced pressure at 60° C. to obtain a white polymer.

The obtained polymer was analyzed by $^{13}$C-NMR, $^1$H-NMR, and GPC, and the following results were obtained.

Weight average molecular weight (Mw)=9,900
Molecular weight distribution (Mw/Mn)=1.78

This polymer compound was named Polymer 2.

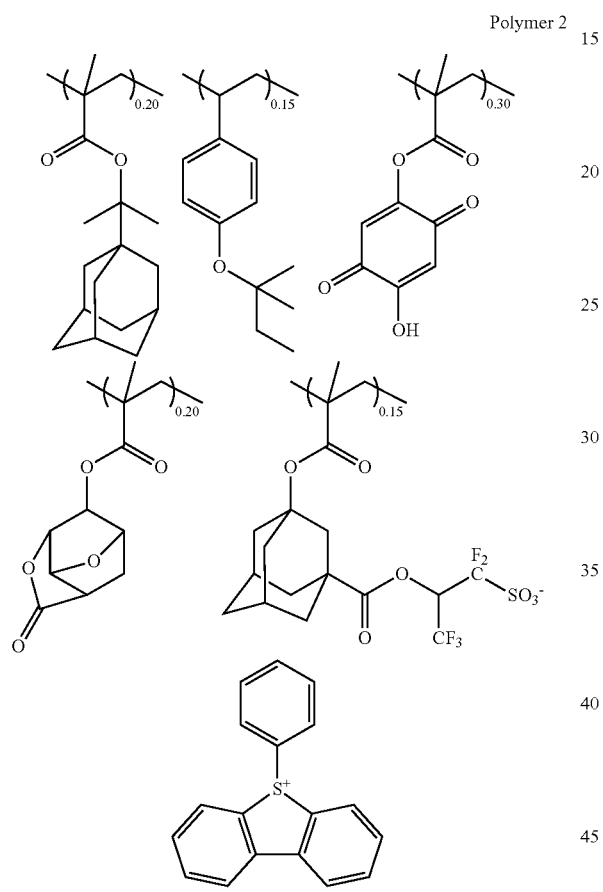

Polymer 2

[Synthesis Example 3] Synthesis of Polymer 3

A 2 L flask was charged with 5.2 g of 1-(cyclopropylen-1-yl)-1-methylehtyl methacrylate, 3.5 g of 3-fluoro-4-(methylcyclohexyloxy)styrene, 4.1 g of Monomer 1, 4.3 g of 2-oxooxolan-3-yl methacrylate, 15.0 g of PAG monomer 3, and 40 g of tetrahydrofuran as a solvent. This reaction vessel was cooled to −70° C. in a nitrogen atmosphere, then degassed under reduced pressure and blown with nitrogen three times. After heating to room temperature, 1.2 g of azobisisobutyronitrile (AIBN) was added thereto as a radical polymerization initiator. The temperature was then increased to 60° C., and the reaction was performed for 15 hours. The reaction solution was precipitated in 1 L of isopropyl alcohol. A white solid thus obtained was filtered and dried under reduced pressure at 60° C. to obtain a white polymer.

The obtained polymer was analyzed by $^{13}$C-NMR, $^1$H-NMR, and GPC, and the following results were obtained.

Weight average molecular weight (Mw)=8,100
Molecular weight distribution (Mw/Mn)=1.89

This polymer compound was named Polymer 3.

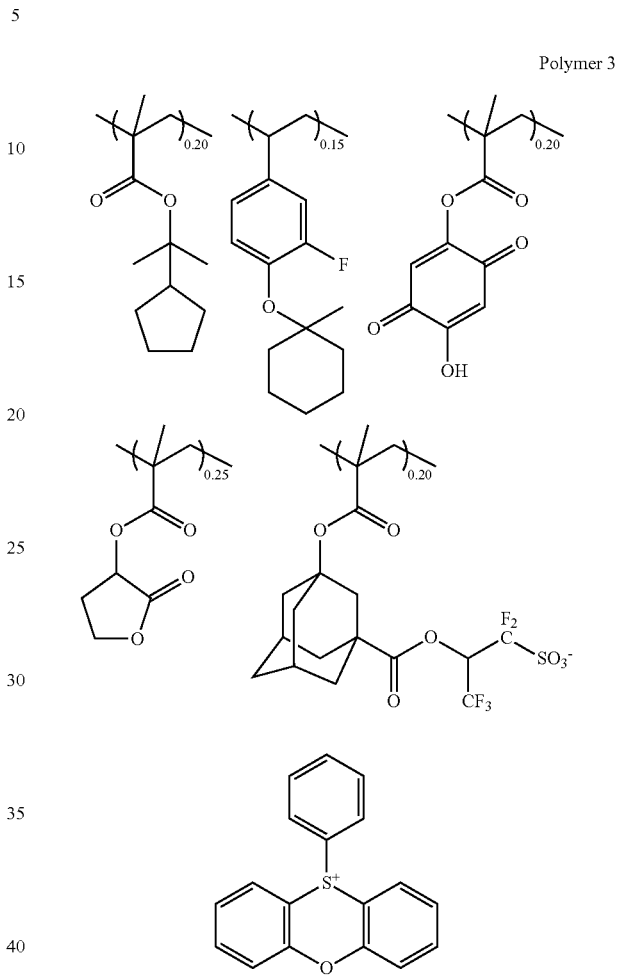

Polymer 3

[Synthesis Example 4] Synthesis of Polymer 4

A 2 L flask was charged with 8.2 g of 3-ethyl-3-exotetracyclo[4.4.0.1$^{2,5}$.1$^{7,10}$]dodecanyl methacrylate, 6.2 g of Monomer 1, 5.6 g of 3-oxo-2,7-dioxatricyclo[4.2.1.0$^{4,8}$]nonan-9-yl methacrylate, 11.5 g of PAG monomer 1, and 40 g of tetrahydrofuran as a solvent. This reaction vessel was cooled to −70° C. in a nitrogen atmosphere, then degassed under reduced pressure and blown with nitrogen three times. After heating to room temperature, 1.2 g of azobisisobutyronitrile (AIBN) was added thereto as a radical polymerization initiator. The temperature was then increased to 60° C., and the reaction was performed for 15 hours. The reaction solution was precipitated in 1 L of isopropyl alcohol. A white solid thus obtained was filtered and dried under reduced pressure at 60° C. to obtain a white polymer.

The obtained polymer was analyzed by $^{13}$C-NMR, $^1$H-NMR, and GPC, and the following results were obtained.

Weight average molecular weight (Mw)=7,900
Molecular weight distribution (Mw/Mn)=1.75

This polymer compound was named Polymer 4.

This polymer compound was named Polymer 5.

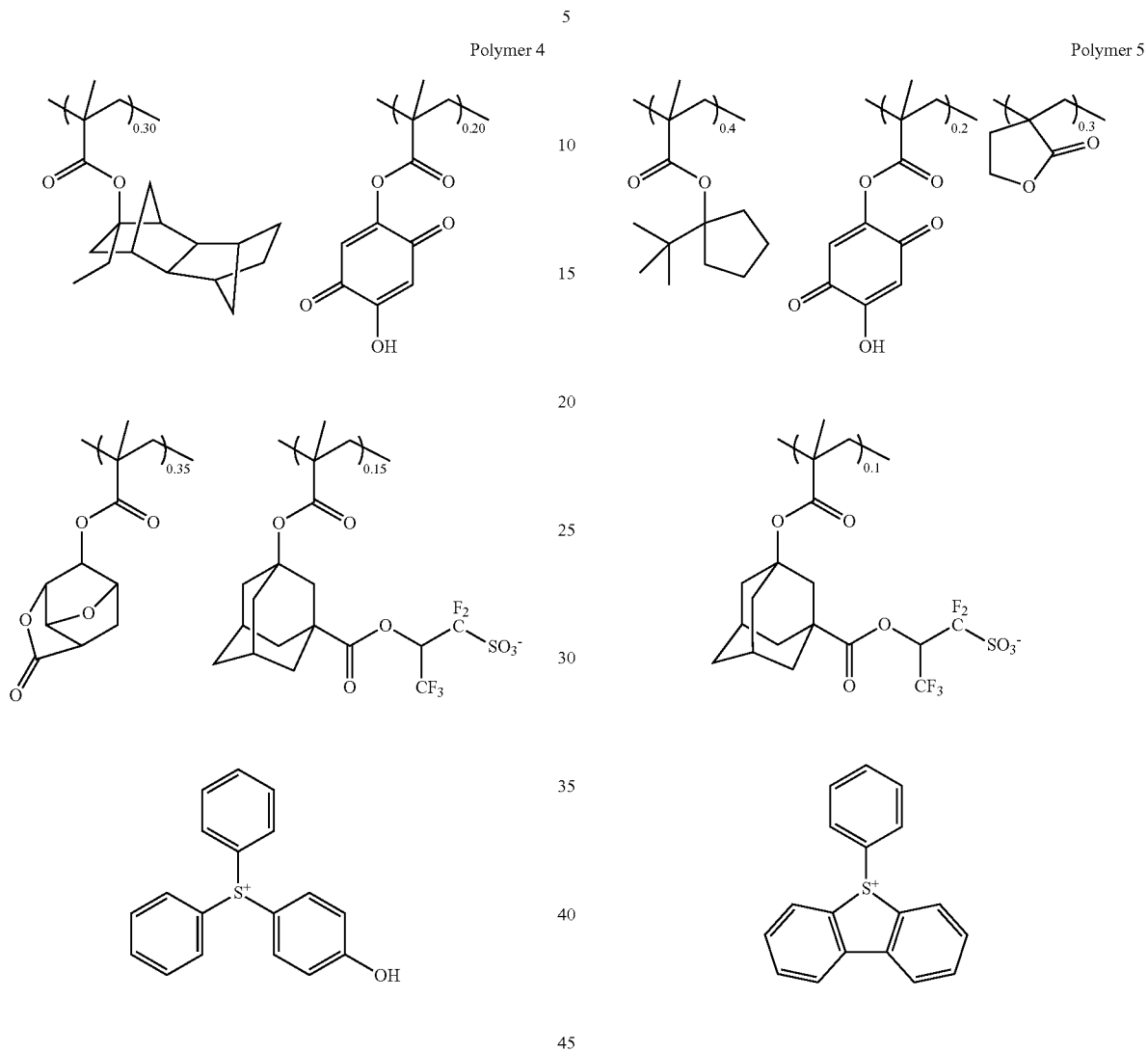

[Synthesis Example 5] Synthesis of Polymer 5

A 2 L flask was charged with 8.4 g of 1-tert-butyl-1-cyclopentyl methacrylate, 6.2 g of Monomer 1, 2.9 g of α-methylene-γ-butyrolactone, 11.0 g of PAG monomer 2, and 40 g of tetrahydrofuran as a solvent. This reaction vessel was cooled to −70° C. in a nitrogen atmosphere, then degassed under reduced pressure and blown with nitrogen three times. After heating to room temperature, 1.2 g of azobisisobutyronitrile (AIBN) was added thereto as a radical polymerization initiator. The temperature was then increased to 60° C., and the reaction was performed for 15 hours. The reaction solution was precipitated in 1 L of isopropyl alcohol. A white solid thus obtained was filtered and dried under reduced pressure at 60° C. to obtain a white polymer.

The obtained polymer was analyzed by $^{13}$C-NMR, $^1$H-NMR, and GPC, and the following results were obtained.
Weight average molecular weight (Mw)=7,100
Molecular weight distribution (Mw/Mn)=1.61

[Synthesis Example 6] Synthesis of Polymer 6

A 2 L flask was charged with 8.2 g of ethylcyclopentyl methacrylate, 7.7 g of Monomer 2, 9.0 g of 3-oxo-2,7-dioxatricyclo[4.2.1.0$^{4,8}$]nonan-9-yl methacrylate, and 40 g of tetrahydrofuran as a solvent. This reaction vessel was cooled to −70° C. in a nitrogen atmosphere, then degassed under reduced pressure and blown with nitrogen three times. After heating to room temperature, 1.2 g of azobisisobutyronitrile (AIBN) was added thereto as a radical polymerization initiator. The temperature was then increased to 60° C., and the reaction was performed for 15 hours. The reaction solution was precipitated in 1 L of isopropyl alcohol. A white solid thus obtained was filtered and dried under reduced pressure at 60° C. to obtain a white polymer.

The obtained polymer was analyzed by $^{13}$C-NMR, $^1$H-NMR, and GPC, and the following results were obtained.
Weight average molecular weight (Mw)=7,600
Molecular weight distribution (Mw/Mn)=1.88

This polymer compound was named Polymer 6.

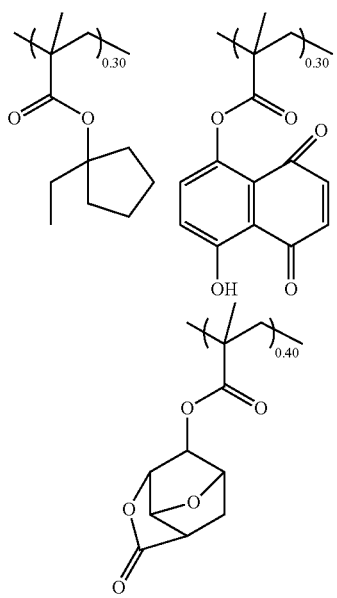

Polymer 6

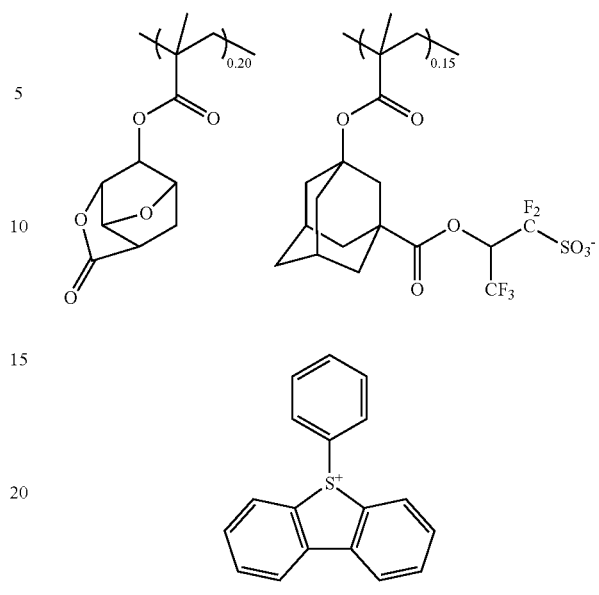

[Synthesis Example 8] Synthesis of Polymer 8

A 2 L flask was charged with 5.2 g of 1-(cyclopropylen-1-yl)-1-methylehtyl methacrylate, 3.5 g of 3-fluoro-4-(methylcyclohexyloxy)styrene, 5.2 g of Monomer 2, 4.3 g of 2-oxooxolan-3-yl methacrylate, 15.0 g of PAG monomer 3, and 40 g of tetrahydrofuran as a solvent. This reaction vessel was cooled to −70° C. in a nitrogen atmosphere, then degassed under reduced pressure and blown with nitrogen three times. After heating to room temperature, 1.2 g of azobisisobutyronitrile (AIBN) was added thereto as a radical polymerization initiator. The temperature was then increased to 60° C., and the reaction was performed for 15 hours. The reaction solution was precipitated in 1 L of isopropyl alcohol. A white solid thus obtained was filtered and dried under reduced pressure at 60° C. to obtain a white polymer.

The obtained polymer was analyzed by $^{13}$C-NMR, $^1$H-NMR, and GPC, and the following results were obtained.

Weight average molecular weight (Mw)=7,800

Molecular weight distribution (Mw/Mn)=1.74

This polymer compound was named Polymer 8.

[Synthesis Example 7] Synthesis of Polymer 7

A 2 L flask was charged with 5.2 g of 1-(adamantan-1-yl)-1-methylehtyl methacrylate, 2.9 g of tert-amyloxystyrene, 7.7 g of Monomer 2, 4.5 g of 3-oxo-2,7-dioxatricyclo[4.2.1.0$^{4,8}$]nonan-9-yl methacrylate, 11.0 g of PAG monomer 2, and 40 g of tetrahydrofuran as a solvent. This reaction vessel was cooled to −70° C. in a nitrogen atmosphere, then degassed under reduced pressure and blown with nitrogen three times. After heating to room temperature, 1.2 g of azobisisobutyronitrile (AIBN) was added thereto as a radical polymerization initiator. The temperature was then increased to 60° C., and the reaction was performed for 15 hours. The reaction solution was precipitated in 1 L of isopropyl alcohol. A white solid thus obtained was filtered and dried under reduced pressure at 60° C. to obtain a white polymer.

The obtained polymer was analyzed by $^{13}$C-NMR, $^1$H-NMR, and GPC, and the following results were obtained.

Weight average molecular weight (Mw)=8,600

Molecular weight distribution (Mw/Mn)=1.71

This polymer compound was named Polymer 7.

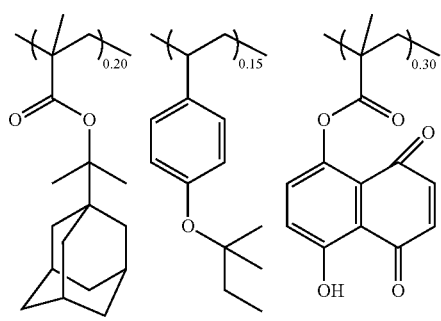

Polymer 7

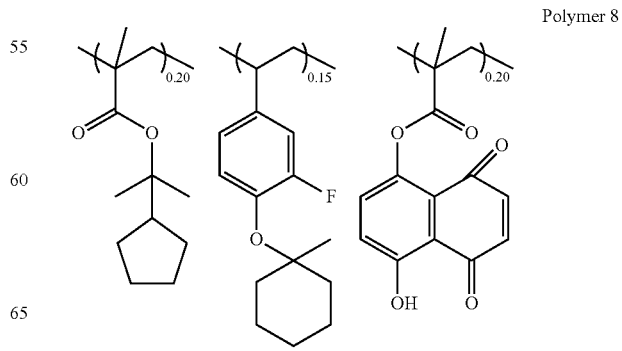

Polymer 8

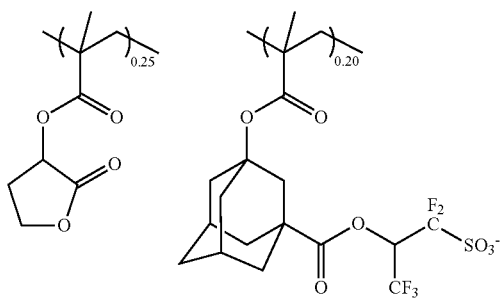

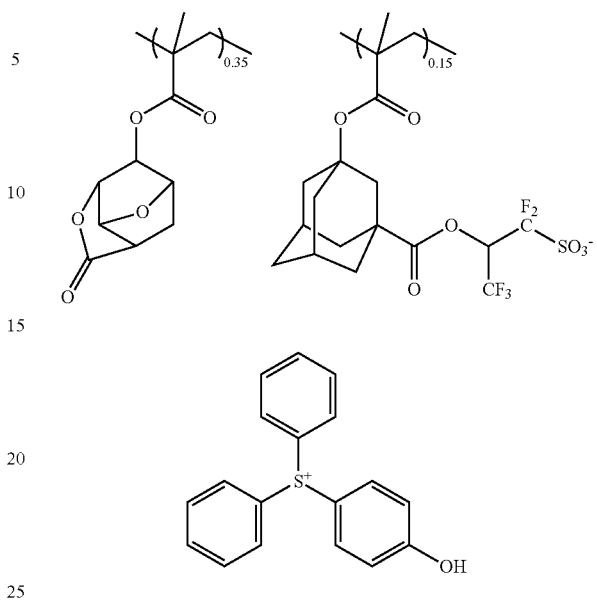

[Synthesis Example 9] Synthesis of Polymer 9

A 2 L flask was charged with 8.2 g of 3-ethyl-3-exotetracyclo[4.4.0.1$^{2,5}$.1$^{7,10}$]dodecanyl methacrylate, 5.2 g of Monomer 2, 5.6 g of 3-oxo-2,7-dioxatricyclo[4.2.1.0$^{4,8}$]nonan-9-yl methacrylate, 11.5 g of PAG monomer 1, and 40 g of tetrahydrofuran as a solvent. This reaction vessel was cooled to −70° C. in a nitrogen atmosphere, then degassed under reduced pressure and blown with nitrogen three times. After heating to room temperature, 1.2 g of azobisisobutyronitrile (AIBN) was added thereto as a radical polymerization initiator. The temperature was then increased to 60° C., and the reaction was performed for 15 hours. The reaction solution was precipitated in 1 L of isopropyl alcohol. A white solid thus obtained was filtered and dried under reduced pressure at 60° C. to obtain a white polymer.

The obtained polymer was analyzed by $^{13}$C-NMR, $^1$H-NMR, and GPC, and the following results were obtained.

Weight average molecular weight (Mw)=7,100

Molecular weight distribution (Mw/Mn)=1.74

This polymer compound was named Polymer 9.

[Synthesis Example 10] Synthesis of Polymer 10

A 2 L flask was charged with 8.4 g of 1-tert-butyl-1-cyclopentyl methacrylate, 5.2 g of Monomer 2, 2.9 g of α-methylene-γ-butyrolactone, 11.0 g of PAG monomer 2, and 40 g of tetrahydrofuran as a solvent. This reaction vessel was cooled to −70° C. in a nitrogen atmosphere, then degassed under reduced pressure and blown with nitrogen three times. After heating to room temperature, 1.2 g of azobisisobutyronitrile (AIBN) was added thereto as a radical polymerization initiator. The temperature was then increased to 60° C., and the reaction was performed for 15 hours. The reaction solution was precipitated in 1 L of isopropyl alcohol. A white solid thus obtained was filtered and dried under reduced pressure at 60° C. to obtain a white polymer.

The obtained polymer was analyzed by $^{13}$C-NMR, $^1$H-NMR, and GPC, and the following results were obtained.

Weight average molecular weight (Mw)=7,400

Molecular weight distribution (Mw/Mn)=1.59

This polymer compound was named Polymer 10.

Polymer 9

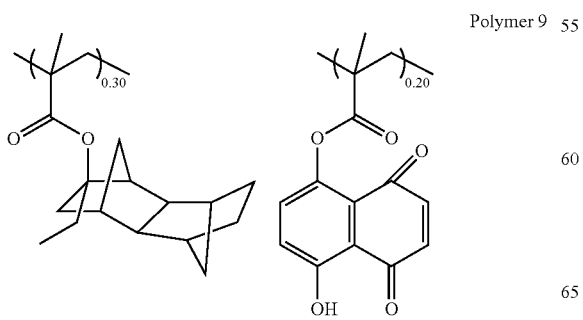

Polymer 10

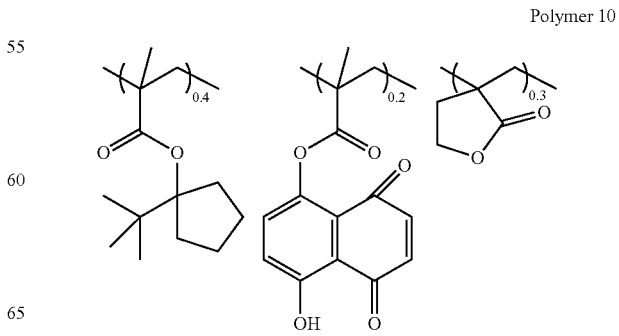

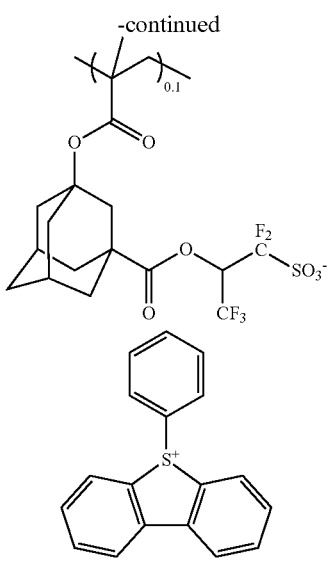

[Comparative Synthesis Example 1] Synthesis of Comparative Polymer 1

The following polymer was synthesized in the same manner as in Synthesis example 1 except that 6.2 g of Monomer 1 was changed to 5.3 g of 4-hydroxyphenyl methacrylate.

Weight average molecular weight (Mw)=9,900

Molecular weight distribution (Mw/Mn)=1.99

This polymer compound was named Comparative polymer 1.

Comparative polymer 1

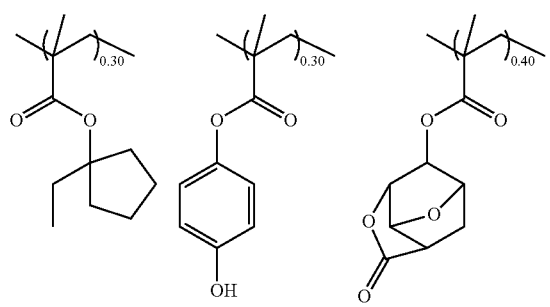

[Comparative Synthesis Example 2] Synthesis of Comparative Polymer 2

The following polymer was synthesized in the same manner as in Synthesis example 4 except that 6.2 g of Monomer 1 was changed to 5.3 g of 4-hydroxyphenyl methacrylate.

Weight average molecular weight (Mw)=7,300

Molecular weight distribution (Mw/Mn)=1.88

This polymer compound was named Comparative polymer 2.

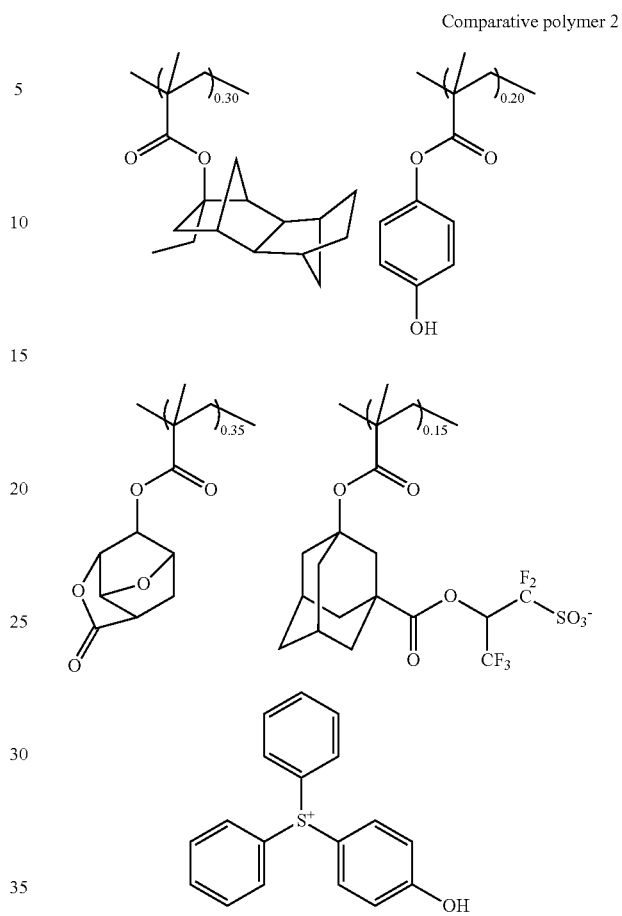

[Comparative Synthesis Example 3] Synthesis of Comparative Polymer 3

The following polymer was synthesized in the same manner as in Synthesis example 9 except that 5.2 g of Monomer 2 was changed to 4.6 g of 4-hydroxynaphthyl-1-yl methacrylate.

Weight average molecular weight (Mw)=7,600

Molecular weight distribution (Mw/Mn)=1.83

This polymer compound was named Comparative polymer 3.

Comparative polymer 3

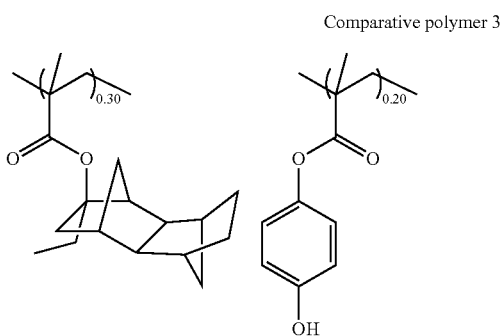

-continued

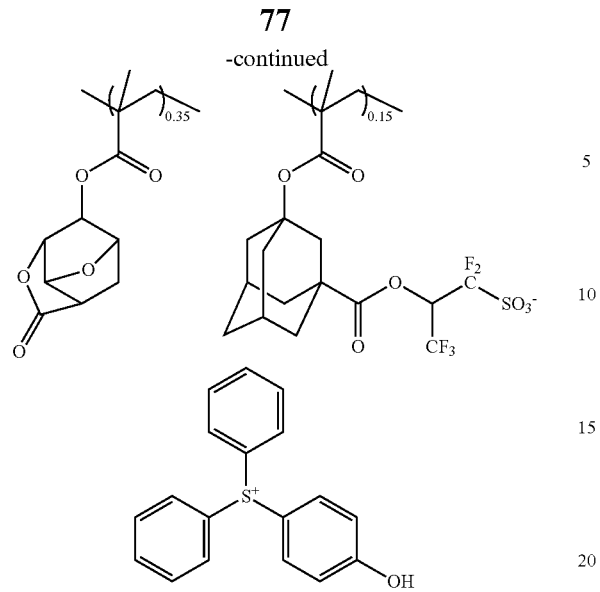

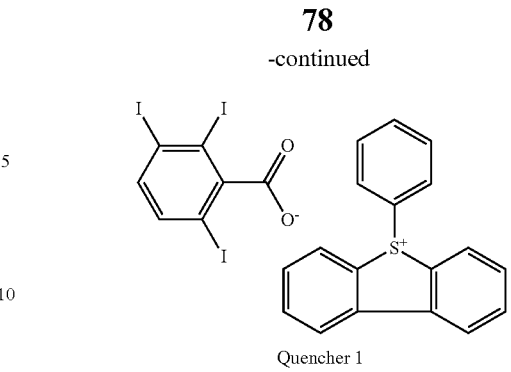

Quencher 1

PAG 2

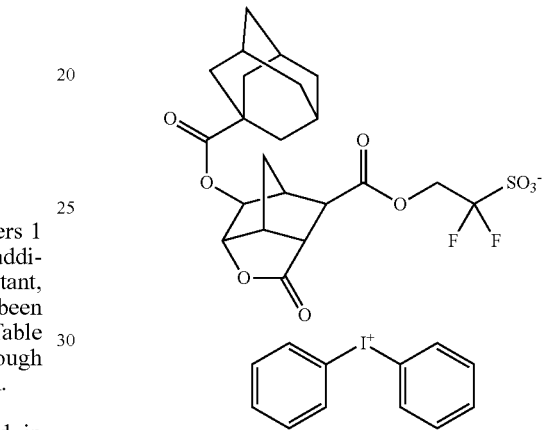

Examples and Comparative Examples

The polymer compounds synthesized above (Polymers 1 to 10 and Comparative polymers 1 to 3), respective additives, and a solvent in which 100 ppm of a surfactant, FC-4430 available from Sumitomo 3M, Ltd., has been dissolved, were mixed with the composition shown in Table 1 to form solutions, and each solution was filtered through a 0.2-µm filter to prepare a positive resist composition.

The components in Table 1 are as follows.
Polymers 1 to 10: the polymer compounds obtained in Synthesis examples 1 to 10
Comparative polymers 1 to 3: the polymer compounds obtained in Comparative Synthesis examples 1 to 3
Organic solvents: PGMEA (propylene glycol monomethyl ether acetate)
PGME (propylene glycol monomethyl ether)
CyH (cyclohexanone)
DAA (diacetone alcohol)
Acid generators: PAG1, PAG2 (see the following structural formulae)
Basic compound: Quencher 1 (see the following structural formula)

PAG 1

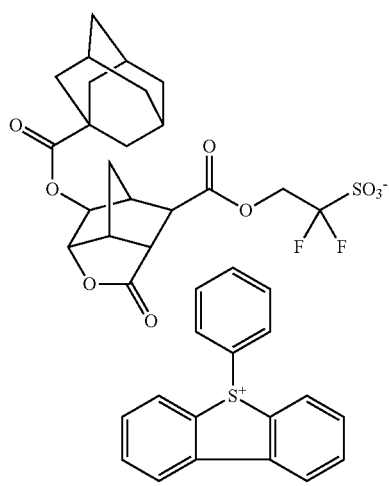

EUV Exposure Evaluation

A silicon-containing spin-on hard mask SHB-A940 (silicon content: 43 mass %) was formed on a Si substrate with a film thickness of 20 nm. On this substrate, each positive resist composition prepared with the composition shown in Table 1 was applied by spin coating and pre-baked with a hot plate at 105° C. for 60 seconds to form a resist film having a thickness of 60 nm. The resist film was exposed to light with an EUV scanner NXE3300, manufactured by ASML Corp., (NA=0.33, σ=0.9/0.6, quadrupole illumination, using a hole pattern mask having an on-wafer size of 46-nm pitch, with a bias of ±20%), and subjected to PEB on a hot plate with a temperature shown in Table 1 for 60 seconds, and developed with a 2.38 mass % tetramethylammonium hydroxide aqueous solution for 30 seconds to obtain a 23-nm hole pattern. Table 1 shows exposure dose and sensitivity that can give a 23-nm hole pattern at this time.

The following evaluation was performed on the obtained resist pattern.

The dimension of 50 holes was measured with a length measuring SEM (CG-5000) manufactured by Hitachi High-Technologies Corp., and dimensional variation 3σ (CDU) was determined. The result is given in Table 1.

TABLE 1

| | Polymer (part by mass) | Acid generator (part by mass) | Base (part by mass) | Organic solvent (part by mass) | PEB temperature (° C.) | Sensitivity (mJ/cm$^2$) | CDU (nm) |
|---|---|---|---|---|---|---|---|
| Example 1 | Polymer 1 (100) | PAG1 (25.0) | Quencher1 (3.00) | PGMEA(400) CyH(2000) PGME(100) | 85 | 23 | 4.0 |
| Example 2 | Polymer 2 (100) | — | Quencher1 (3.00) | PGMEA(400) CyH(2000) PGME(100) | 85 | 22 | 3.7 |
| Example 3 | Polymer 3 (100) | — | Quencher1 (3.00) | PGMEA(2000) DAA(500) | 85 | 21 | 3.1 |
| Example 4 | Polymer 4 (100) | — | Quencher1 (3.00) | PGMEA(2000) DAA(500) | 90 | 18 | 3.3 |
| Example 5 | Polymer 5 (100) | PAG1 (6.0) | Quencher1 (3.00) | PGMEA(2000) DAA(500) | 85 | 20 | 2.7 |
| Example 6 | Polymer 5 (100) | PAG2 (6.0) | Quencher1 (3.00) | PGMEA(2000) DAA(500) | 85 | 18 | 2.4 |
| Example 7 | Polymer 6 (100) | PAG1 (25.0) | Quencher1 (3.00) | PGMEA(400) CyH(2000) PGME(100) | 85 | 25 | 4.2 |
| Example 8 | Polymer 7 (100) | — | Quencher1 (3.00) | PGMEA(400) CyH(2000) PGME(100) | 85 | 26 | 3.9 |
| Example 9 | Polymer 8 (100) | — | Quencher1 (3.00) | PGMEA(2000) DAA(500) | 85 | 24 | 3.3 |
| Example 10 | Polymer 9 (100) | — | Quencher1 (3.00) | PGMEA(2000) DAA(500) | 90 | 20 | 3.1 |
| Example 11 | Polymer 10 (100) | PAG1 (6.0) | Quencher1 (3.00) | PGMEA(2000) DAA(500) | 85 | 22 | 2.9 |
| Example 12 | Polymer 10 (100) | PAG2 (6.0) | Quencher1 (3.00) | PGMEA(2000) DAA(500) | 85 | 19 | 2.6 |
| Comparative example 1 | Comparative polymer 1 (100) | PAG1 (25.0) | Quencher1 (3.00) | PGMEA(400) CyH(2000) PGME(100) | 85 | 30 | 5.6 |
| Comparative example 2 | Comparative polymer 2 (100) | — | Quencher1 (3.00) | PGMEA(2000) DAA(500) | 90 | 23 | 4.7 |
| Comparative example 3 | Comparative polymer 3 (100) | — | Quencher1 (3.00) | PGMEA(2000) DAA(500) | 95 | 25 | 4.9 |

The results of Table 1 show that the positive resist compositions (Examples 1 to 12) according to the present invention using the polymer compound copolymerized with a methacrylate having a hydroxybenzoquinone group or a methacrylate having a hydroxynaphthoquinone group had sufficient resolution, sensitivity, and CDU (i.e. dimensional variation). Moreover, further copolymerization with an acid generator enabled the resolution and CDU to be improved. Moreover, the shape of the obtained pattern was good.

By contrast, the positive resist composition (Comparative example 1) using the polymer compound (Comparative polymer 1) having no hydroxybenzoquinone group and no "d" unit was insufficient in resolution and sensitivity. Moreover, the positive resist composition (Comparative example 2) using the polymer compound (Comparative polymer 2) having no hydroxybenzoquinone group and the positive resist composition (Comparative example 3) using the polymer compound (Comparative polymer 3) having no hydroxynaphthoquinone group had insufficient resolution.

It should be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A resist composition comprising a polymer compound as a base resin, the polymer compound comprising a repeating unit "a" shown by the following general formula (1) and a repeating unit "b" having either or both of a carboxyl group in which a hydrogen atom is substituted with an acid-labile group and a phenolic hydroxyl group in which a hydrogen atom is substituted with an acid-labile group, the polymer compound having a weight average molecular weight of 1,000 to 500,000,

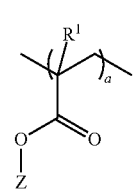

(1)

wherein $R^1$ represents a hydrogen atom or a methyl group; Z represents a hydroxybenzoquinone group, or a hydroxynaphthoquinone group optionally containing a substituent; and a fraction "a" of the repeating unit "a" satisfies 0<a<1.0, and a fraction "b" of the repeating unit "b" satisfies 0<b<1.0.

2. The resist composition according to claim 1, wherein the repeating unit "a" comprises a repeating unit a1 shown by the following general formula (1-1) having a hydroxybenzoquinone group, (1-1)

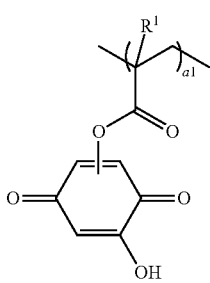

wherein R¹ is as defined above; and a1 represents a number satisfying 0<a1<1.0.

3. The resist composition according to claim 1, wherein the repeating unit "a" comprises a repeating unit a2 shown by the following general formula (1-2) having a hydroxynaphthoquinone group, (1-2)

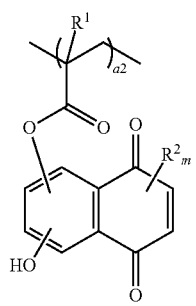

wherein R¹ is as defined above; R² represents a hydrogen atom, a halogen atom, or a linear or branched alkyl group having 1 to 4 carbon atoms; "m" represents 1 or 2; and a2 represents a number satisfying 0<a2<1.0.

4. The resist composition according to claim 1, wherein the repeating unit "b" comprises one or more repeating units selected from a repeating unit b1 shown by the following general formula (2-1) and a repeating unit b2 shown by the following general formula (2-2),

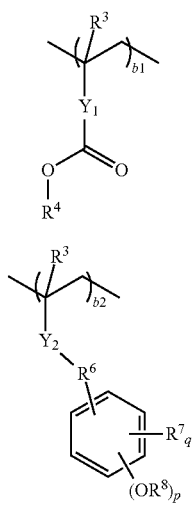

wherein R³ and R⁵ represent a hydrogen atom or a methyl group; R⁴ and R⁵ represent an acid-labile group; R⁶ represents a single bond or a linear or branched alkylene group having 1 to 6 carbon atoms and optionally containing an ether group or an ester group; R⁷ represents a hydrogen atom, a fluorine atom, a trifluoromethyl group, a cyano group, or a linear, branched, or cyclic alkyl group having 1 to 6 carbon atoms; "p" represents 1 or 2; "q" represents an integer of 0 to 4; p+q≤5; Y₁ represents a linking group having 1 to 12 carbon atoms and containing an ester group, an ether group, or a lactone ring, or represents a single bond, a phenylene group, or a naphthylene group; Y₂ represents a single bond, an ester bond, or —C(=O)—NH—; b1 and b2 represent a number satisfying 0≤b1<1.0, 0≤b2<1.0, 0<b1+b2<1.0, and 0.1≤a+b1+b2≤1.0.

5. The resist composition according to claim 2, wherein the repeating unit "b" comprises one or more repeating units selected from a repeating unit b1 shown by the following general formula (2-1) and a repeating unit b2 shown by the following general formula (2-2),

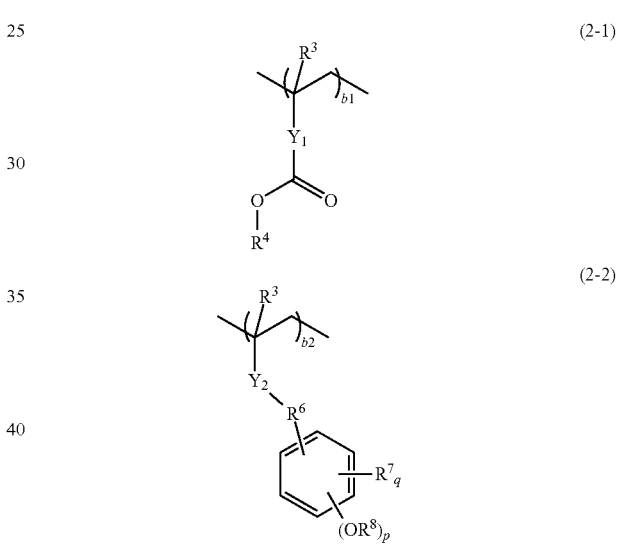

wherein R³ and R⁵ represent a hydrogen atom or a methyl group; R⁴ and R⁸ represent an acid-labile group; R⁶ represents a single bond or a linear or branched alkylene group having 1 to 6 carbon atoms and optionally containing an ether group or an ester group; R⁷ represents a hydrogen atom, a fluorine atom, a trifluoromethyl group, a cyano group, or a linear, branched, or cyclic alkyl group having 1 to 6 carbon atoms; "p" represents 1 or 2; "q" represents an integer of 0 to 4; p+q 5; Y₁ represents a linking group having 1 to 12 carbon atoms and containing an ester group, an ether group, or a lactone ring, or represents a single bond, a phenylene group, or a naphthylene group; Y₂ represents a single bond, an ester bond, or —C(=O)—NH—; b1 and b2 represent a number satisfying 0≤b1<1.0, 0≤b2<1.0, 0<b1+b2<1.0, and 0.1≤a+b1+b2≤1.0.

6. The resist composition according to claim 3, wherein the repeating unit "b" comprises one or more repeating units selected from a repeating unit b1 shown by the following general formula (2-1) and a repeating unit b2 shown by the following general formula (2-2),

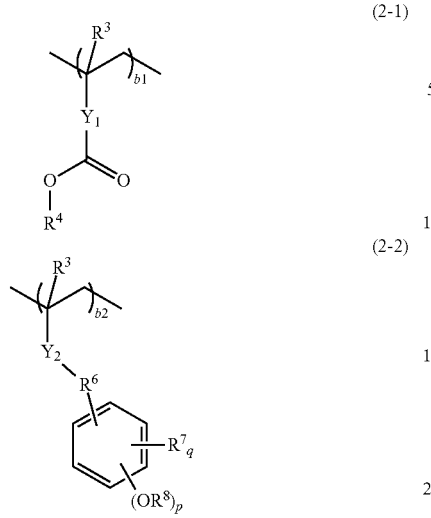

(2-1)

(2-2)

wherein $R^3$ and $R^5$ represent a hydrogen atom or a methyl group; $R^4$ and $R^8$ represent an acid-labile group; $R^6$ represents a single bond or a linear or branched alkylene group having 1 to 6 carbon atoms and optionally containing an ether group or an ester group; $R^7$ represents a hydrogen atom, a fluorine atom, a trifluoromethyl group, a cyano group, or a linear, branched, or cyclic alkyl group having 1 to 6 carbon atoms; "p" represents 1 or 2; "q" represents an integer of 0 to 4; p+q≤5; $Y_1$ represents a linking group having 1 to 12 carbon atoms and containing an ester group, an ether group, or a lactone ring, or represents a single bond, a phenylene group, or a naphthylene group; $Y_2$ represents a single bond, an ester bond, or —C(=O)—NH—; b1 and b2 represent a number satisfying 0≤b1<1.0, 0≤b2<1.0, 0<b1+b2<1.0, and 0.1≤a+b1+b2≤1.0.

7. The resist composition according to claim 1, wherein the polymer compound further comprises a repeating unit "c" having an adhesion group selected from a hydroxyl group, a carboxyl group, a lactone ring, a carbonate group, a thiocarbonate group, a carbonyl group, a cyclic acetal group, an ether group, an ester group, a sulfonate ester group, a cyano group, an amide group, and —O—C(=O)-G-, where G represents a sulfur atom or —NH—, and a intramolecular fraction c1 of the repeating unit "c" satisfies 0<c1≤0.9.

8. The resist composition according to claim 2, wherein the polymer compound further comprises a repeating unit "c" having an adhesion group selected from a hydroxyl group, a carboxyl group, a lactone ring, a carbonate group, a thiocarbonate group, a carbonyl group, a cyclic acetal group, an ether group, an ester group, a sulfonate ester group, a cyano group, an amide group, and —O—C(=O)-G-, where G represents a sulfur atom or —NH—, and a intramolecular fraction c1 of the repeating unit "c" satisfies 0<c1≤0.9.

9. The resist composition according to claim 3, wherein the polymer compound further comprises a repeating unit "c" having an adhesion group selected from a hydroxyl group, a carboxyl group, a lactone ring, a carbonate group, a thiocarbonate group, a carbonyl group, a cyclic acetal group, an ether group, an ester group, a sulfonate ester group, a cyano group, an amide group, and —O—C(=O)-G-, where G represents a sulfur atom or —NH—, and a intramolecular fraction c1 of the repeating unit "c" satisfies 0<c1≤0.9.

10. The resist composition according to claim 4, wherein the polymer compound further comprises a repeating unit "c" having an adhesion group selected from a hydroxyl group, a carboxyl group, a lactone ring, a carbonate group, a thiocarbonate group, a carbonyl group, a cyclic acetal group, an ether group, an ester group, a sulfonate ester group, a cyano group, an amide group, and —O—C(=O)-G-, where G represents a sulfur atom or —NH—, and a intramolecular fraction c1 of the repeating unit "c" satisfies 0<c1≤0.9.

11. The resist composition according to claim 1, wherein the polymer compound further comprises one or more repeating units "d" selected from repeating units d1 to d3 shown by the following general formulae (3-1) to (3-3) having a sulfonium salt,

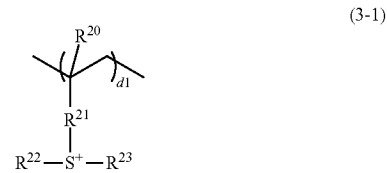

(3-1)

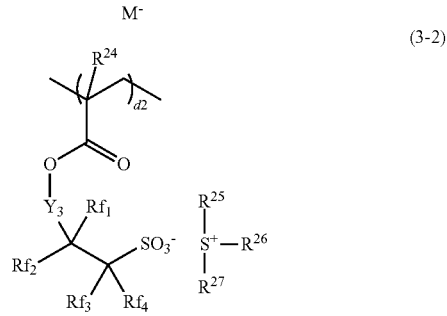

(3-2)

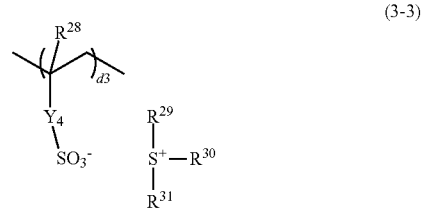

(3-3)

wherein $R^{20}$, $R^{24}$, and $R^{28}$ represent a hydrogen atom or a methyl group; $R^{21}$ represents a single bond, a phenylene group, —O—R—, or —C(=O)—V—R—, where V represents an oxygen atom or —NH—, and R represents a phenylene group or a linear, branched, or cyclic alkylene group or alkenylene group having 1 to 6 carbon atoms and optionally containing a carbonyl group, an ester group, an ether group, or a hydroxyl group; $Rf_1$ to $Rf_4$ represent a fluorine atom, a hydrogen atom, or a trifluoromethyl group, provided that one or more of $Rf_1$ to $Rf_4$ are a fluorine atom or a trifluoromethyl group; $R^{22}$, $R^{23}$, $R^{25}$, $R^{26}$, $R^{27}$, $R^{29}$, $R^{30}$, and $R^{31}$ are the same or different and represent a linear, branched, or cyclic alkyl group having 1 to 12 carbon atoms, an aryl group having 6 to 12 carbon atoms, an aralkyl group having 7 to 20 carbon atoms, or a thiophenyl group optionally containing a carbonyl group, an ester group, or an ether group, in which two or more of $R^{25}$, $R^{26}$, and $R^{27}$ may be bonded to each other to form a ring together with the sulfur atom in the formula, and when the ring is formed, an oxygen atom may be contained therein; $Y_3$ represents a single bond or a linking group having 1 to 12 carbon atoms and optionally containing an ester group, an ether group, or a lactone ring; $Y_4$ represents a single bond, a methylene group, an ethylene group, a phenylene group, a fluorinated phenylene group, —O—$R^{32}$—, or —C(=O)—W—$R^{32}$—, where W represents an oxygen atom or —NH—, and $R^{32}$ represents a phenylene group or a linear, branched, or cyclic alkylene group or alkenylene group having 1 to 6 carbon atoms and optionally containing a carbonyl group, an ester group, an ether group, or a hydroxyl group; $M^-$ represents a non-nucleophilic counter ion; and d1, d2, and d3 represent a number satisfying 0≤d1≤0.5, 0≤d2≤0.5, 0≤d3≤0.5, and 0<d1+d2+d3≤0.5.

12. The resist composition according to claim 2, wherein the polymer compound further comprises one or more repeating units "d" selected from repeating units d1 to d3 shown by the following general formulae (3-1) to (3-3) having a sulfonium salt,

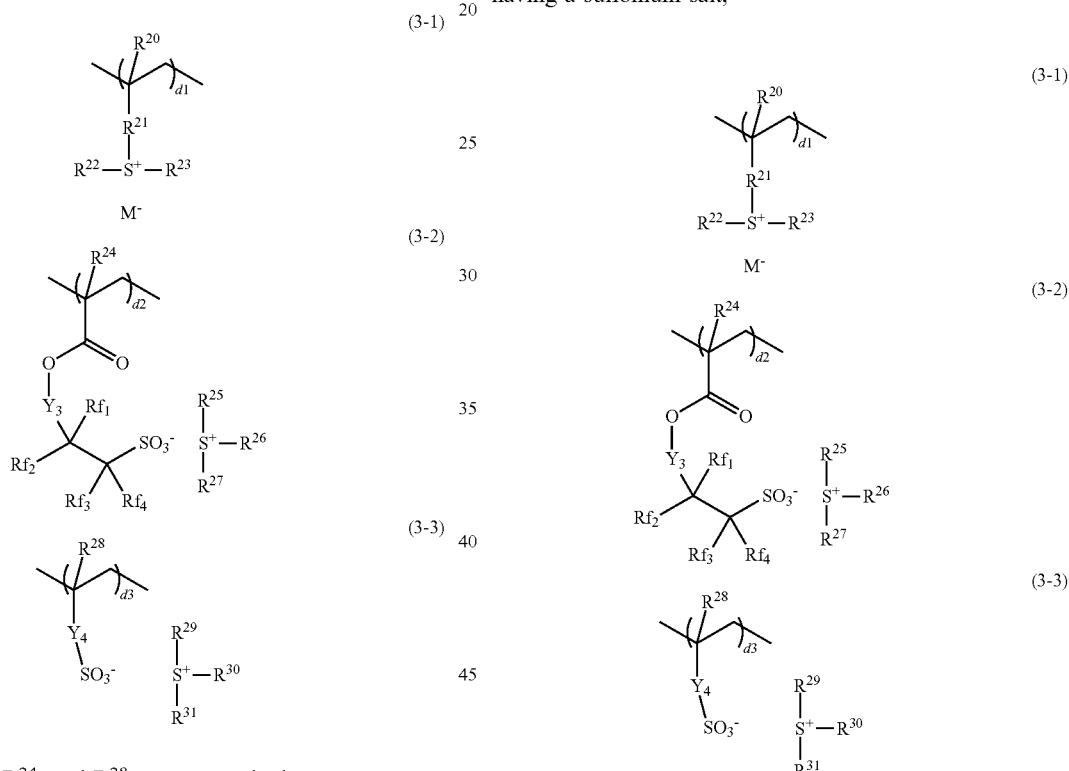

wherein $R^{20}$, $R^{24}$, and $R^{28}$ represent a hydrogen atom or a methyl group; $R^{21}$ represents a single bond, a phenylene group, —O—R—, or —C(=O)—V—R—, where V represents an oxygen atom or —NH—, and R represents a phenylene group or a linear, branched, or cyclic alkylene group or alkenylene group having 1 to 6 carbon atoms and optionally containing a carbonyl group, an ester group, an ether group, or a hydroxyl group; $Rf_1$ to $Rf_4$ represent a fluorine atom, a hydrogen atom, or a trifluoromethyl group, provided that one or more of $Rf_1$ to $Rf_4$ are a fluorine atom or a trifluoromethyl group; $R^{22}$, $R^{23}$, $R^{25}$, $R^{26}$, $R^{27}$, $R^{29}$, $R^{30}$, and $R^{31}$ are the same or different and represent a linear, branched, or cyclic alkyl group having 1 to 12 carbon atoms, an aryl group having 6 to 12 carbon atoms, an aralkyl group having 7 to 20 carbon atoms, or a thiophenyl group optionally containing a carbonyl group, an ester group, or an ether group, in which two or more of $R^{25}$, $R^{26}$, and $R^{27}$ may be bonded to each other to form a ring together with the sulfur atom in the formula, and when the ring is formed, an oxygen atom may be contained therein; $Y_3$ represents a single bond or a linking group having 1 to 12 carbon atoms and optionally containing an ester group, an ether group, or a lactone ring; $Y_4$ represents a single bond, a methylene group, an ethylene group, a phenylene group, a fluorinated phenylene group, —O—$R^{32}$—, or —C(=O)—W—$R^{32}$—, where W represents an oxygen atom or —NH—, and $R^{32}$ represents a phenylene group or a linear, branched, or cyclic alkylene group or alkenylene group having 1 to 6 carbon atoms and optionally containing a carbonyl group, an ester group, an ether group, or a hydroxyl group; $M^-$ represents a non-nucleophilic counter ion; and d1, d2, and d3 represent a number satisfying 0≤d1≤0.5, 0≤d2≤0.5, 0≤d3≤0.5, and 0<d1+d2+d3≤0.5.

13. The resist composition according to claim 3, wherein the polymer compound further comprises one or more repeating units "d" selected from repeating units d1 to d3 shown by the following general formulae (3-1) to (3-3) having a sulfonium salt,

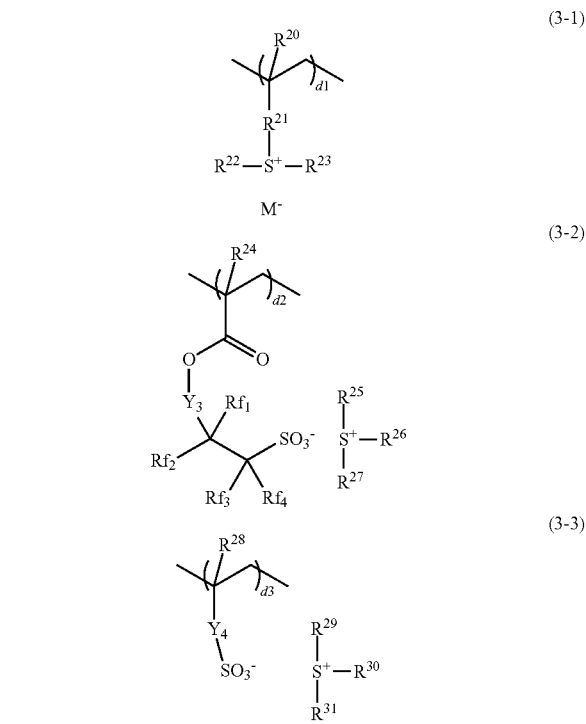

wherein $R^{20}$, $R^{24}$, and $R^{25}$ represent a hydrogen atom or a methyl group; $R^{21}$ represents a single bond, a phenylene group, —O—R—, or —C(=O)—V—R—, where V represents an oxygen atom or —NH—, and R represents a phenylene group or a linear, branched, or cyclic alkylene group or alkenylene group having 1 to 6 carbon atoms and optionally containing a carbonyl group, an ester group, an ether group, or a hydroxyl group; $Rf_1$ to $Rf_4$ represent a fluorine atom, a hydrogen atom, or a trifluoromethyl group, provided that one or more of $Rf_1$ to $Rf_4$ are a fluorine atom or a trifluoromethyl group; $R^{22}$, $R^{23}$, $R^{25}$, $R^{26}$, $R^{27}$, $R^{29}$, $R^{30}$, and $R^{31}$ are the same or different and represent a linear, branched, or cyclic alkyl group having 1 to 12 carbon atoms, an aryl group having 6 to 12 carbon atoms, an aralkyl group having 7 to 20 carbon atoms, or a thiophenyl group optionally containing a carbonyl group, an ester group, or an ether group, in which two or more of $R^{25}$, $R^{26}$, and $R^{27}$ may be bonded to each other to form a ring together with the sulfur atom in the formula, and when the ring is formed, an oxygen atom may be contained therein; $Y_3$ represents a single bond or a linking group having 1 to 12 carbon atoms and optionally containing an ester group, an ether group, or a lactone ring; $Y_4$ represents a single bond, a methylene group, an ethylene group, a phenylene group, a fluorinated phenylene group, —O—$R^{32}$—, or —C(=O)—W—$R^{32}$—, where W represents an oxygen atom or —NH—, and $R^{32}$ represents a phenylene group or a linear, branched, or cyclic alkylene group or alkenylene group having 1 to 6 carbon atoms and optionally containing a carbonyl group, an ester group, an ether group, or a hydroxyl group; $M^-$ represents a non-nucleophilic counter ion; and d1, d2, and d3 represent a number satisfying $0 \le d1 \le 0.5$, $0 \le d2 \le 0.5$, $0 \le d3 \le 0.5$, and $0 < d1+d2+d3 \le 0.5$.

14. The resist composition according to claim 4, wherein the polymer compound further comprises one or more repeating units "d" selected from repeating units d1 to d3 shown by the following general formulae (3-1) to (3-3) having a sulfonium salt,

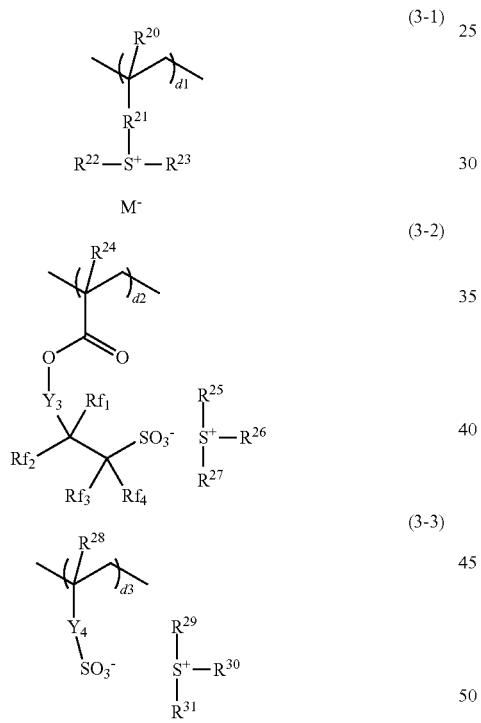

wherein $R^{20}$, $R^{24}$, and $R^{28}$ represent a hydrogen atom or a methyl group; $R^{21}$ represents a single bond, a phenylene group, —O—R—, or —C(=O)—V—R—, where V represents an oxygen atom or —NH—, and R represents a phenylene group or a linear, branched, or cyclic alkylene group or alkenylene group having 1 to 6 carbon atoms and optionally containing a carbonyl group, an ester group, an ether group, or a hydroxyl group; $Rf_1$ to $Rf_4$ represent a fluorine atom, a hydrogen atom, or a trifluoromethyl group, provided that one or more of $Rf_1$ to $Rf_4$ are a fluorine atom or a trifluoromethyl group; $R^{22}$, $R^{23}$, $R^{25}$, $R^{26}$, $R^{27}$, $R^{29}$, $R^{30}$, and $R^{31}$ are the same or different and represent a linear, branched, or cyclic alkyl group having 1 to 12 carbon atoms, an aryl group having 6 to 12 carbon atoms, an aralkyl group having 7 to 20 carbon atoms, or a thiophenyl group optionally containing a carbonyl group, an ester group, or an ether group, in which two or more of $R^{25}$, $R^{26}$, and $R^{27}$ may be bonded to each other to form a ring together with the sulfur atom in the formula, and when the ring is formed, an oxygen atom may be contained therein; $Y_3$ represents a single bond or a linking group having 1 to 12 carbon atoms and optionally containing an ester group, an ether group, or a lactone ring; $Y_4$ represents a single bond, a methylene group, an ethylene group, a phenylene group, a fluorinated phenylene group, —O—$R^{32}$—, or —C(=O)—W—$R^{32}$—, where W represents an oxygen atom or —NH—, and $R^{32}$ represents a phenylene group or a linear, branched, or cyclic alkylene group or alkenylene group having 1 to 6 carbon atoms and optionally containing a carbonyl group, an ester group, an ether group, or a hydroxyl group; $M^-$ represents a non-nucleophilic counter ion; and d1, d2, and d3 represent a number satisfying $0 \le d1 \le 0.5$, $0 \le d2 \le 0.5$, $0 \le d3 \le 0.5$, and $0 < d1+d2+d3 \le 0.5$.

15. The resist composition according to claim 7, wherein the polymer compound further comprises one or more repeating units "d" selected from repeating units d1 to d3 shown by the following general formulae (3-1) to (3-3) having a sulfonium salt,

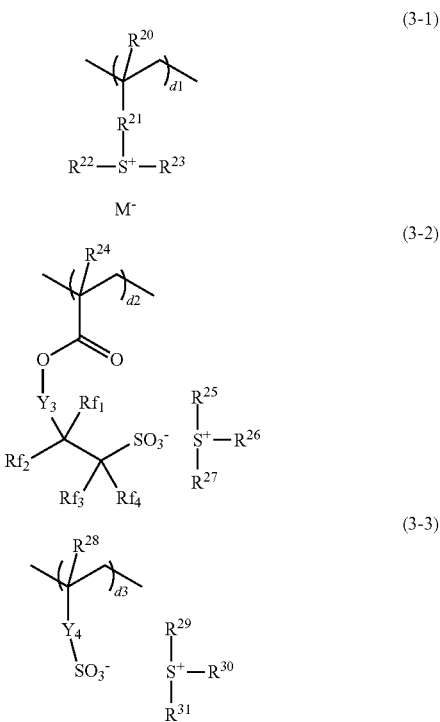

wherein $R^{20}$, $R^{24}$, and $R^{28}$ represent a hydrogen atom or a methyl group; $R^{21}$ represents a single bond, a phenylene group, —O—R—, or —C(=O)—V—R—, where V represents an oxygen atom or —NH—, and R represents a phenylene group or a linear, branched, or cyclic alkylene group or alkenylene group having 1 to 6 carbon atoms and optionally containing a carbonyl group, an ester group, an ether group, or a hydroxyl group; $Rf_1$ to $Rf_4$ represent a fluorine atom, a hydrogen atom, or a trifluoromethyl group, provided that one or more of $Rf_1$ to $Rf_4$ are a fluorine atom or a trifluoromethyl group; $R^{22}$, $R^{23}$, $R^{25}$, $R^{26}$, $R^{27}$, $R^{29}$, $R^{30}$, and $R^{31}$ are the same or different and represent a linear, branched, or cyclic alkyl group having 1 to 12 carbon atoms, an aryl group having 6 to 12 carbon atoms, an aralkyl group having 7 to 20 carbon atoms, or a thiophenyl group optionally containing a carbonyl group, an ester group, or an ether group, in which two or more of $R^{25}$, $R^{26}$, and $R^{27}$ may be bonded to each other to form a ring together with the sulfur atom in the formula, and when the ring is formed, an oxygen atom may be contained therein; $Y_3$ represents a single bond or a linking group having 1 to 12 carbon atoms and optionally containing an ester group, an ether group, or a lactone ring; $Y_4$ represents a single bond, a methylene group, an ethylene group, a phenylene group, a fluorinated phenylene group, —O—$R^{32}$—, or —C(=O)—W—$R^{32}$—, where W represents an oxygen atom or —NH—, and $R^{32}$ represents a phenylene group or a linear, branched, or cyclic alkylene group or alkenylene group having 1 to 6 carbon atoms and optionally containing a carbonyl group, an ester group, an ether group, or a hydroxyl group; $M^-$ represents a non-nucleophilic counter ion; and d1, d2, and d3 represent a number satisfying $0 \leq d1 \leq 0.5$, $0 \leq d2 \leq 0.5$, $0 \leq d3 \leq 0.5$, and $0 < d1+d2+d3 \leq 0.5$.

16. The resist composition according to claim 1, wherein the resist composition is a chemically amplified resist composition further containing one or more materials selected from an organic solvent, an acid generator, a basic compound, and a surfactant.

17. The resist composition according to claim 2, wherein the resist composition is a chemically amplified resist composition further containing one or more materials selected from an organic solvent, an acid generator, a basic compound, and a surfactant.

18. The resist composition according to claim 3, wherein the resist composition is a chemically amplified resist composition further containing one or more materials selected from an organic solvent, an acid generator, a basic compound, and a surfactant.

19. A patterning process comprising:
applying the resist composition according to claim 1 on a substrate; performing exposure with a high energy beam after a heat treatment; and performing development with a developer.

20. The patterning process according to claim 19, wherein the high energy beam is an i-line beam, a KrF excimer laser beam, an ArF excimer laser beam, an electron beam, or a soft X-ray having a wavelength of 3 to 15 nm.

* * * * *